(12) United States Patent
Kobayashi et al.

(10) Patent No.: US 8,691,494 B2
(45) Date of Patent: Apr. 8, 2014

(54) PATTERNING PROCESS

(75) Inventors: Tomohiro Kobayashi, Joetsu (JP); Jun Hatakeyama, Joetsu (JP); Takeshi Nagata, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 23 days.

(21) Appl. No.: 13/456,705

(22) Filed: Apr. 26, 2012

(65) Prior Publication Data
US 2012/0276485 A1 Nov. 1, 2012

(30) Foreign Application Priority Data
Apr. 28, 2011 (JP) ............................. 2011-101101

(51) Int. Cl.
*G03F 7/26* (2006.01)

(52) U.S. Cl.
USPC ........................................ 430/322; 430/270.1

(58) Field of Classification Search
USPC ..................... 430/270.1, 311, 394, 322, 312
See application file for complete search history.

(56) References Cited

U.S. PATENT DOCUMENTS

| | | | |
|---|---|---|---|
| 5,738,975 A | 4/1998 | Nakano et al. | |
| 6,605,408 B2 | 8/2003 | Nishi et al. | |
| 6,830,866 B2 | 12/2004 | Kobayashi et al. | |
| 7,537,880 B2 | 5/2009 | Harada et al. | |
| 7,759,047 B2 | 7/2010 | Hatakeyama et al. | |
| 7,771,913 B2 | 8/2010 | Kaneko et al. | |
| 7,771,914 B2 | 8/2010 | Hatakeyama et al. | |
| 2001/0053500 A1 | 12/2001 | Jeoung et al. | |
| 2007/0003867 A1 | 1/2007 | Hatakeyama et al. | |
| 2008/0085470 A1 | 4/2008 | Sunaga et al. | |
| 2008/0153030 A1 | 6/2008 | Kobayashi et al. | |
| 2009/0042147 A1 | 2/2009 | Tsubaki | |
| 2009/0280434 A1* | 11/2009 | Harada et al. ............... | 430/270.1 |
| 2010/0203457 A1 | 8/2010 | Hatakeyama | |
| 2010/0330507 A1 | 12/2010 | Tsubaki et al. | |
| 2011/0305992 A1 | 12/2011 | Tarutani et al. | |
| 2012/0122031 A1 | 5/2012 | Chen et al. | |
| 2012/0270159 A1* | 10/2012 | Kobayashi et al. ........... | 430/325 |

FOREIGN PATENT DOCUMENTS

| | | |
|---|---|---|
| JP | 07-199467 A | 8/1995 |
| JP | 3790649 B2 | 6/2006 |
| JP | 2007-025634 A | 2/2007 |
| JP | 2007-297590 A | 11/2007 |

(Continued)

OTHER PUBLICATIONS

Nakamura, Hiroko, et al., "Contact Hole Formation by Multiple Exposure TEchnique in Ultra-low k1 Lithography", Proceedings of SPIE, vol. 5377, p. 255-263.

(Continued)

*Primary Examiner* — Cynthia Kelly
*Assistant Examiner* — Caleen Sullivan
(74) *Attorney, Agent, or Firm* — Westerman, Hattori, Daniels & Adrian, LLP

(57) ABSTRACT

A negative pattern is formed by applying a resist composition onto a substrate, baking, exposing to high-energy radiation, baking (PEB), and developing the exposed resist film in an organic solvent developer to selectively dissolve the unexposed region of resist film. The resist composition comprising a hydrogenated ROMP polymer and a (meth)acrylate resin displays a high dissolution contrast in organic solvent development, and exhibits high dry etch resistance even when the acid labile group is deprotected through exposure and PEB.

13 Claims, 10 Drawing Sheets

(56) References Cited

FOREIGN PATENT DOCUMENTS

| | | |
|---|---|---|
| JP | 4013044 B2 | 11/2007 |
| JP | 2007-316448 A | 12/2007 |
| JP | 2008-003569 A | 1/2008 |
| JP | 2008-111103 A | 5/2008 |
| JP | 2008-122932 A | 5/2008 |
| JP | 2008-158339 A | 7/2008 |
| JP | 2008-281974 A | 11/2008 |
| JP | 2008-281975 A | 11/2008 |
| JP | 2008-281980 A | 11/2008 |
| JP | 2009-025707 A | 2/2009 |
| JP | 2009-025723 A | 2/2009 |
| JP | 2009-053657 A | 3/2009 |
| JP | 2009-258586 A | 11/2009 |
| JP | 4497266 B2 | 7/2010 |

OTHER PUBLICATIONS

Nakao, Shuji, et al., "0.12μm Hole Pattern Formation by KrF Lithography for Giga Bit DRAM", IEEE, vol. 96, p. 61-64.

Truffert, V., et al., "Ultimate contact hole resolution using immersion lithography with line/space imaging", Proc. of SPIE, vol. 7274, p. N-1~N-12.

Abe, Naomichi, et al., "Study of ArF Resist Material in Terms of Transparency and Dry Etch Resistance", Journal of Photopolymer Science and Technology, vol. 8, No. 4, p. 637-642.

Owe-Yang, D.C., et al., "Double exposure for the contact layer of the 65-nm node", Proceedings of SPIE, vol. 5753, p. 171-180.

US Office action dated Jul. 25, 2013, issued in corresponding U.S. Appl. No. 13/450,867.

* cited by examiner

PATTERNING PROCESS

CROSS-REFERENCE TO RELATED APPLICATION

This non-provisional application claims priority under 35 U.S.C. §119(a) on Patent Application No. 2011-101101 filed in Japan on Apr. 28, 2011, the entire contents of which are hereby incorporated by reference.

TECHNICAL FIELD

This invention relates to a pattern forming process and more particularly, to a negative pattern forming process including forming a resist film from a specific resist composition, exposure, post-exposure baking to effect deprotection reaction under the catalysis of an acid generated by a photoacid generator, and developing with an organic solvent to dissolve the unexposed region, but not the exposed region of the resist film.

BACKGROUND ART

In the recent drive for higher integration densities and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with the mass-scale fabrication of 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was abandoned and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER, LWR) of resist film, defect-free MoSi laminate mask, reduced aberration of reflection mirror, and the like.

Another candidate for the 32-nm node lithography is high refractive index liquid immersion lithography. The development of this technology was abandoned because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a resist pattern having lines and spaces at intervals of 1:3, processing the underlying layer of hard mask by dry etching, applying another layer of hard mask thereon, a second set of exposure and development of a resist film to form a line pattern in the spaces of the first exposure, and processing the hard mask by dry etching, thereby forming a line-and-space pattern at a half pitch of the first pattern. An alternative process involves a first set of exposure and development to form a resist pattern having spaces and lines at intervals of 1:3, processing the underlying layer of hard mask by dry etching, applying a resist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. With the hole shrinking method, the hole size can be shrunk, but the pitch cannot be narrowed.

It is then proposed in Non-Patent Document 1 that a pattern of X-direction lines is formed in a positive resist film using dipole illumination, the resist pattern is cured, another resist material is coated thereon, and a pattern of Y-direction lines is formed in the other resist film using dipole illumination, leaving a lattice-like line pattern, interstices of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in Non-Patent Document 2 to form a hole pattern by exposure of a negative resist film through a Levenson phase shift mask of X-direction lines combined with a Levenson phase shift mask of Y-direction lines. Undesirably, the resolving power of the crosslinking negative resist film is low as compared with the positive resist film because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art.

Non-Patent Document 3 reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The organic solvent development to form a negative pattern is a traditional technique. A resist composition comprising cyclized rubber is developed using an alkene such as xylene as the developer. An early chemically amplified resist composition comprising poly(tert-butoxycarbonyloxy-styrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 7.

These Patent Documents disclose resist compositions for organic solvent development comprising polymers having copolymerized therein hydroxyadamantane methacrylate, norbornane lactone methacrylate, or methacrylates having an acidic group such as carboxyl, sulfo, phenol or thiol substituted with an acid labile group as the base resin, and pattern forming processes using the compositions.

The methacrylate resins, however, have the drawback that the resin backbone is short of dry etch resistance. When the substrate is etched using the resist film as a mask, there is a likelihood of pattern transfer failure. It is known from Non-Patent Document 4 that dry etch resistance can be effectively improved by introducing an alicyclic structure. Then many attempts were made to introduce an alicyclic structure into a pendant chain of methacrylate resins. In the positive pattern forming process involving alkaline development, some fruitful results are obtained by introducing an alicyclic structure, typically alkyladamantyl group into an acid labile group.

In the negative pattern forming process involving organic solvent development, on the other hand, dry etch resistance becomes a consideration again because the portion to turn insoluble during development corresponds to the portion where the acid labile group of alicyclic structure is deprotected.

Besides the methacrylate resins, Patent Document 8 proposes a pattern forming process in which a resist composition comprising a polymer having an alicyclic structure in its backbone as a base resin is combined with organic solvent development. It is expected that this polymer is somewhat improved in dry etch resistance over the methacrylate resin, although the patent document refers nowhere to dry etch resistance. However, the polymer is not regarded sufficient with respect to the resolution and roughness of a fine pattern necessary for the fabrication of advanced microelectronic devices.

In general, the negative development with organic solvent is low in dissolution contrast, as compared with the positive development with alkaline developer. Specifically, in the case of alkaline developer, the alkali dissolution rate differs more than 1,000 times between unexposed and exposed regions, whereas the difference is only about 10 times in the case of organic solvent development. Increasing the proportion of acid labile group introduced is effective for enhancing the dissolution contrast and improving the resolution, but in the case of negative development, may worsen dry etch resistance for the above-described reason.

CITATION LIST

Patent Document 1: JP-A H07-199467
Patent Document 2: JP-A 2008-281974
Patent Document 3: JP-A 2008-281975
Patent Document 4: JP-A 2008-281980
Patent Document 5: JP-A 2009-053657
Patent Document 6: JP-A 2009-025707
Patent Document 7: JP-A 2009-025723
Patent Document 8: JP-A 2009-258586
Patent Document 9: JP 4497266 (U.S. Pat. No. 6,605,408)
Patent Document 10: JP 4013044 (U.S. Pat. No. 6,830,866)
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)
Non-Patent Document 4: J. Photopolym. Sci. Technol., 8[4], 637 (1995)

DISCLOSURE OF INVENTION

An object of the invention is to provide a pattern forming process in which a resist composition featuring a high dissolution contrast and dry etch resistance is combined with organic solvent development, for thereby improving the resolution of a fine trench or hole pattern and acquiring dry etch resistance sufficient to transfer a satisfactory pattern after substrate processing.

The inventors have found that a resist composition comprising a hydrogenated ring-opening metathesis polymerization (ROMP) polymer of specific structure having an acid labile group and a (meth)acrylate resin as base resin displays a high dissolution contrast in organic solvent development, and exhibits high dry etch resistance even when the acid labile group has been deprotected through exposure and PEB. As a consequence, when a negative pattern is formed by using the relevant resist composition and performing organic solvent development, the resulting fine trench or hole pattern is improved in mask size fidelity and CD uniformity within an exposure shot, and dry etch resistance is maintained high enough.

The invention provides a pattern forming process as defined below.

[1] A pattern forming process comprising the steps of applying a resist composition onto a substrate, post-applied baking the composition to form a resist film, exposing the resist film to high-energy radiation, post-exposure baking the resist film, and developing the exposed resist film in an organic solvent-based developer to selectively dissolve the unexposed region of the resist film to form a negative pattern, the resist composition comprising a base resin, an acid generator, and an organic solvent, the base resin comprising (A) a hydrogenated product of a ring-opening metathesis polymerization polymer having the general formula (1) and (B) a (meth)acrylate resin having the general formula (3),

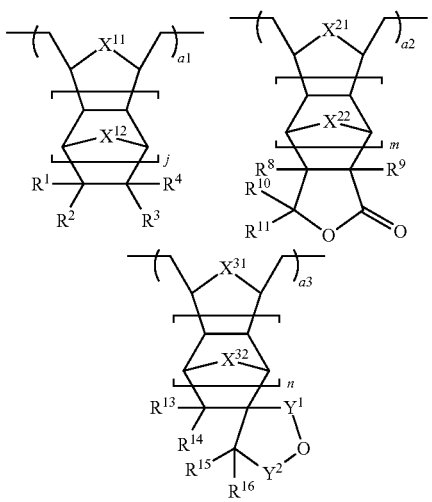

wherein at least one of $R^1$ to $R^4$ is a functional group having the general formula (2):

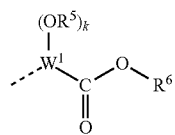

wherein the broken line denotes a valence bond, $R^5$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $R^6$ is an acid labile group, $W^1$ is a single bond or a (k+2)-valent $C_1$-$C_{10}$ hydrocarbon group, and k is 0 or 1, the remains of $R^1$ to $R^4$ are each independently hydrogen, $C_1$-$C_{20}$ straight, branched or cyclic alkyl, halogen, $C_2$-$C_{20}$ straight, branched or cyclic haloalkyl, $C_2$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_2$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl, $X^{11}$ and $X^{12}$ are each independently —O— or —$CR^7{}_2$—, $R^7$ is hydrogen or $C_1$-$C_{10}$ straight or branched alkyl, and j is 0 or an integer of 1 to 3, $R^8$ to $R^{11}$ are each independently hydrogen or $C_1$-$C_{10}$ straight, branched or cyclic alkyl, $X^{21}$ and $X^{22}$ are each independently —O— or —$CR^{12}{}_2$—, $R^{12}$ is hydrogen or $C_1$-$C_{10}$ straight or branched alkyl, m is 0 or an integer of 1 to 3, $R^{13}$ to $R^{16}$ are each independently hydrogen or $C_1$-$C_{10}$ straight, branched or cyclic alkyl, $X^{31}$ and $X^{32}$ are each independently —O— or —$CR^{17}{}_2$—, $R^{17}$ is hydrogen or $C_1$-$C_{10}$ straight or branched alkyl, one of $Y^1$ and $Y^2$ is —(C=O)— and the other is —$CR^{18}{}_2$—, $R^{18}$ is hydrogen or $C_1$-$C_{10}$ straight or branched alkyl, and n is 0 or an integer of 1 to 3, each of the recurring units in formula (1) may be of one or more types, a1, a2, and a3 indicative of a constitutional molar ratio of the respective recurring units to the total are in the range: 0<a1<1, 0≤a2≤0.8, 0≤a3≤0.8, 0<(a2+a3)≤0.8, and 0.5<(a1+a2+a3)≤1, provided that the sum of constitutional molar ratios of recurring units in the hydrogenated ROMP polymer (A) is unity, in case of a3=0, at least one of $X^{11}$, $X^{12}$, $X^{21}$, and $X^{22}$ is —O—, in case of a2=0, at least one of $X^{11}$, $X^{12}$, $X^{31}$, and $X^{32}$ is —O—, and in case of a2>0 and a3>0, at least one of $X^{11}$, $X^{12}$, $X^{21}$, $X^{22}$, $X^{31}$, and $X^{32}$ is —O—,

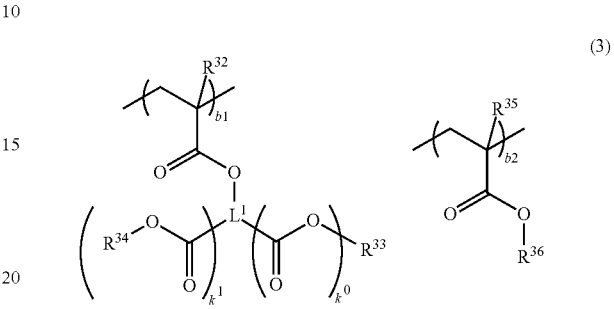

wherein $R^{32}$ and $R^{35}$ are each independently hydrogen or methyl, $R^{33}$ and $R^{34}$ each are an acid labile group, $k^0$ is 0 or 1, in case of $k^0$=0, $k^1$ is 0 and $L^1$ is a single bond, and in case of $k^0$=1, $k^1$ is 0 or 1, wherein in case of $k^1$=0, $L^1$ is a divalent $C_1$-$C_{12}$ straight, branched or cyclic hydrocarbon group which may contain a heteroatom, and in case of $k^1$=1, $L^1$ is a trivalent $C_1$-$C_{12}$ straight, branched or cyclic hydrocarbon group which may contain a heteroatom, $R^{36}$ is a monovalent $C_4$-$C_{15}$ cyclic hydrocarbon group having at least one partial structure selected from the group consisting of ether, ketone, ester, carbonate, and sulfonic acid ester, each of the recurring units in formula (3) may be of one or more types, b1 and b2 indicative of a constitutional molar ratio of the respective recurring units to the total are in the range: 0<b1<1, 0<b2<1, and 0.5<(b1+b2)≤1, provided that the sum of constitutional molar ratios of recurring units in the (meth)acrylate resin (B) is unity.

[2] The pattern forming process of [1] wherein the acid labile group $R^6$ in formula (2) and the acid labile groups $R^{33}$ and $R^{34}$ in formula (3) are each independently at least one group selected from groups having the general formulae (5) to (7):

wherein the broken line denotes a valence bond, $R^{L01}$ to $R^{L03}$ are each independently $C_1$-$C_{12}$ straight, branched or cyclic alkyl, $R^{L04}$ is $C_1$-$C_{10}$ straight, branched or cyclic alkyl, Z is a divalent $C_2$-$C_{15}$ hydrocarbon group to form a monocyclic or bridged ring with the carbon atom to which it is attached, and $R^{L05}$ is $C_1$-$C_{20}$ straight, branched or cyclic alkyl.

[3] The pattern forming process of [1] wherein the acid labile group $R^6$ in formula (2) and the acid labile groups $R^{33}$ and $R^{34}$ in formula (3) are each independently at least one group selected from the group consisting of tert-butyl, tert-amyl, 2-ethyl-2-butyl, 1-methylcyclopentyl, 1-ethylcyclopentyl, 1-n-propylcyclopentyl, 1-isopropylcyclopentyl, 1-tert-butylcyclopentyl, 1-cyclopentylcyclopentyl, 1-cyclohexylcyclopentyl, 1-norbornylcyclopentyl, 2-methyl-2-norbornyl, 2-ethyl-2-norbornyl, 2-methyl-2-adamantyl, 2-ethyl-2-adamantyl, 2-n-propyl-2-adamantyl, 2-isopropyl-2-adamantyl, methoxymethyl, and 2-adamantyloxymethyl.

[4] The pattern forming process of any one of [1] to [3] wherein the hydrogenated ROMP polymer (A) comprises, in addition to the recurring units having formula (1), recurring units of at least one type selected from units having the general formulae (8), (10), (12) and (13):

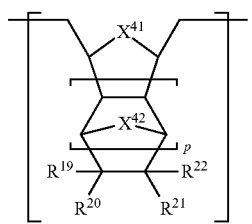

(8)

wherein at least one of $R^{19}$ to $R^{22}$ is a carboxyl-containing functional group having the general formula (9):

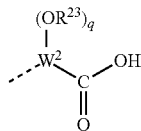

(9)

wherein the broken line denotes a valence bond, $R^{23}$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $W^2$ is a single bond or a (q+2)-valent $C_1$-$C_{10}$ hydrocarbon group, and q is 0 or 1, the remains of $R^{19}$ to $R^{22}$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl, $X^{41}$ and $X^{42}$ are each independently —O— or —$CR^{24}_2$—, $R^{24}$ is hydrogen or $C_1$-$C_{10}$ straight or branched alkyl, and p is 0 or an integer of 1 to 3,

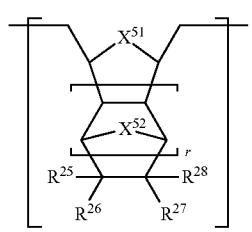

(10)

wherein at least one of $R^{25}$ to $R^{28}$ is a carboxylate-containing functional group having the general formula (11):

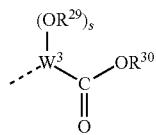

(11)

wherein the broken line denotes a valence bond, $R^{29}$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $R^{30}$ is $C_1$-$C_{10}$ straight or branched alkyl, $C_2$-$C_{10}$ straight, branched or cyclic alkoxyalkyl, or $C_1$-$C_{20}$ straight, branched or cyclic haloalkyl, $W^3$ is a single bond or a (s+2)-valent $C_1$-$C_{10}$ hydrocarbon group, and s is 0 or 1, the remains of $R^{25}$ to $R^{28}$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl, $X^{51}$ and $X^{52}$ are each independently —O— or —$CR^{31}_2$—, $R^{31}$ is hydrogen or $C_1$-$C_{10}$ straight or branched alkyl, and r is 0 or an integer of 1 to 3,

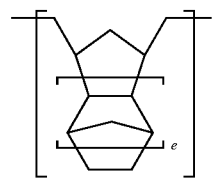

(12)

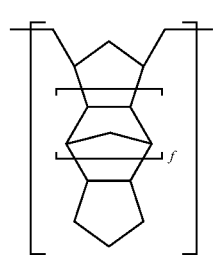

(13)

wherein e is 0 or an integer of 1 to 3, and f is 0 or an integer of 1 to 3.

[5] The pattern forming process of any one of [1] to [4] wherein the (meth)acrylate resin (B) comprises, in addition to the recurring units having formula (3), recurring units of at least one type having the general formula (14):

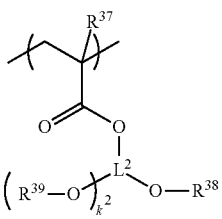

(14)

wherein $R^{37}$ is hydrogen or methyl, $k^2$ is 0 or 1, in case of $k^2=0$, $L^2$ is a divalent $C_2$-$C_{15}$ straight, branched or cyclic hydrocarbon group which may contain a heteroatom or fluorine, and in case of $k^2=1$, $L^2$ is a trivalent $C_3$-$C_{16}$ straight, branched or cyclic hydrocarbon group which may contain a heteroatom or fluorine, $R^{38}$ and $R^{39}$ are each independently hydrogen, or $C_1$-$C_{12}$ straight, branched or cyclic alkyl, alkoxyalkyl or acyl.

[6]. The pattern forming process of any one of [1] to [5] wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, in an amount of at least 60% by weight based on the total weight of the developer.

[7] The pattern forming process of any one of [1] to [6] wherein the step of exposing the resist film to high-energy radiation includes ArF excimer laser immersion lithography of 193 nm wavelength or EUV lithography of 13.5 nm wavelength.

[8] The pattern forming process of any one of [1] to [7] wherein the pattern formed by development is a trench pattern.

[9] The pattern forming process of any one of [1] to [7] wherein a mask bearing a dotted light-shielding pattern is used, whereby a pattern of holes is formed at the dots after development.

[10] The pattern forming process of any one of [1] to [7] wherein a mask bearing a lattice-like light-shielding pattern is used, whereby a pattern of holes is formed at the intersections between gratings of the mask pattern after development.

[11] The pattern forming process of any one of [1] to [7] wherein the exposure step includes first and second exposures through first and second masks each having a lined light-shielding pattern, the direction of lines on the second mask for the second exposure is changed from the direction of lines on the first mask for the first exposure so that the lines on the first mask intersect with the lines on the second mask, whereby a pattern of holes is formed at the intersections between the lines after development.

[12] The pattern forming process of any one of [7] to [11] wherein the mask is a halftone phase shift mask having a transmittance of 3 to 15%.

[13] The pattern forming process of any one of [1] to [12], comprising the steps of applying the resist composition onto a substrate, post-applied baking the composition to form a resist film, forming a protective film on the resist film, exposing the resist film to high-energy radiation, post-exposure baking, and applying an organic solvent-based developer to dissolve away the protective film and the unexposed region of the resist film.

ADVANTAGEOUS EFFECTS OF INVENTION

The resist composition comprising a specific hydrogenated ROMP polymer and a specific (meth)acrylate resin as a base resin displays a high dissolution contrast in organic solvent development, and exhibits high dry etch resistance even when the acid labile group has been deprotected through exposure and PEB. When a negative pattern is formed by using the resist composition and performing organic solvent development, the resulting fine trench or hole pattern is improved in mask size fidelity and CD uniformity within an exposure shot, and high dry etch resistance is available.

BRIEF DESCRIPTION OF DRAWINGS

FIG. 1 is a cross-sectional view of a patterning process according one embodiment of the invention.

DESCRIPTION OF EMBODIMENTS

Figure 1A:
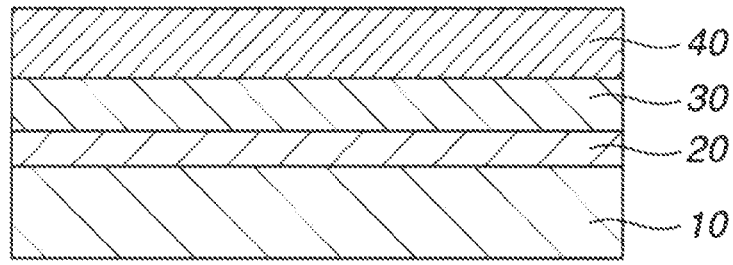
FIG. 1A shows a resist film disposed on a substrate.

The terms "a" and an herein do not denote a limitation of quantity, but rather denote the presence of at least one of the referenced item. As used herein, the notation ($C_n$-$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein. The terminology "(meth)acrylate" refers collectively to acrylate and methacrylate.

The abbreviations and acronyms have the following meaning.

Mw: weight average molecular weight
Mn: number average molecular weight
Mw/Mn: molecular weight distribution or dispersity
GPC: gel permeation chromatography
CD: critical dimension
PAB: post-applied bake
PEB: post-exposure bake
PDB: post-development bake
ROMP: ring-opening metathesis polymerization
PAG: photoacid generator It is understood that for a certain chemical formula, there can exist enantiomers and diastereomers. In such a case, a single plane or stereoisomer formula collectively represents all such stereoisomers. The stereoisomers may be used alone or in admixture.

Briefly stated, the invention pertains to a pattern forming process comprising the steps of applying a resist composition based on a hydrogenated ROMP polymer and a (meth)acrylate resin onto a substrate, post-applied baking to remove the unnecessary solvent and form a resist film, exposing to high-energy radiation, PEB, and developing in an organic solvent developer to form a negative pattern.

ROMP Polymer

With regard to the hydrogenated ROMP polymer in the resist composition used in the present process, similar compounds and mixtures thereof with (meth)acrylate resins are found in the prior art processes of forming a positive pattern with an alkaline developer as described in Patent Documents 9 and 10 (JP 4497266 and JP 4013044). The inventors have discovered that when a process of forming a negative pattern using an organic solvent as the developer is applied to the ROMP polymer, a fine trench or hole pattern which is incompatible with alkaline development can be resolved, and in addition, such a fine pattern is improved in mask size fidelity and CD uniformity within an exposure shot. The invention is predicated on this discovery.

The hydrogenated ROMP polymer (A) as one base resin in the resist composition used herein comprises recurring units of at least one type including a partial structure having a carboxyl group protected with an acid labile group, represented by the general formula (1-1).

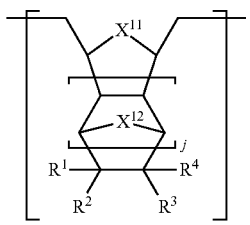

(1-1)

Herein at least one of $R^1$ to $R^4$ is a functional group having the general formula (2):

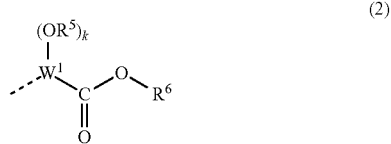

(2)

wherein the broken line denotes a valence bond, $R^5$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $R^6$ is an acid labile group, $W^1$ is a single bond or a (k+2)-valent $C_1$-$C_{10}$ hydrocarbon group, and k is 0 or 1. The remains of $R^1$ to $R^4$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl. $X^{11}$ and $X^{12}$ are each independently —O— or —$CR^7_2$— wherein $R^7$ is hydrogen or $C_1$-$C_{10}$ straight or branched alkyl. The subscript j is 0 or an integer of 1 to 3.

With respect to $R^5$ in formula (2), suitable $C_1$-$C_{10}$ straight, branched or cyclic alkyl groups include methyl, ethyl, propyl, isopropyl, n-butyl, isobutyl, tert-butyl, cyclopentyl, cyclohexyl, 1-ethylcyclopentyl, and 1-ethylcyclohexyl; suitable $C_2$-$C_{10}$ straight, branched or cyclic alkoxyalkyl groups include methoxymethyl, 1-ethoxyethyl, 1-tert-butoxyethyl, 1-cyclohexyloxyethyl, 1-ethoxypropyl, 1-ethoxy-1-methylethyl, tetrahydrofuran-2-yl, and tetrahydropyran-2-yl; and suitable $C_1$-$C_{10}$ straight, branched or cyclic acyl groups include formyl, acetyl, pivaloyl, and cyclohexylcarbonyl. Of these, preference is given to $C_1$-$C_6$ straight or branched alkyl groups, $C_2$-$C_7$ straight, branched or cyclic alkoxyalkyl groups, and $C_2$-$C_7$ straight or branched acyl groups. More preferably, $R^5$ is hydrogen, methyl, ethyl, methoxymethyl, 1-ethoxyethyl, tetrahydrofuran-2-yl or acetyl.

In formula (2), $W^1$ is a single bond or a (k+2)-valent $C_1$-$C_{10}$ hydrocarbon group. The (k+2)-valent $C_1$-$C_{10}$ hydrocarbon group is, in case of k=0, a divalent $C_1$-$C_{10}$ straight, branched or cyclic hydrocarbon group. Examples include methylene, dimethylmethylene, ethylidene, propylidene, butylidene, ethylene, 1-methylethylene, 2-methylethylene, 1-ethylethylene, 2-ethylethylene, 1,1-dimethylethylene, 1,2-dimethylethylene, 2,2-dimethylethylene, 1-ethyl-2-methylethylene, trimethylene, 1-methyltrimethylene, 2-methyltrimethylene, 3-methyltrimethylene, tetramethylene, pentamethylene, 1,1-cyclopentylene, 1,2-cyclopentylene, 1,3-cyclopentylene, 1,1-cyclohexylene, 1,2-cyclohexylene, 1,3-cyclohexylene, and 1,4-cyclohexylene. Of these, preference is given to methylene, ethylidene, ethylene, 1-methylethylene, 2-methylethylene, trimethylene, and 2-methyltrimethylene. In case of k=1, the exemplary hydrocarbon groups listed above for k=0, with any hydrogen atom being eliminated to provide a valence bond, are suitable. Most preferably $W^1$ is a single bond.

In formula (2), $R^6$ is an acid labile group. The acid labile group $R^6$ is not particularly limited as long as it is deprotected under the action of acid to generate a carboxylic acid. An acid labile group having the general formula (5), (6) or (7) is preferred because of adequate reactivity. The acid labile group is necessary to produce a dissolution contrast in developer and to form a resist pattern.

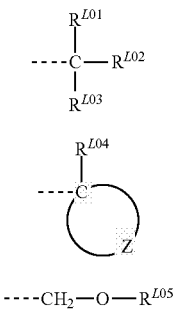

(5)

(6)

(7)

Herein the broken line denotes a valence bond, $R^{L01}$ to $R^{L03}$ are each independently $C_1$-$C_{12}$ straight, branched or cyclic alkyl, $R^{L04}$ is $C_1$-$C_{10}$ straight, branched or cyclic alkyl, Z is a divalent $C_2$-$C_{15}$ hydrocarbon group to form a monocyclic or bridged ring with the carbon atom to which it is attached, and $R^{L05}$ is $C_1$-$C_{20}$ straight, branched or cyclic alkyl.

Examples of the group of formula (5) include tert-butyl, tert-amyl, 2-ethyl-2-butyl, 1,1-dimethylbutyl, 1-ethyl-1-methylpropyl, 1,1-dimethylpropyl, 1-cyclopentyl-1-methylethyl, 1-cyclohexyl-1-methylethyl, and 1-(1-adamantyl)-1-methylethyl.

Examples of the group of formula (6) include 1-methylcyclopropyl, 1-methylcyclobutyl, 1-ethylcyclobutyl, 1-methylcyclopentyl, 1-ethylcyclopentyl, 1-n-propylcyclopentyl, 1-isopropylcyclopentyl, 1-tert-butylcyclopentyl, 1-cyclopentylcyclopentyl, 1-cyclohexylcyclopentyl, 1-norbornylcyclopentyl, 1-methylcyclohexyl, 1-ethylcyclohexyl, 1-methylcycloheptyl, 1-ethylcycloheptyl, 1-methylcyclooctyl, 1-methylcyclononyl, 2-methyl-2-norbornyl, 2-ethyl-2-norbornyl, 2-methyl-2-adamantyl, 2-ethyl-2-adamantyl, 2-n-propyl-2-adamantyl, 2-isopropyl-2-adamantyl.

Examples of the group of formula (7) include methoxymethyl, ethoxymethyl, isopropoxymethyl, tert-butoxymethyl, tert-amyloxymethyl, neopentyloxymethyl, cyclopentyloxymethyl, cyclohexyloxymethyl, 1-adamantyloxymethyl, 2-adamantyloxymethyl, and 1-adamantylmethyloxymethyl.

Inter alia, tert-butyl, tert-amyl, 2-ethyl-2-butyl, 1-methylcyclopentyl, 1-ethylcyclopentyl, 1-n-propylcyclopentyl, 1-isopropylcyclopentyl, 1-tert-butylcyclopentyl, 1-cyclopentylcyclopentyl, 1-cyclohexylcyclopentyl, 1-norbornylcyclopentyl, 2-methyl-2-norbornyl, 2-ethyl-2-norbornyl, 2-methyl-2-adamantyl, 2-ethyl-2-adamantyl, 2-n-propyl-2-adamantyl, 2-isopropyl-2-adamantyl, methoxymethyl, and 2-adamantyloxymethyl are preferred as the acid labile group $R^6$ in formula (2) for resolution.

Illustrative, non-limiting examples of the recurring unit having formula (1-1) are given below.

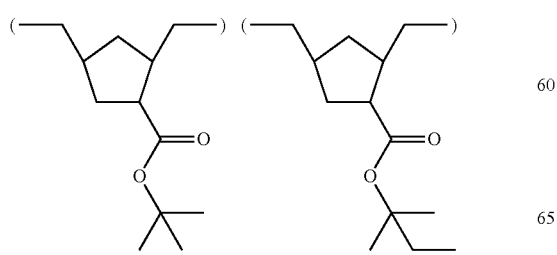

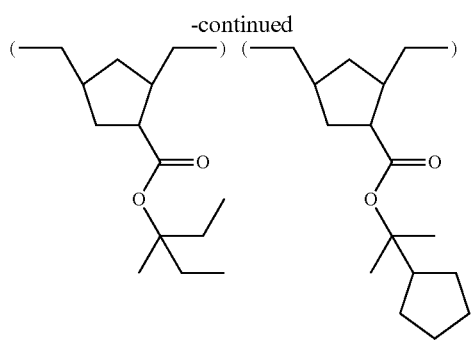

-continued

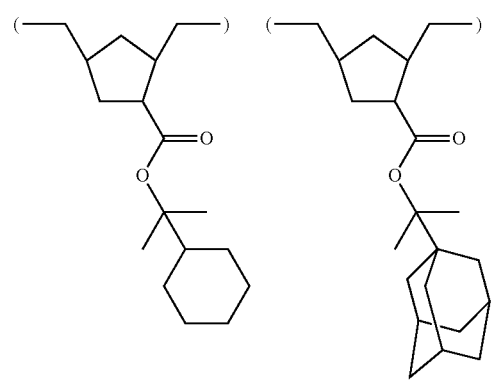

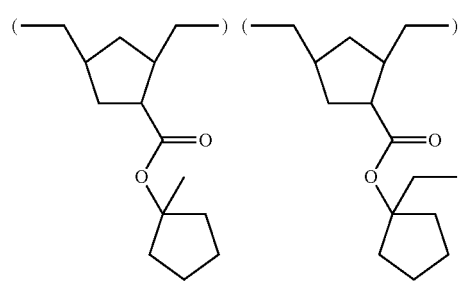

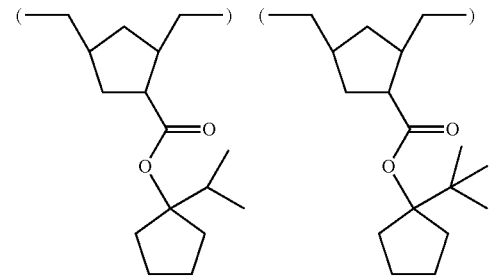

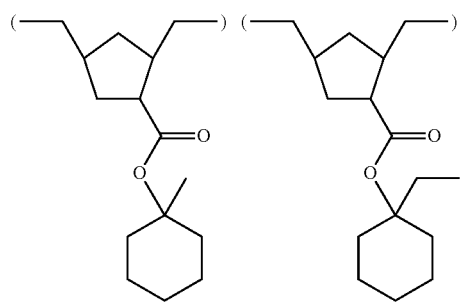

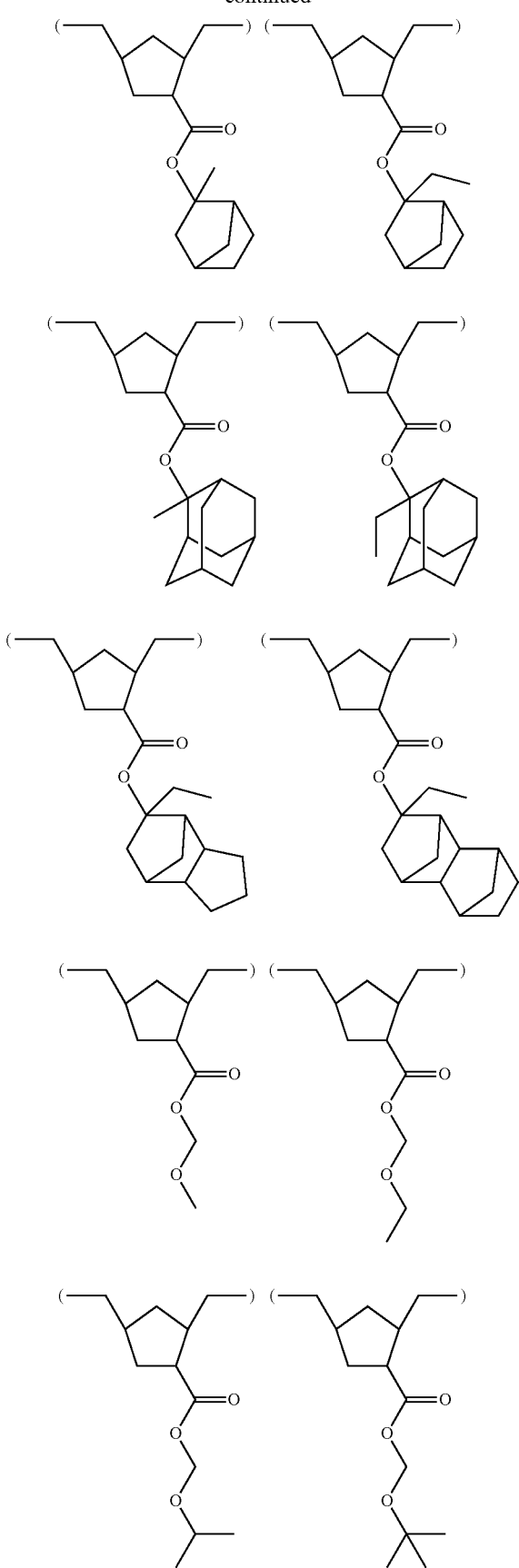
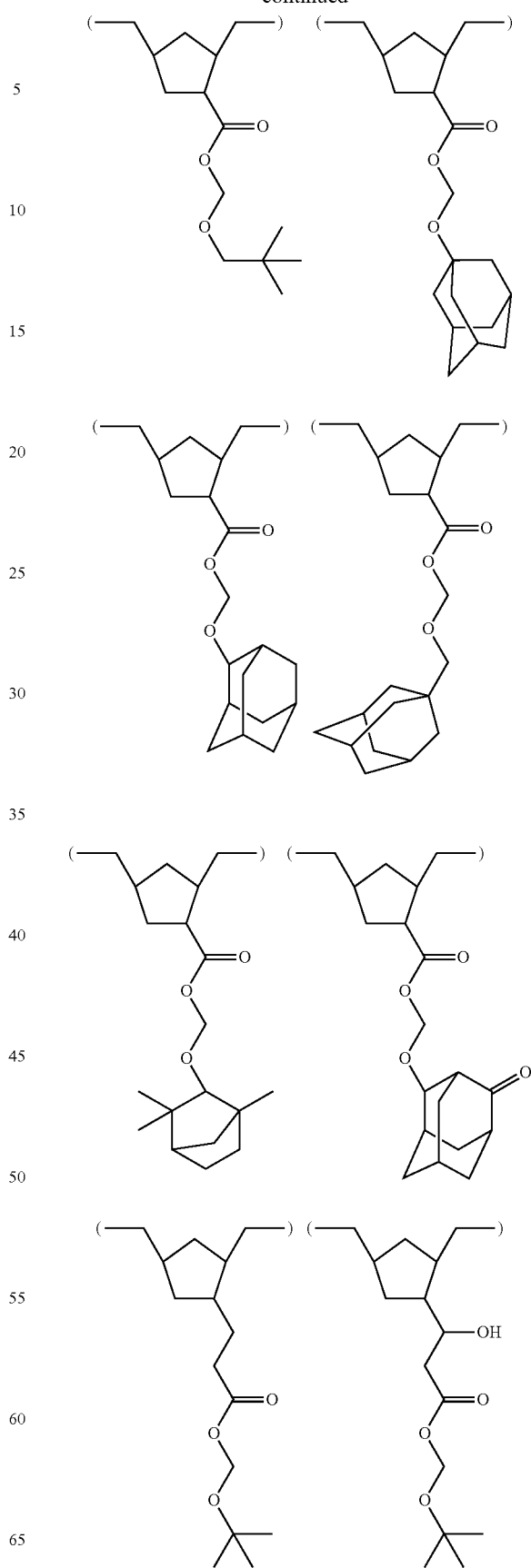

-continued
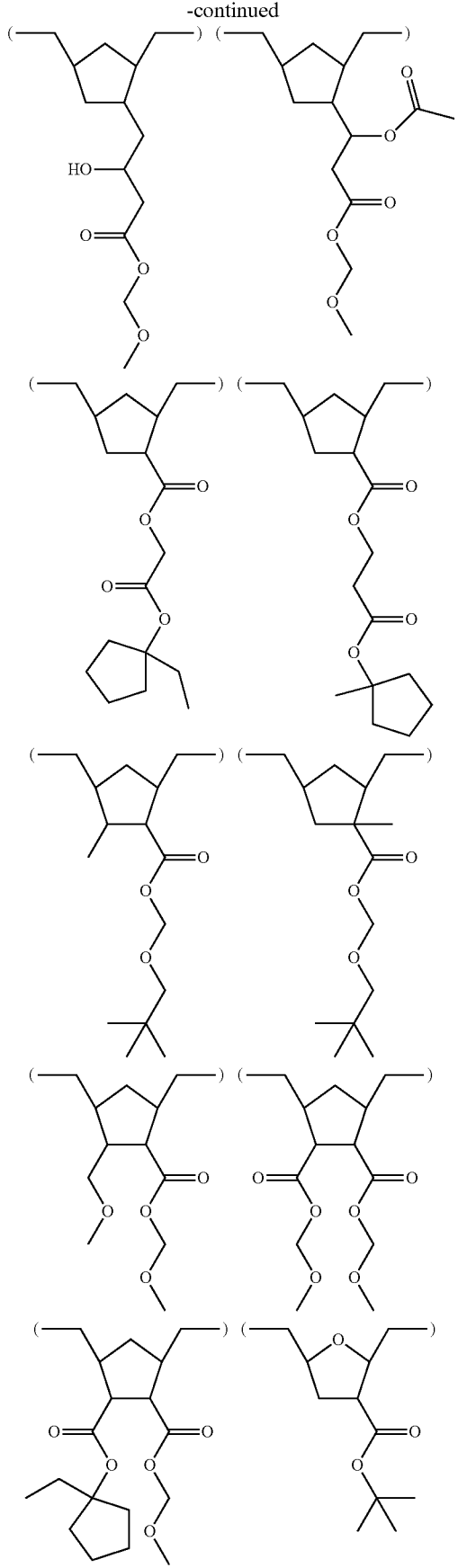
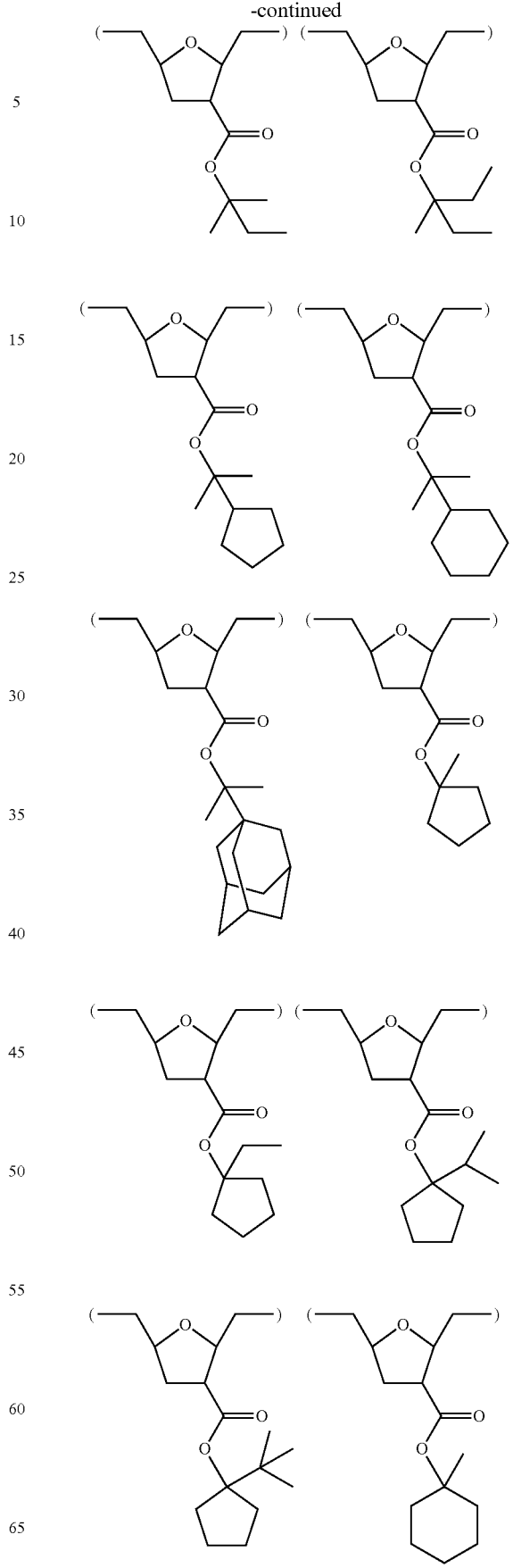

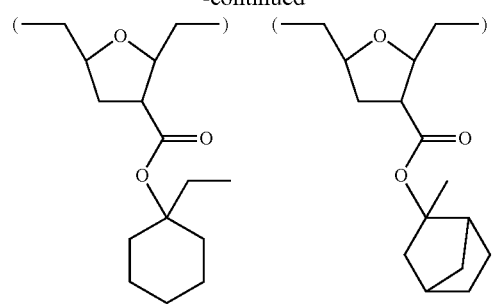
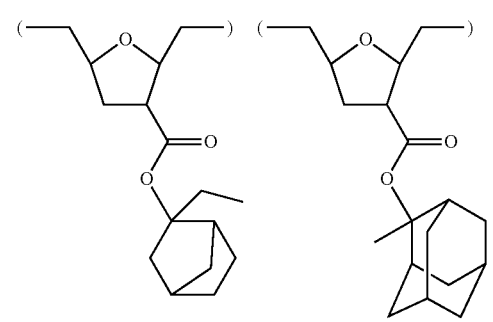
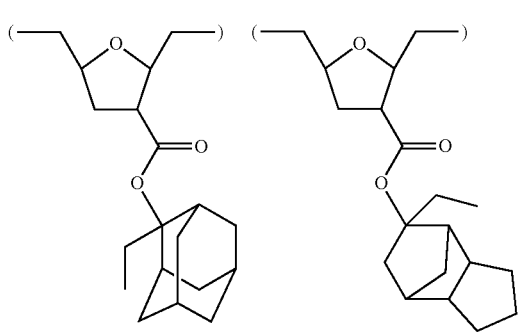
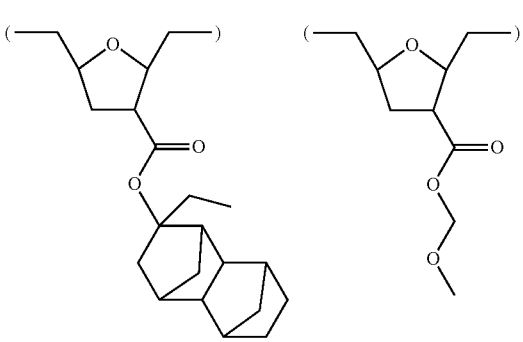
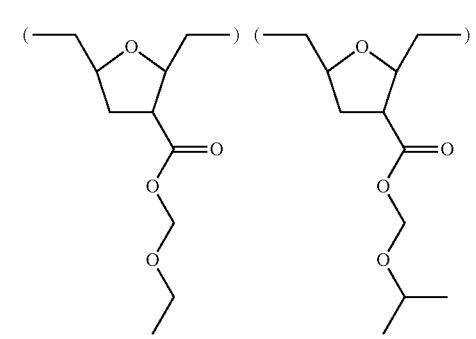
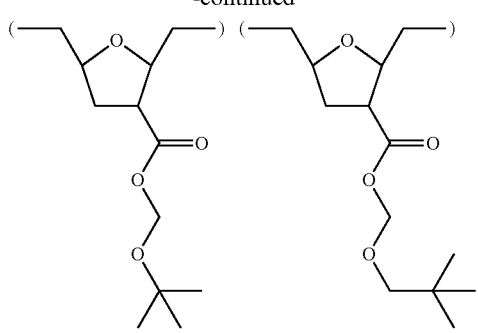
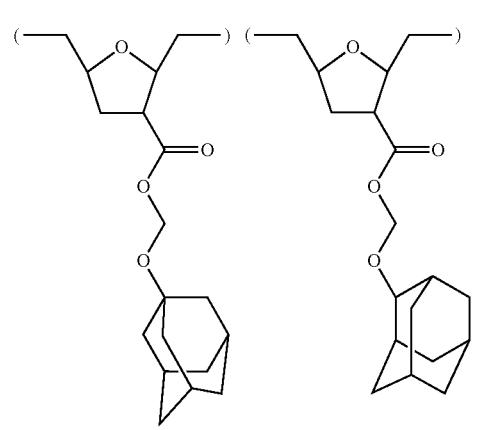
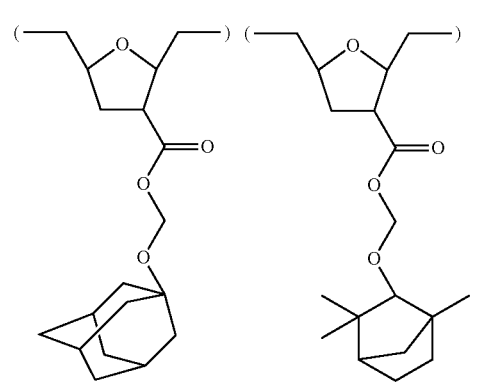
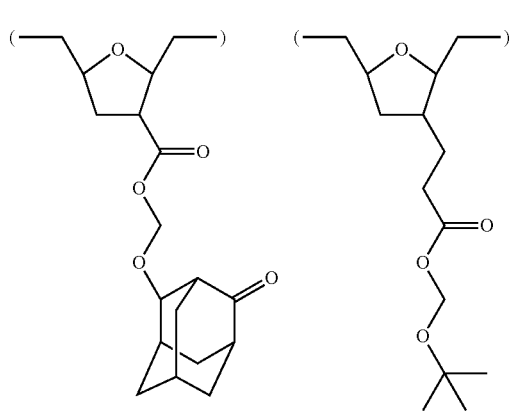

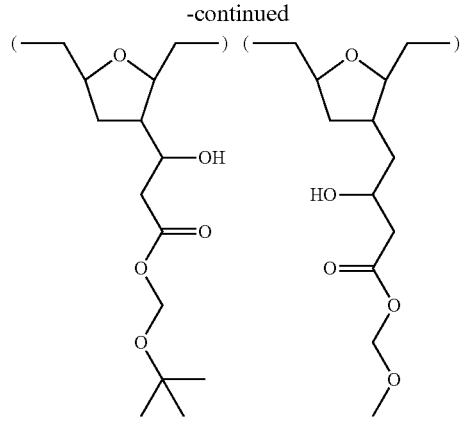
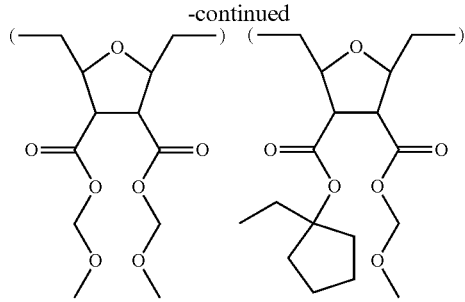
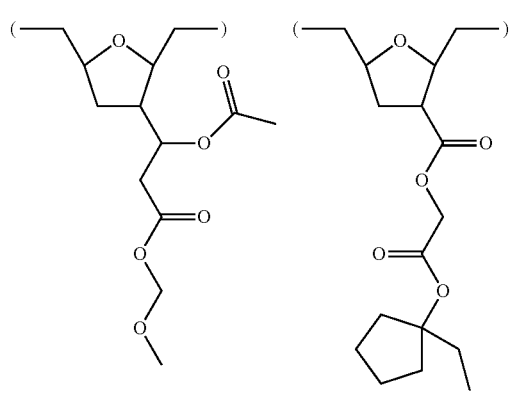
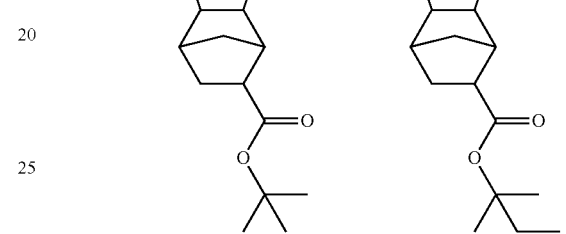
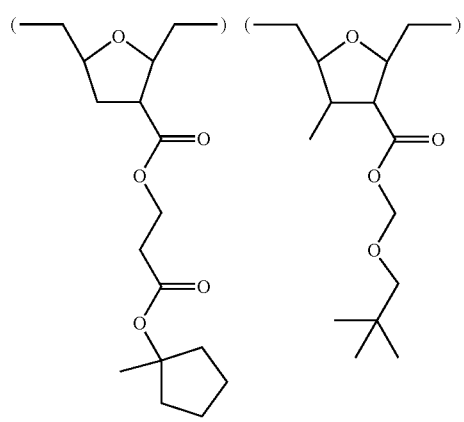
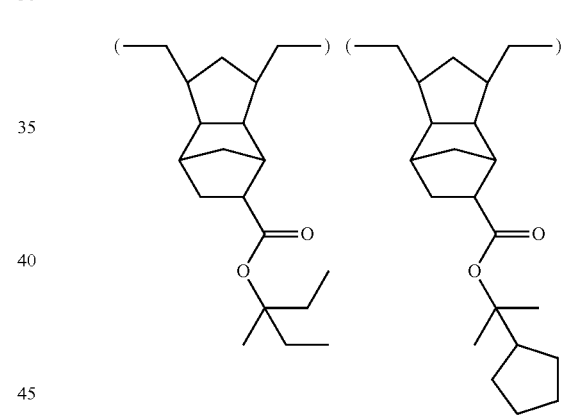
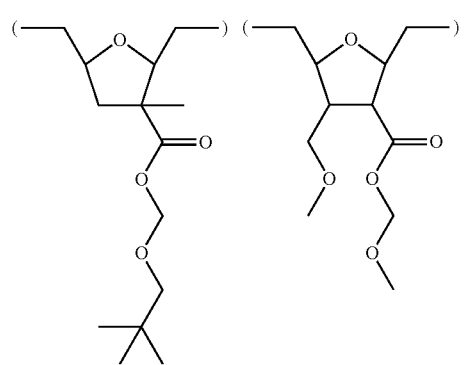
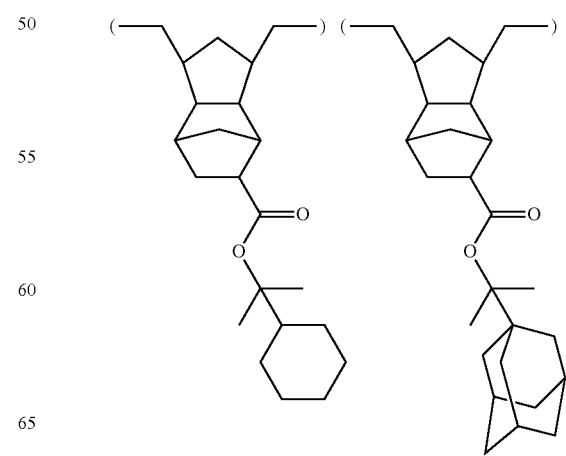

-continued
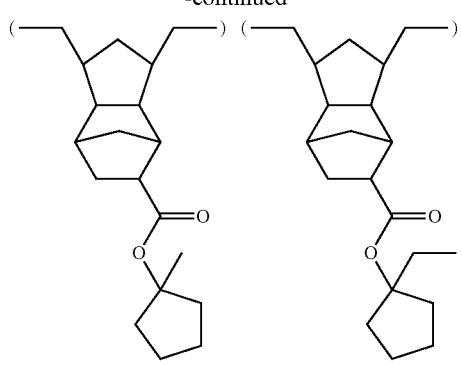
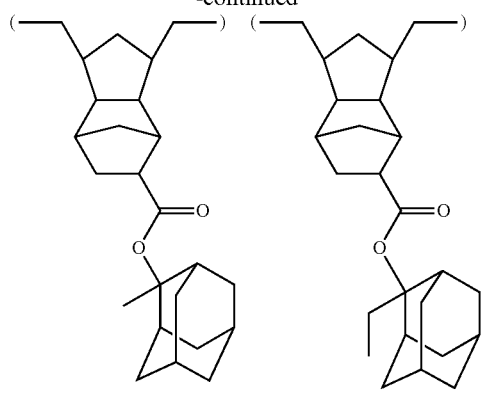
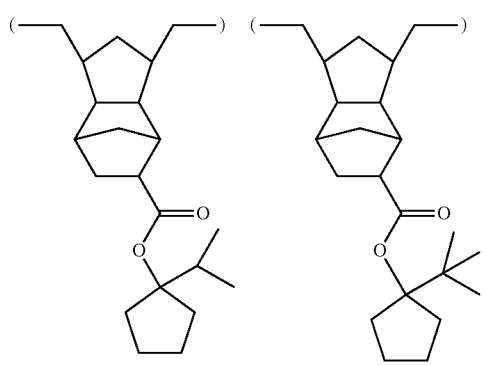
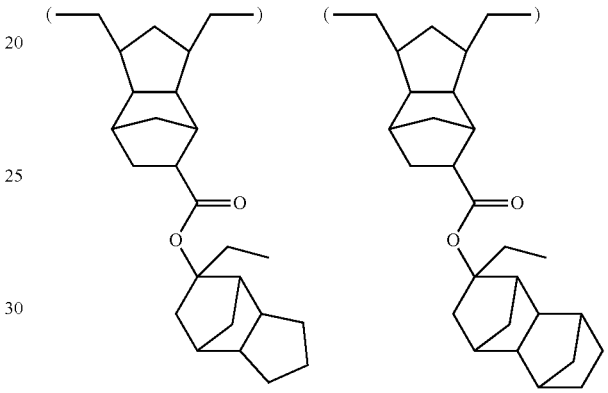
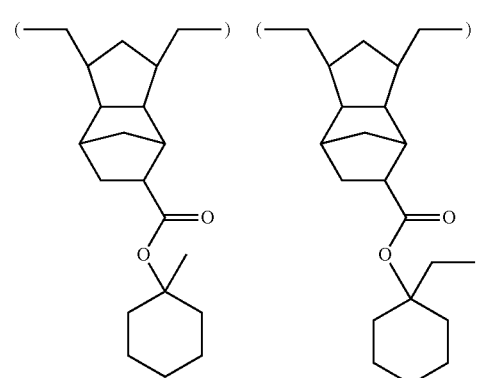
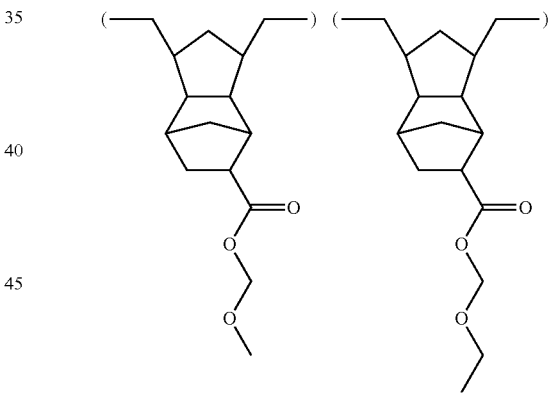
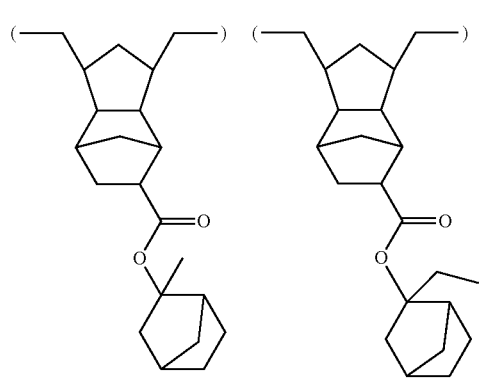
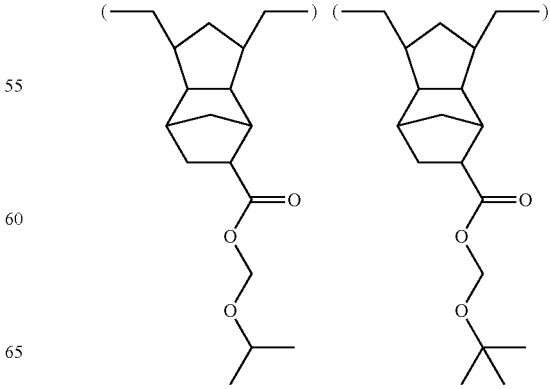

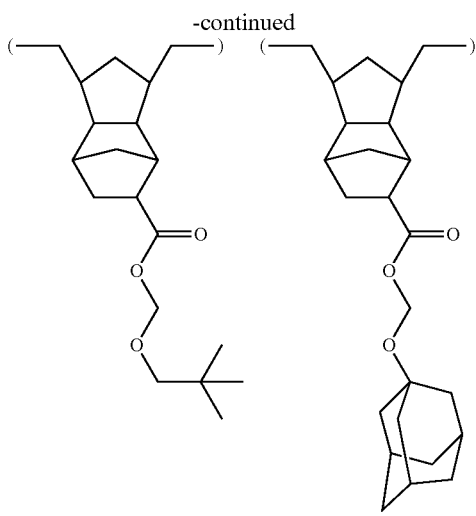
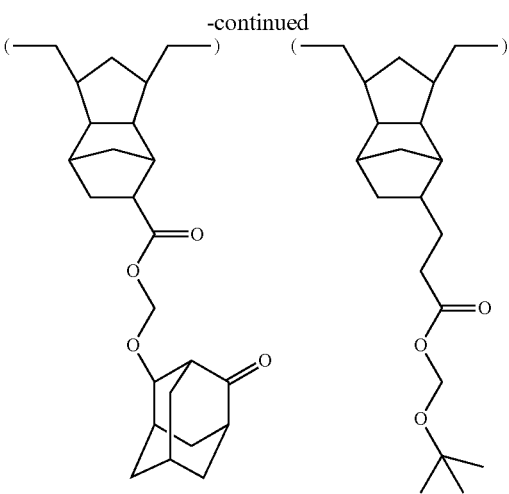
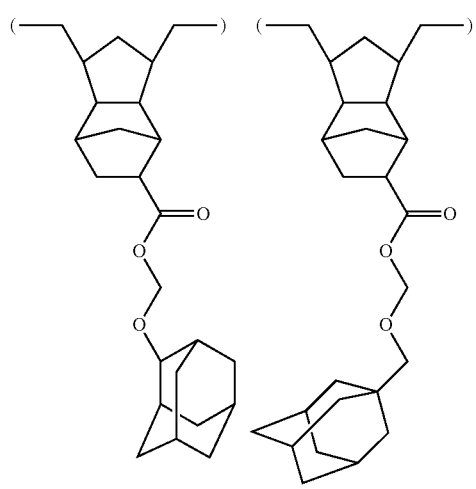
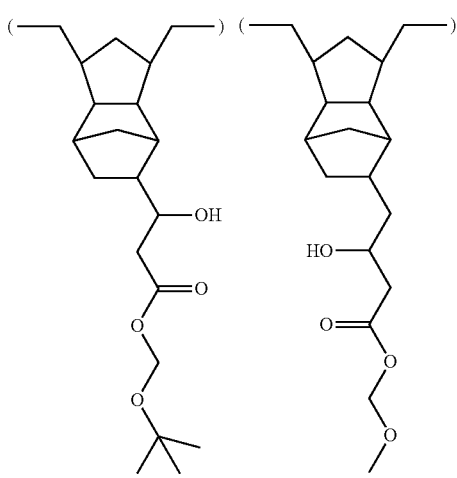
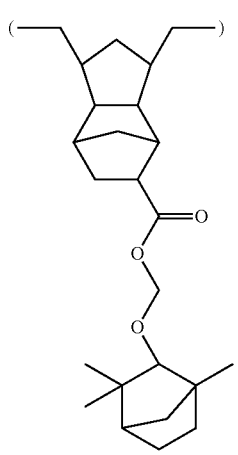 [SMILES: CCC1CC(CC)C2C3CC(CC3C(=O)OCOC3C4(C)CCC(C4)C3(C)C)C12]
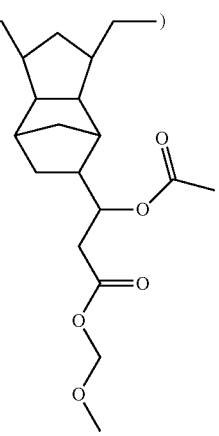
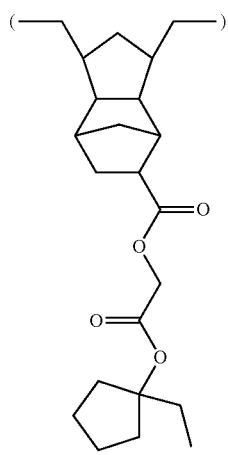

-continued
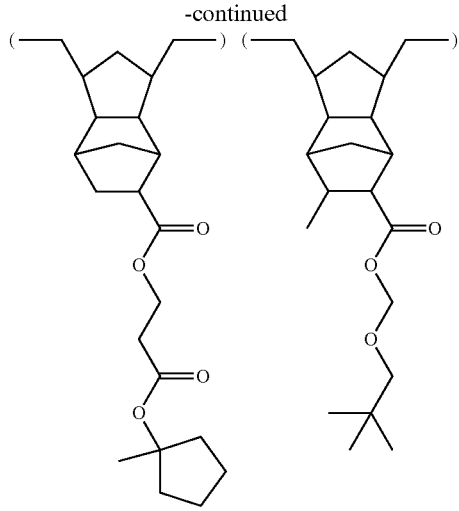 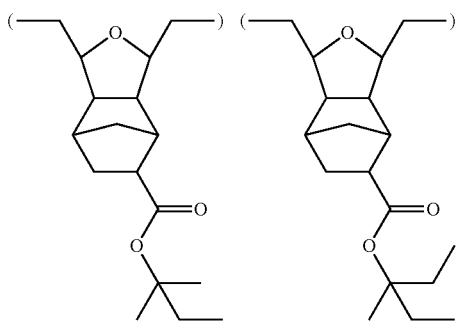
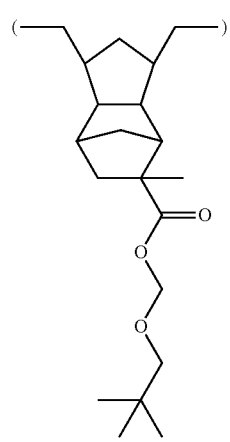 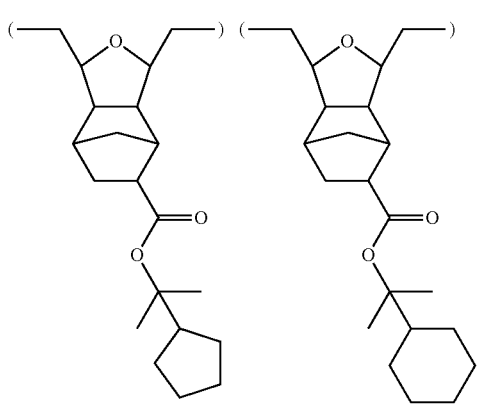
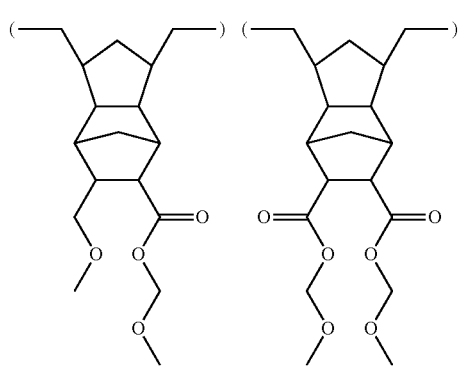 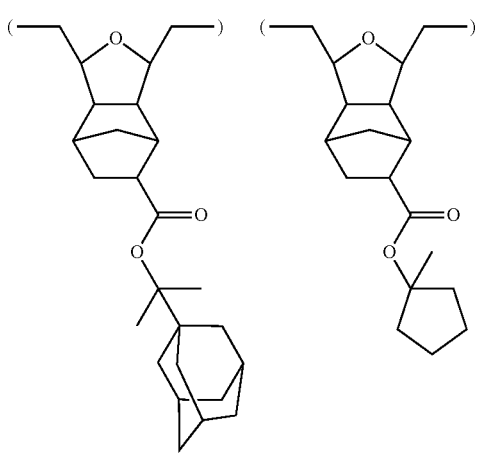
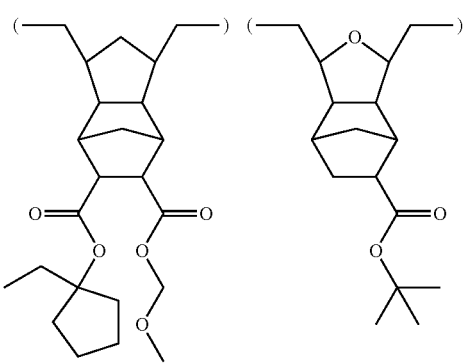 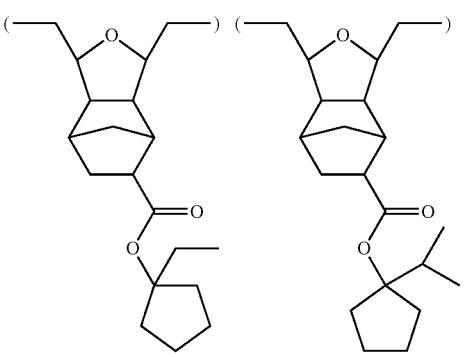

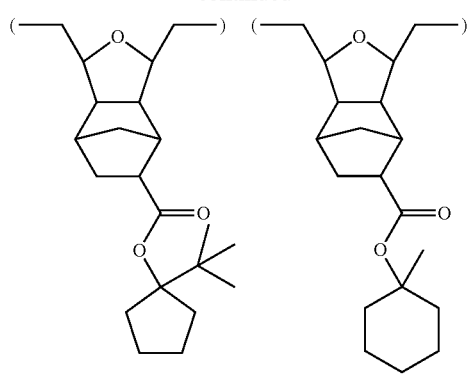
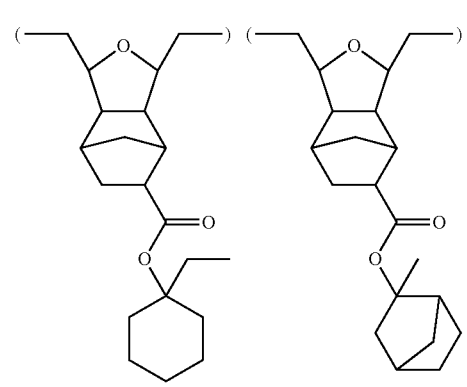
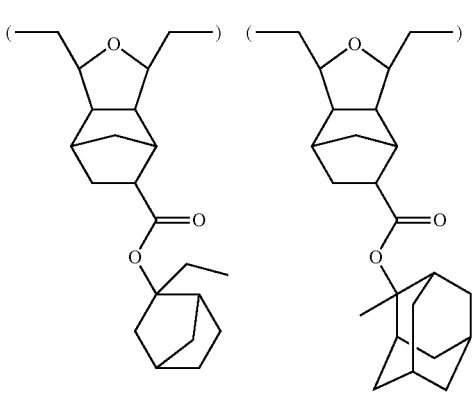
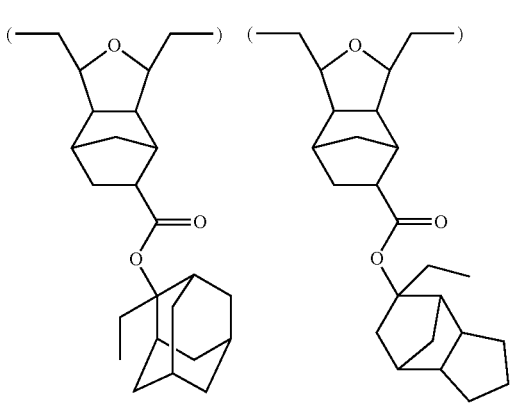
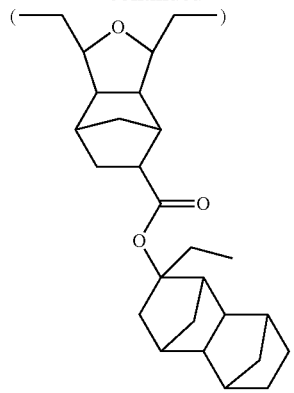 [SMILES: CCC1OC(CC)C2C3CC(CC3C(=O)OC3(CC)CC4CC3C3C5CCC(C5)C43)C12]
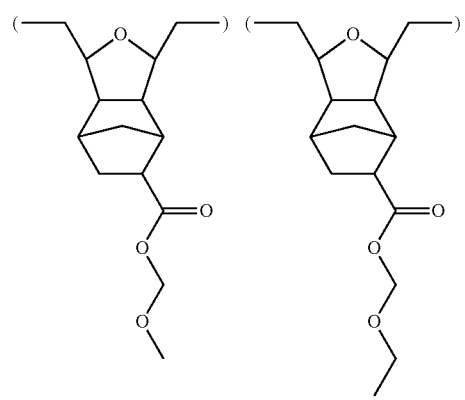
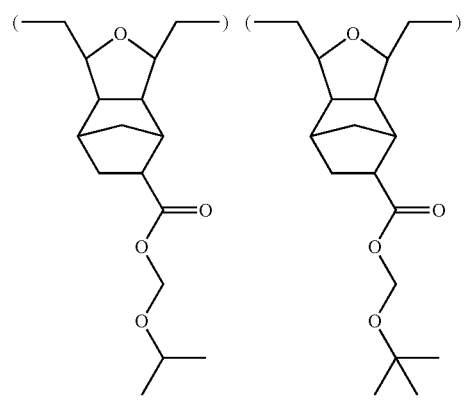
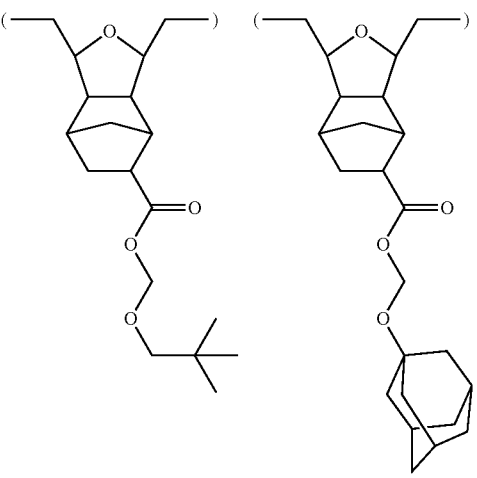

31
-continued
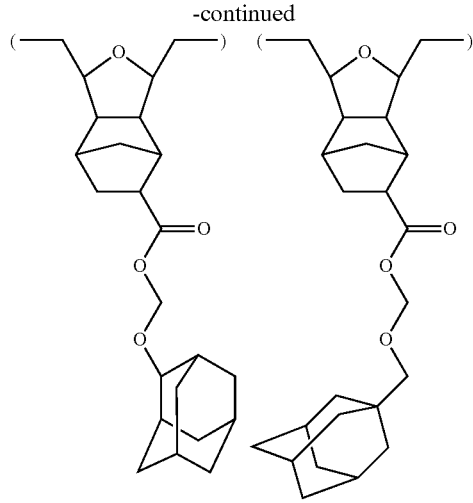
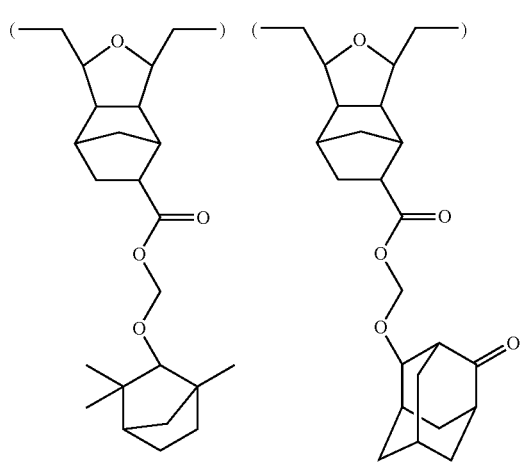
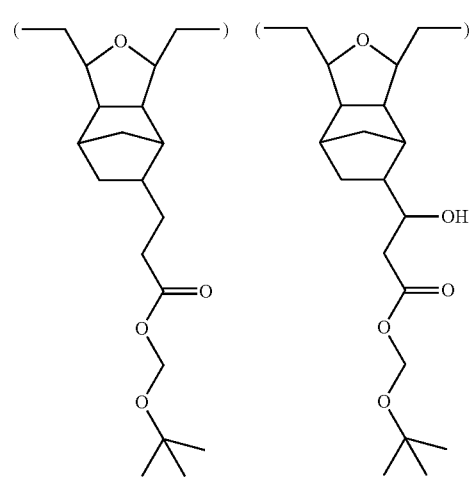
32
-continued
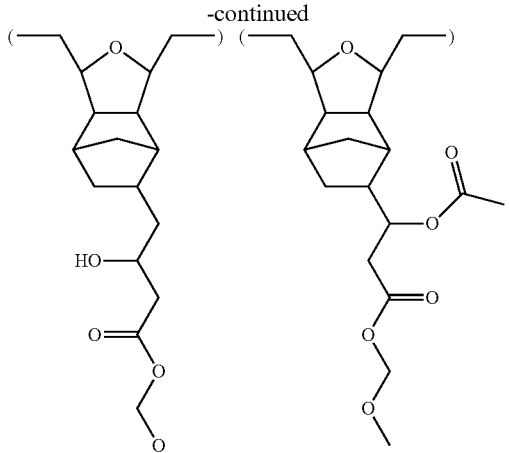
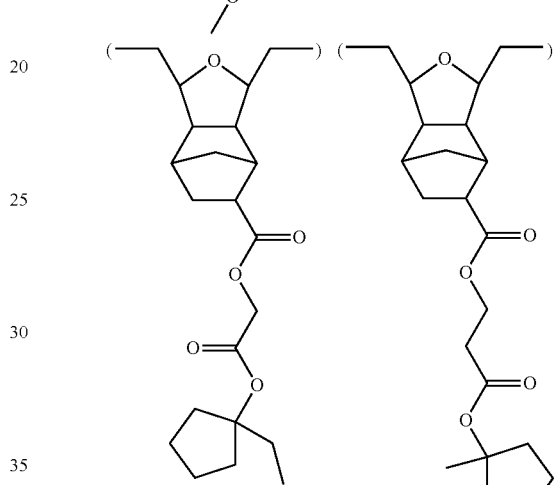
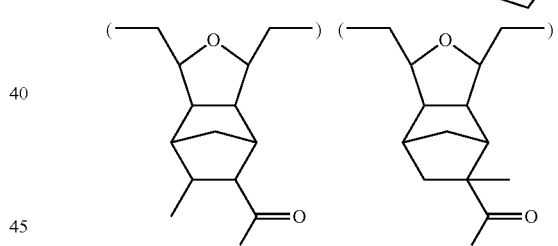
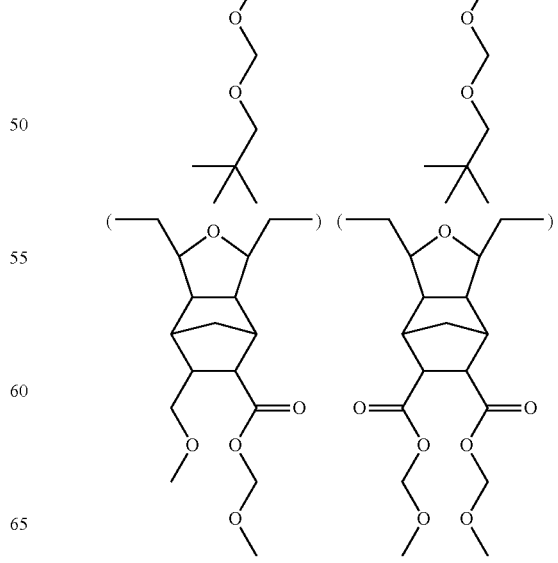

33
-continued
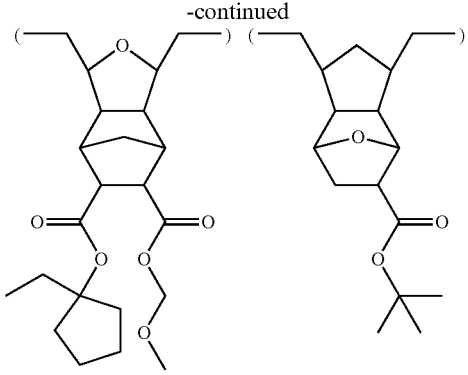
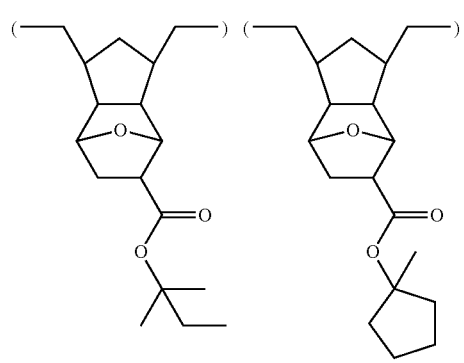
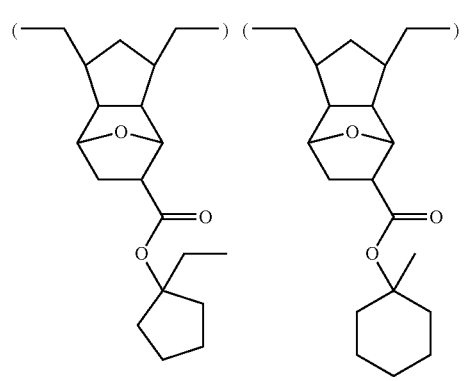
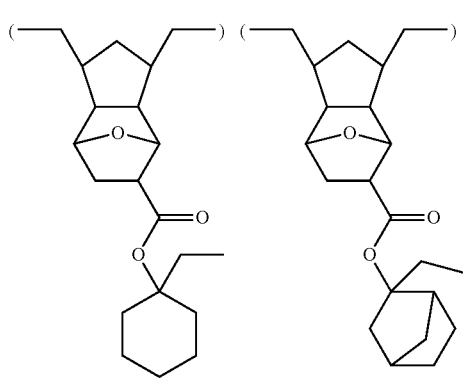
34
-continued
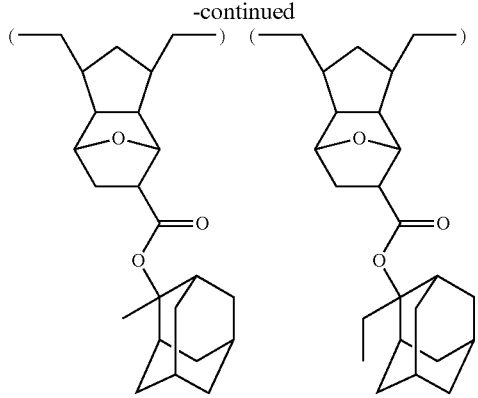
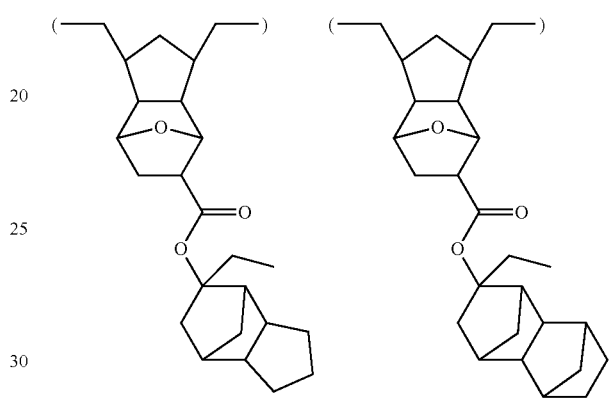
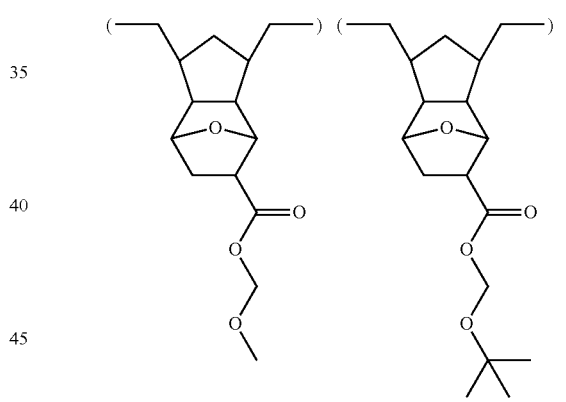
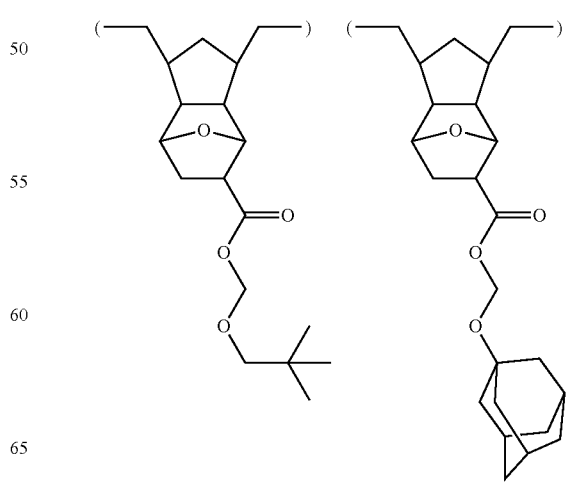

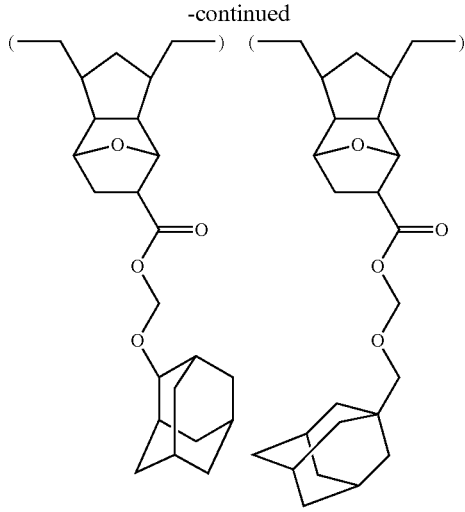
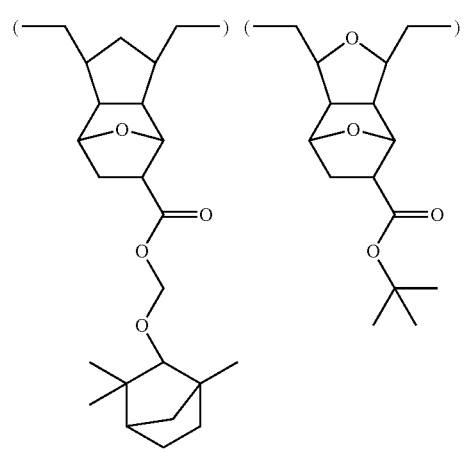
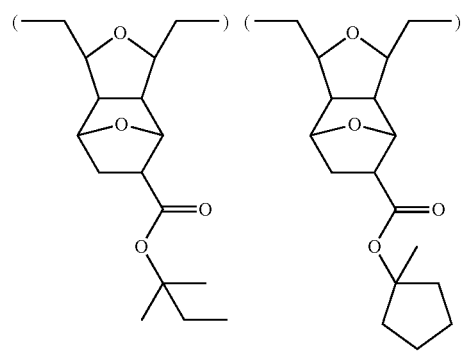
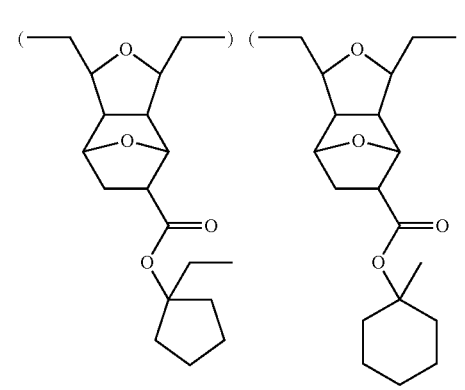
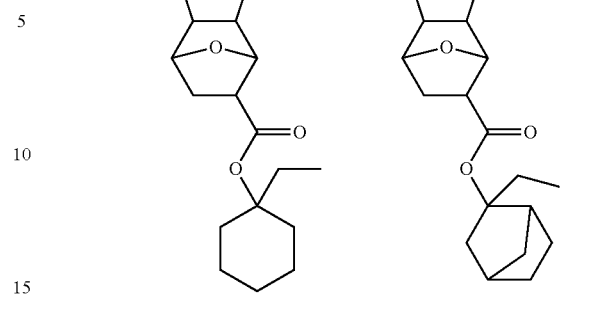
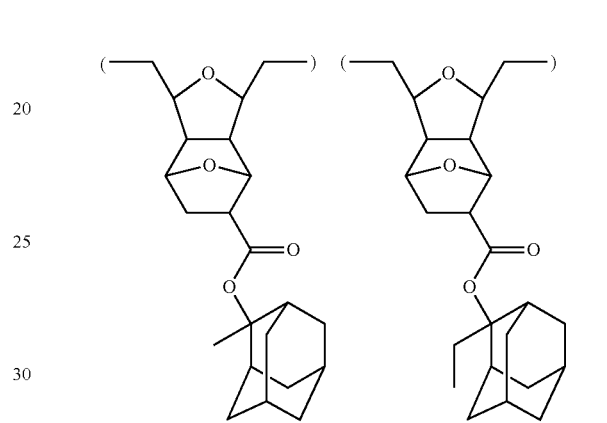
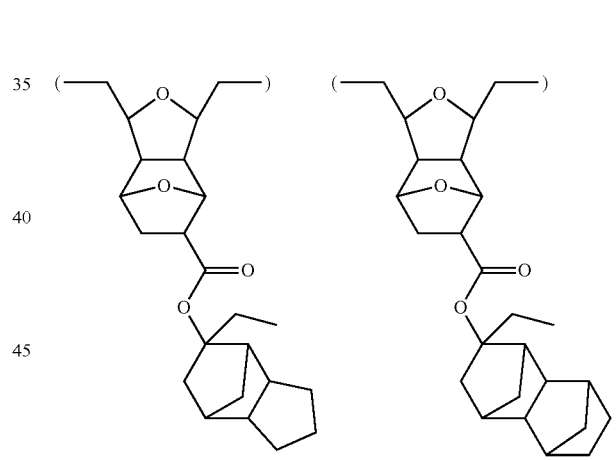
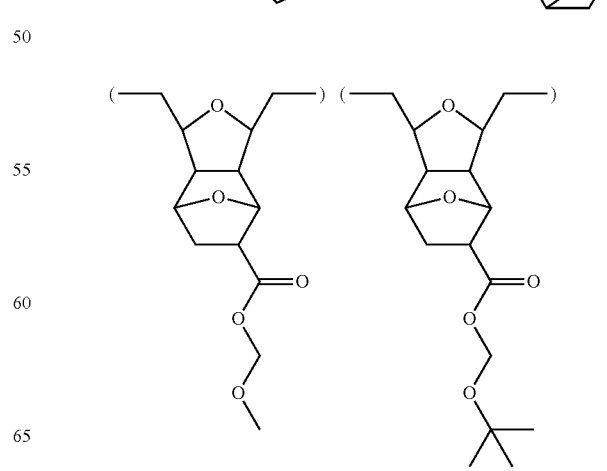

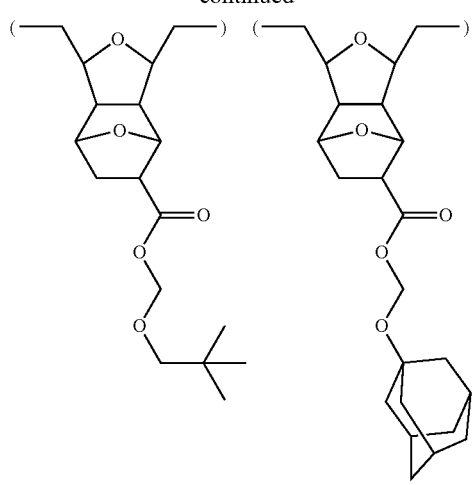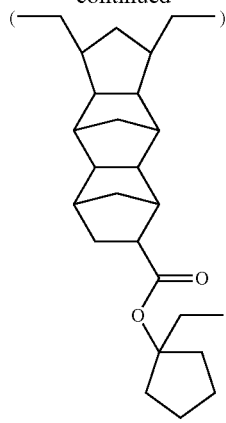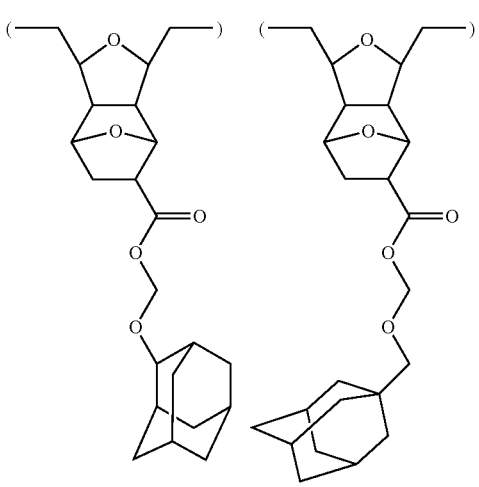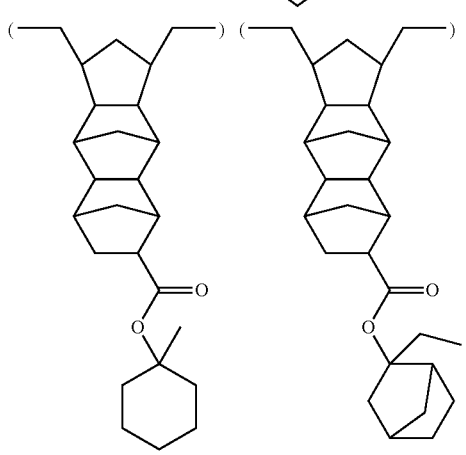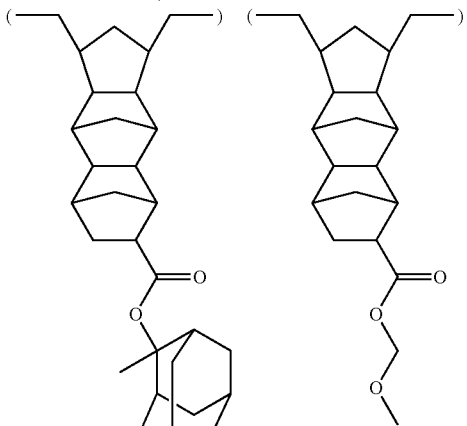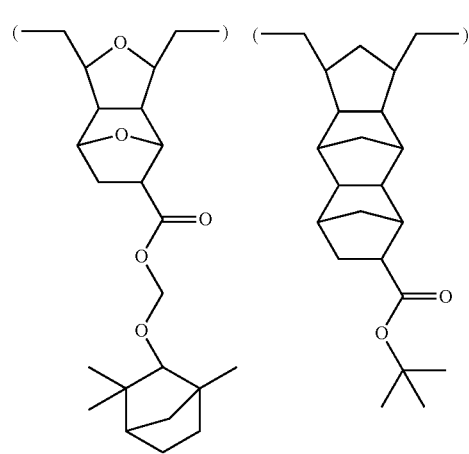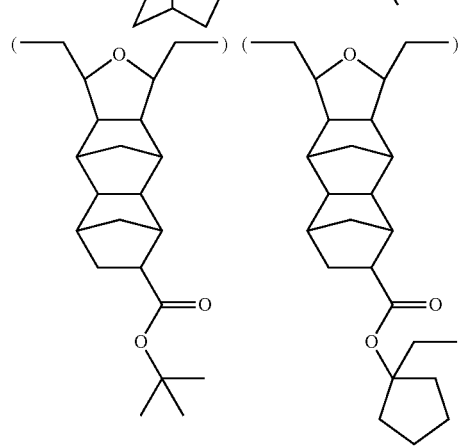

39
-continued
40
-continued
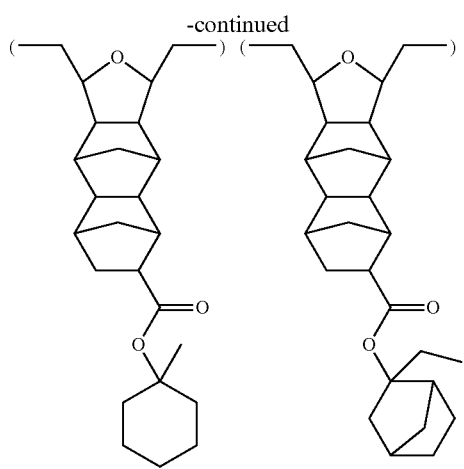
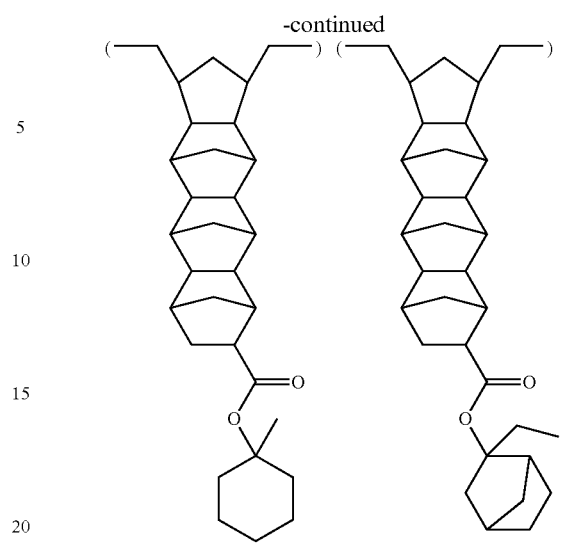
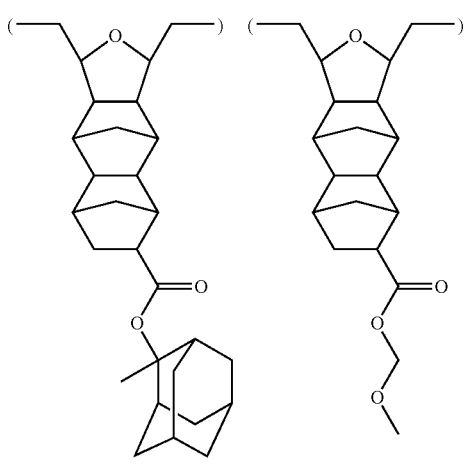
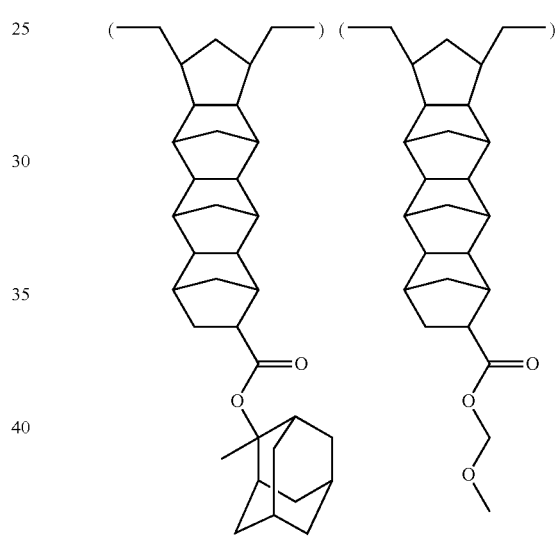
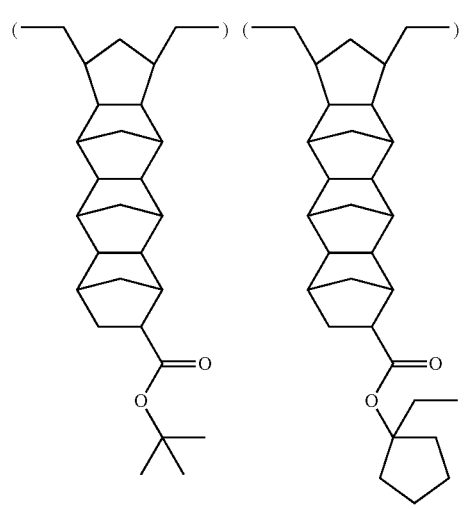
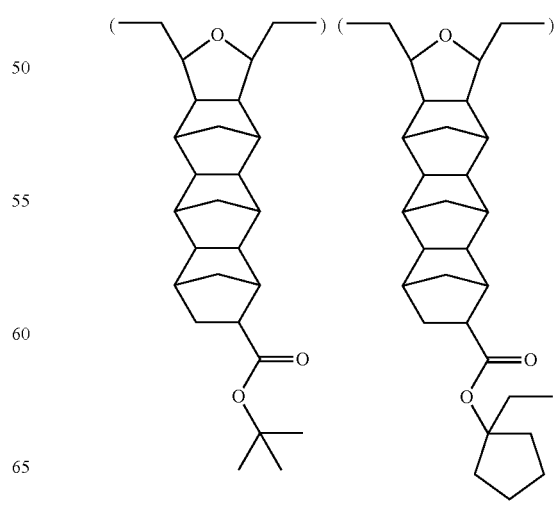

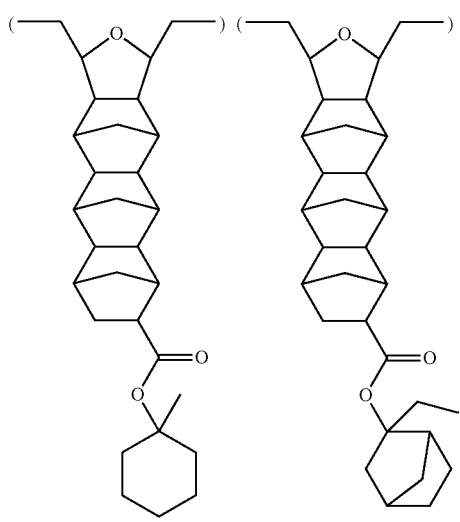

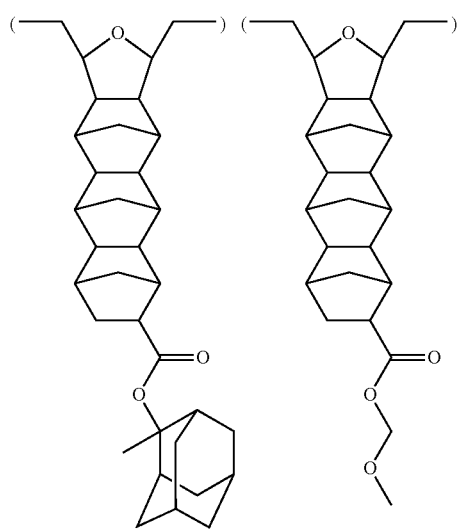

In addition to the recurring units having formula (I-1), the hydrogenated ROMP polymer (A) comprises recurring units of at least one type having a lactone structure, represented by the general formula (1-2) and/or (1-3). The lactone structure is effective for providing adhesion to a processable substrate, typically silicon substrate.

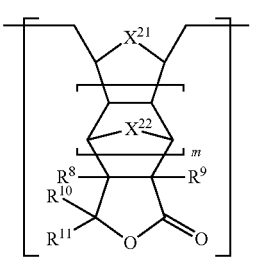
(1-2)

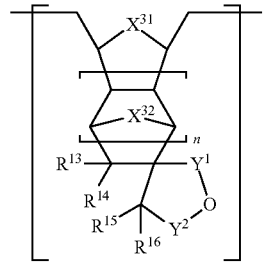
(1-3)

Herein $R^8$ to $R^{11}$ are each independently hydrogen or $C_1$-$C_{10}$ straight, branched or cyclic alkyl. $X^{21}$ and $X^{22}$ are each independently —O— or —$CR^{12}_2$— wherein $R^{12}$ is hydrogen or $C_1$-$C_{10}$ straight or branched alkyl. $R^{13}$ to $R^{16}$ are each independently hydrogen or $C_1$-$C_{10}$ straight, branched or cyclic alkyl. $X^{31}$ and $X^{32}$ are each independently —O— or —$CR^{17}_2$— wherein $R^{17}$ is hydrogen or $C_1$-$C_{10}$ straight or branched alkyl. One of $Y^1$ and $Y^2$ is —(C=O)— and the other is —$CR^{18}_2$— wherein $R^{18}$ is hydrogen or $C_1$-$C_{10}$ straight or branched alkyl. The subscript m is 0 or an integer of 1 to 3, and n is 0 or an integer of 1 to 3. Exemplary alkyl groups are as illustrated above.

Illustrative, non-limiting examples of the recurring unit having formulae (1-2) and (1-3) are given below.

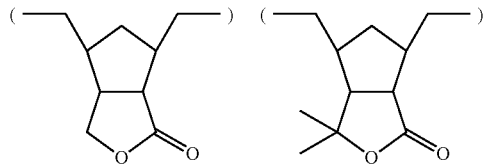

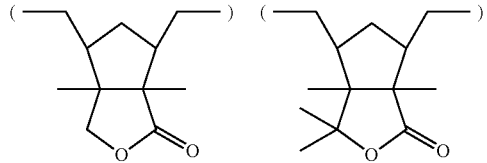

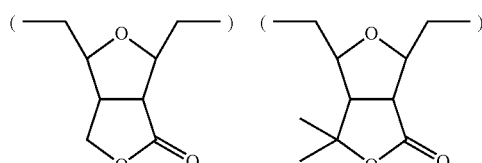

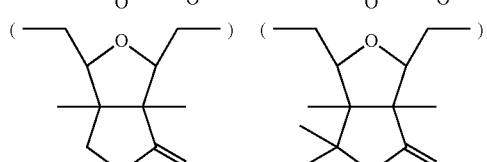

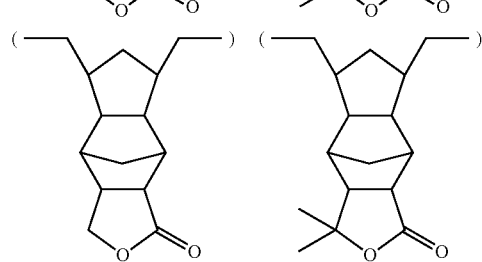

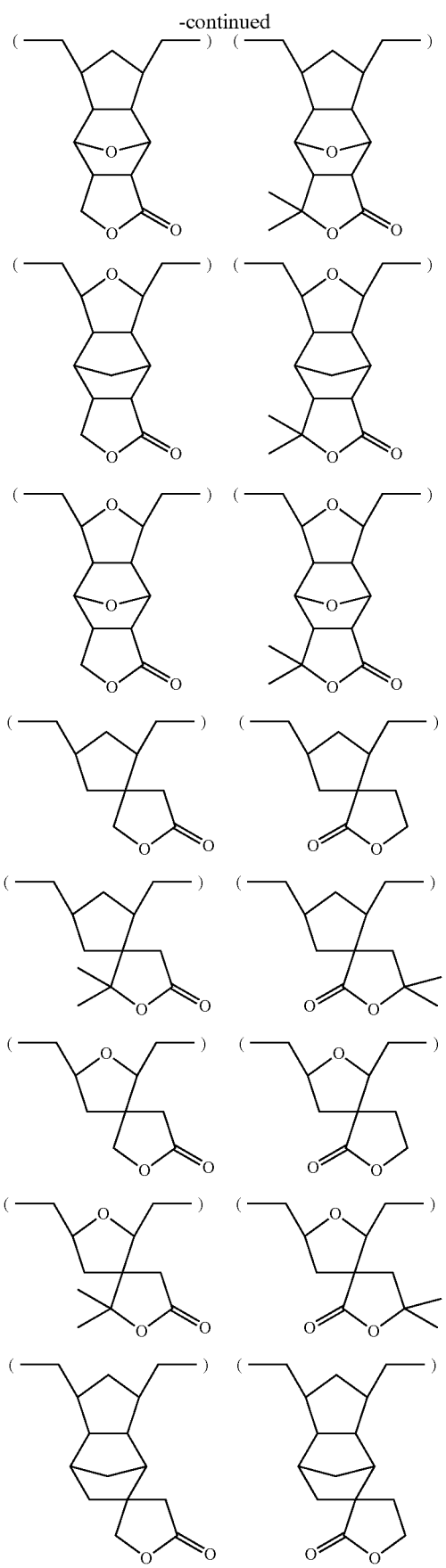
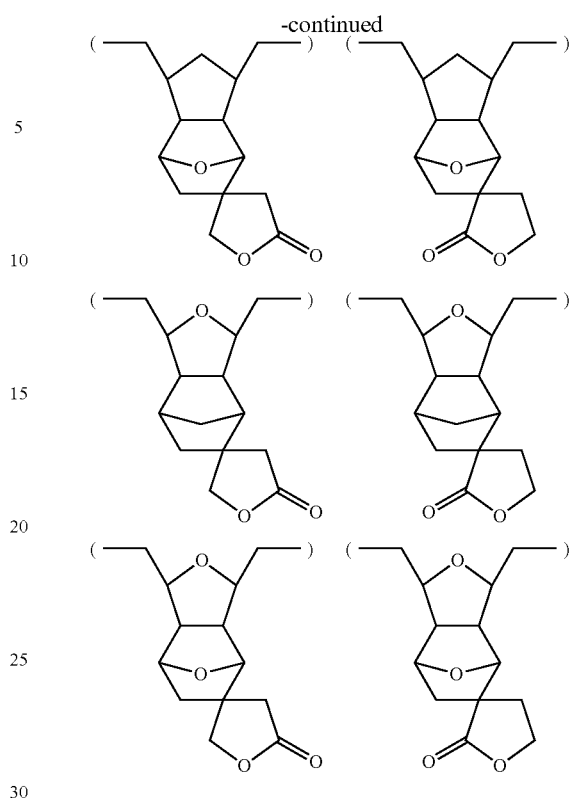

In the hydrogenated ROMP polymer (A) used herein, each of the recurring units having formulae (1-1), (I-2) and (I-3) may be of plural types.

The hydrogenated ROMP polymer (A) may be represented by the general formula (1) below. Each of the recurring units (a1), (a2), and (a3) may be of one or more types, and a1, a2, and a3 indicative of a constitutional molar ratio of the respective recurring units to the total are in the range: $0<a1<1$, $0≤a2≤0.8$, $0≤a3≤0.8$, $0<(a2+a3)$ $0.8$, and $0.5<(a1+a2+a3)≤1$, provided that the sum of constitutional molar ratios of recurring units in the hydrogenated ROMP polymer (A) is unity (1).

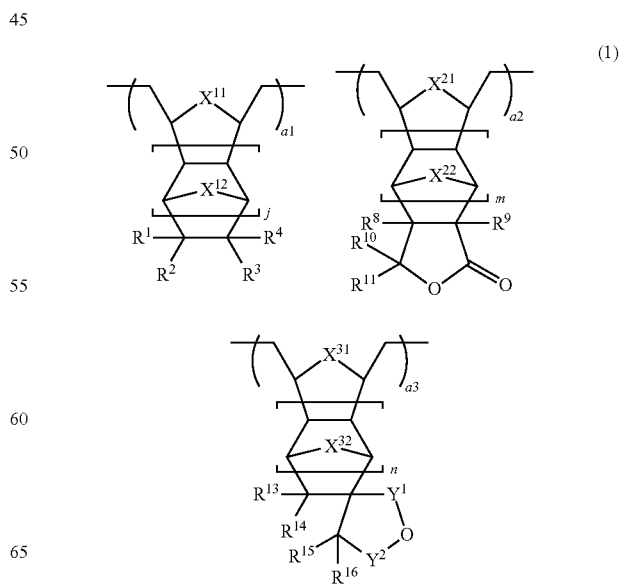

In case of a3=0, at least one of $X^{11}$, $X^{12}$, $X^{21}$, and $X^{22}$ in formula (1) is —O—, in case of a2=0, at least one of $X^{11}$, $X^{12}$, $X^{31}$, and $X^{32}$ is —O—, and in case of a2>0 and a3>0, at least one of $X^{11}$, $X^{12}$, $X^{21}$, $X^{22}$, $X^{31}$, and $X^{32}$ is —O—. The presence of oxygen in an alicyclic compound contained in the backbone is effective not only for improving the adhesion of a resist film to a processable substrate, typically silicon substrate and the solubility of the polymer in polar organic solvents such as ketones and alcohols as used in the step of applying the resist composition onto the substrate, but also for enhancing the dissolution contrast in organic solvent developer. The content of —O— is typically 1 to 99 mol %, preferably 5 to 95 mol %, more preferably 10 to 80 mol %, and most preferably 20 to 70 mol %, based on the total amount of $X^{11}$, $X^{12}$, $X^{21}$, $X^{22}$, $X^{31}$, and $X^{32}$.

In addition to the recurring units of formula (1), the hydrogenated ROMP polymer (A) in a preferred embodiment may further comprise recurring units of at least one type selected from recurring units having the general formulae (8), (10), (12), and (13).

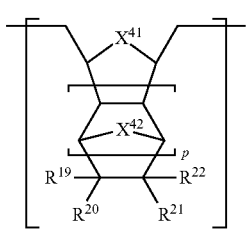

(8)

In formula (8), at least one of $R^{19}$ to $R^{22}$ is a carboxyl-containing functional group having the general formula (9):

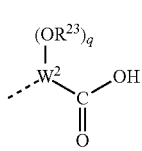

(9)

wherein the broken line denotes a valence bond, $R^{23}$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $W^2$ is a single bond or a (q+2)-valent $C_1$-$C_{10}$ hydrocarbon group, and q is 0 or 1. The remains of $R^{19}$ to $R^{22}$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl. $X^{41}$ and $X^{42}$ are each independently —O— or —$CR^{24}_2$— wherein $R^{24}$ is hydrogen or $C_1$-$C_{10}$ straight or branched alkyl. The subscript p is 0 or an integer of 1 to 3.

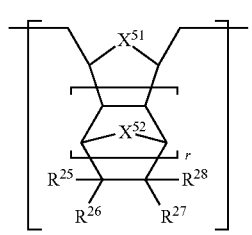

(10)

In formula (10), at least one of $R^{25}$ to $R^{22}$ is a carboxylate-containing functional group having the general formula (11):

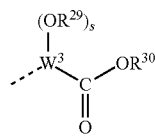

(11)

wherein the broken line denotes a valence bond, $R^{29}$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $R^{30}$ is $C_1$-$C_{10}$ straight or branched alkyl, $C_2$-$C_{10}$ straight, branched or cyclic alkoxyalkyl, or $C_1$-$C_{20}$ straight, branched or cyclic haloalkyl, $W^3$ is a single bond or a (s+2)-valent $C_1$-$C_{10}$ hydrocarbon group, and s is 0 or 1. The remains of $R^{25}$ to $R^{22}$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl. $X^{51}$ and $X^{52}$ are each independently —O— or —$CR^{31}_2$— wherein $R^{31}$ is hydrogen or $C_1$-$C_{10}$ straight or branched alkyl. The subscript r is 0 or an integer of 1 to 3.

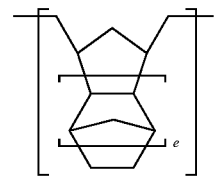

(12)

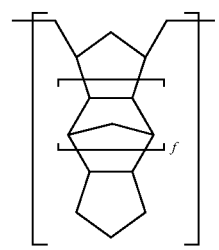

(13)

In formulae (12) and (13), e is 0 or an integer of 1 to 3, and f is 0 or an integer of 1 to 3.

Illustrative, non-limiting examples of the recurring unit having formula (8) are given below.

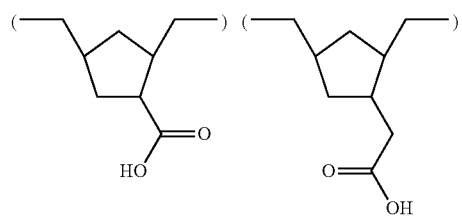

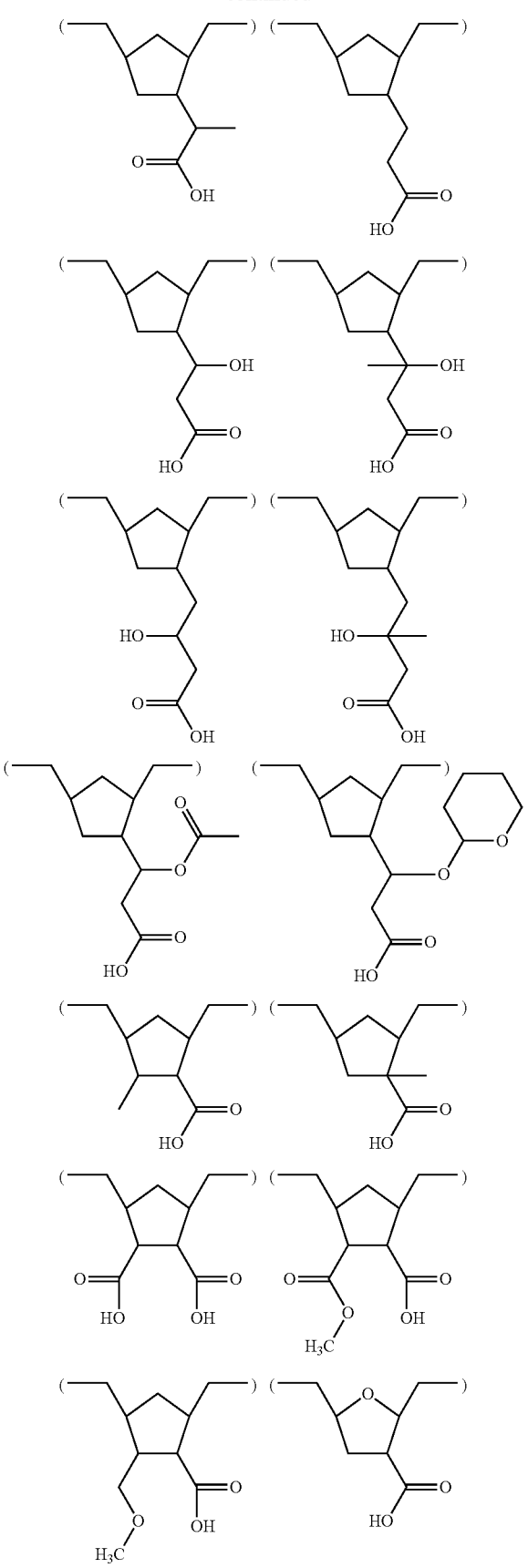
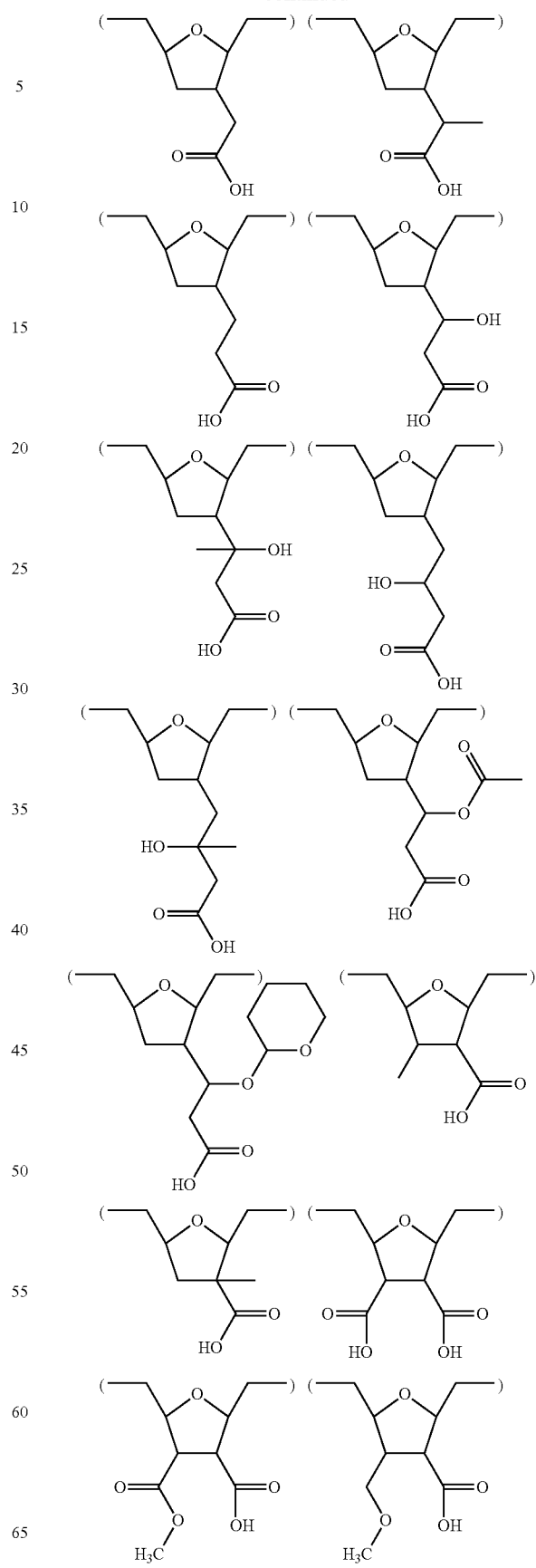

-continued
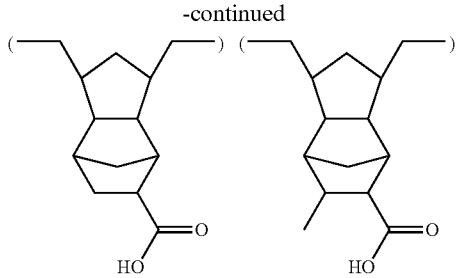
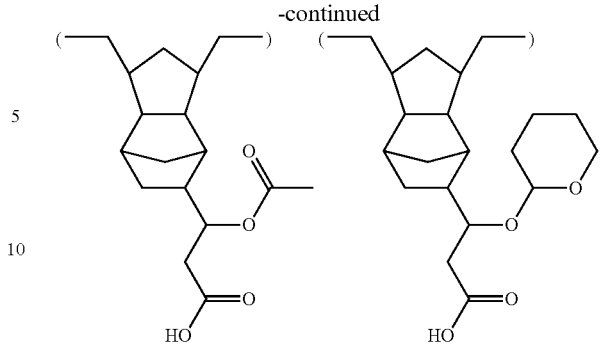
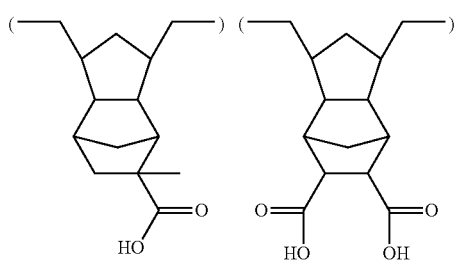
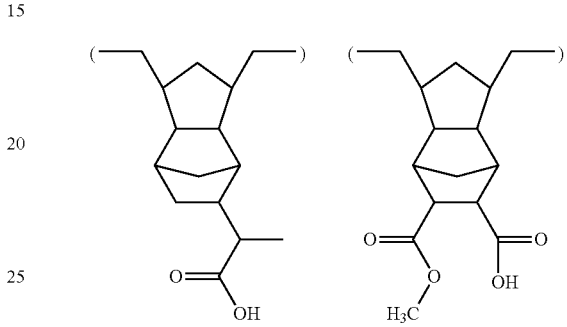
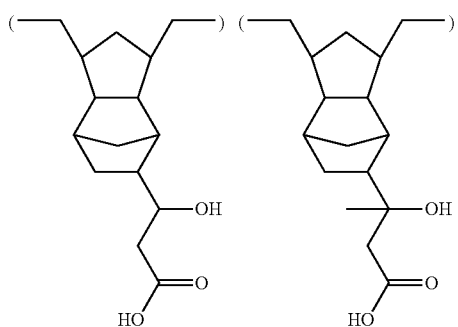
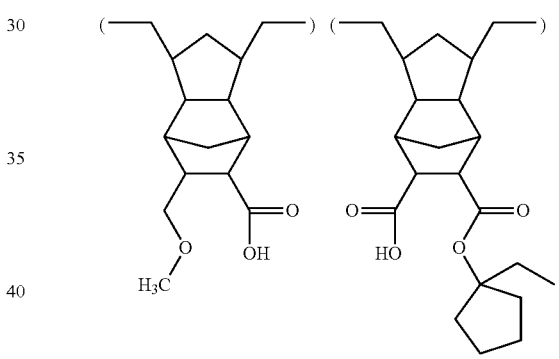
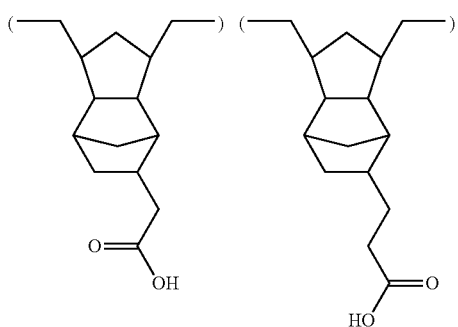
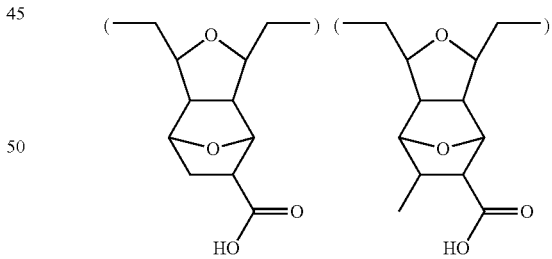
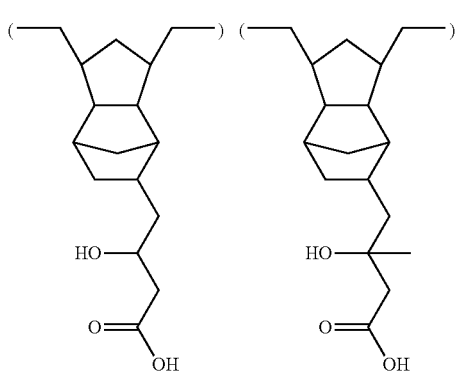
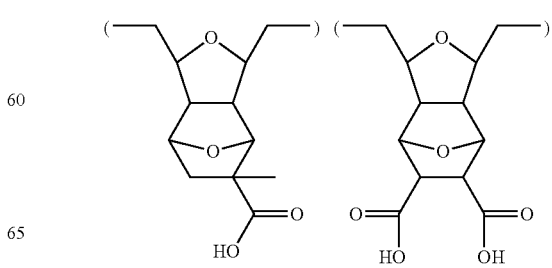

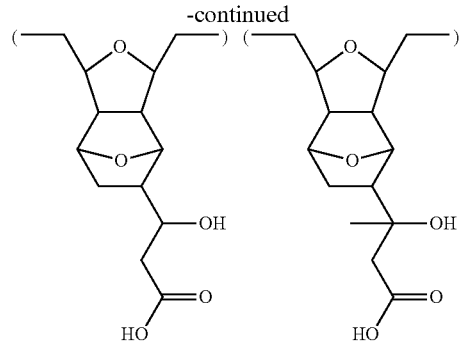
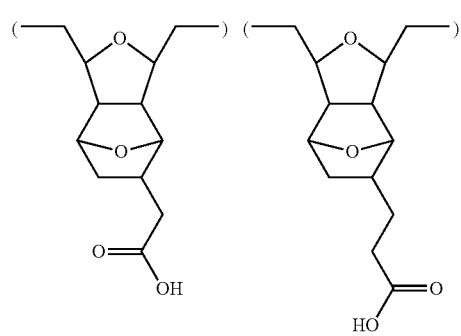
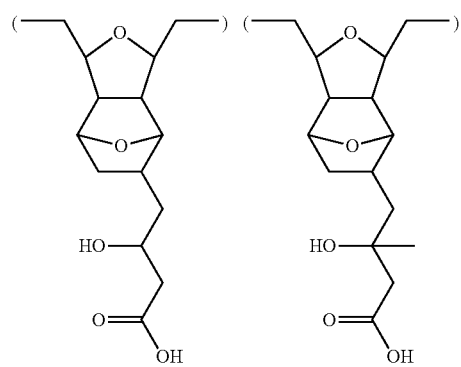
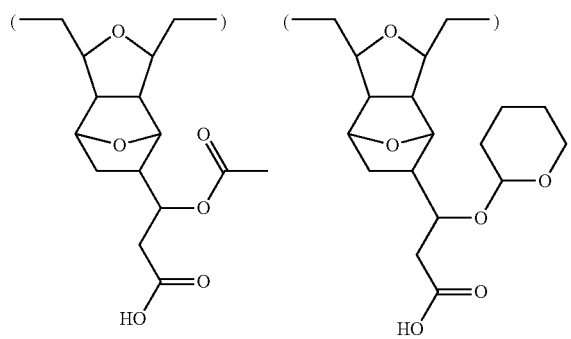
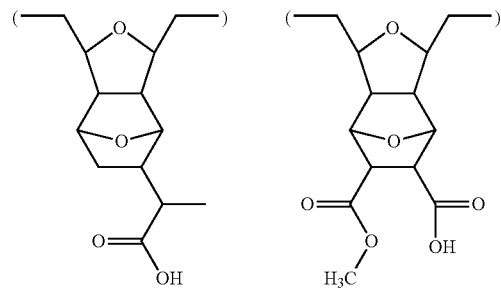
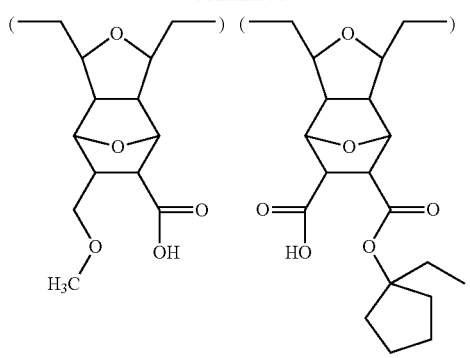
Illustrative, non-limiting examples of the recurring unit having formula (10) are given below.
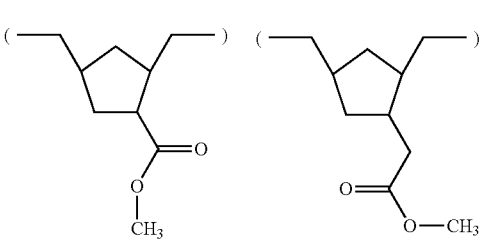
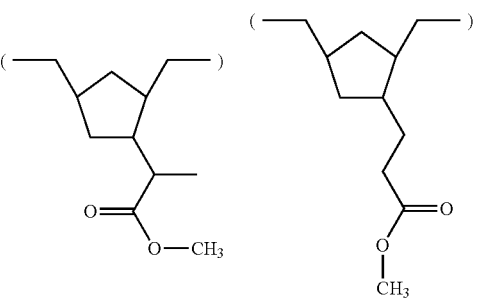
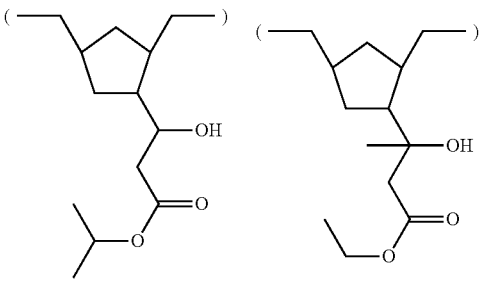
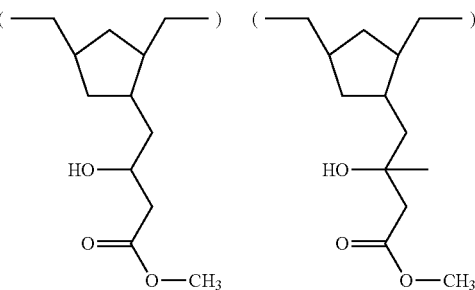

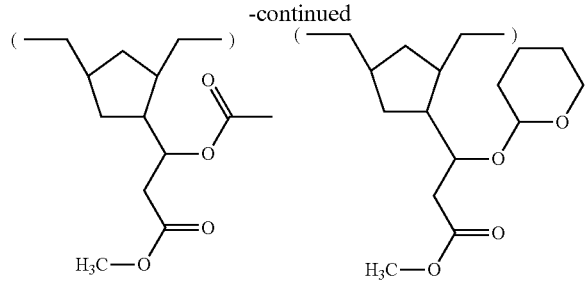
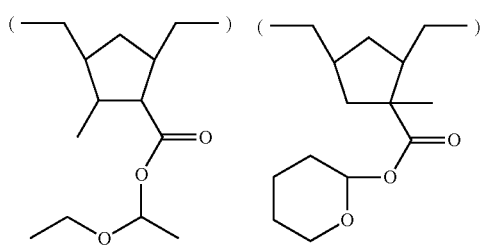
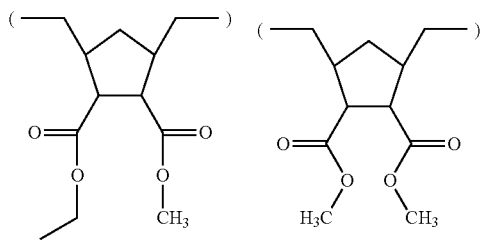
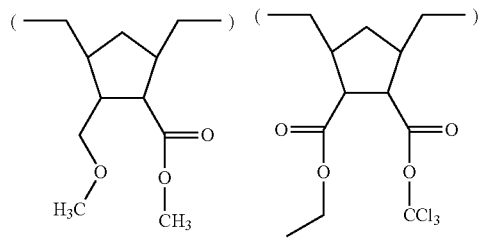
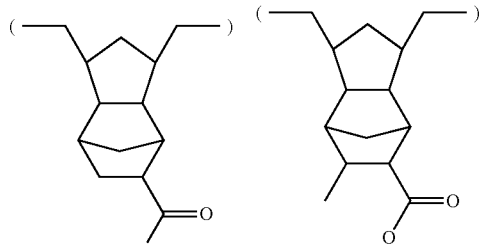
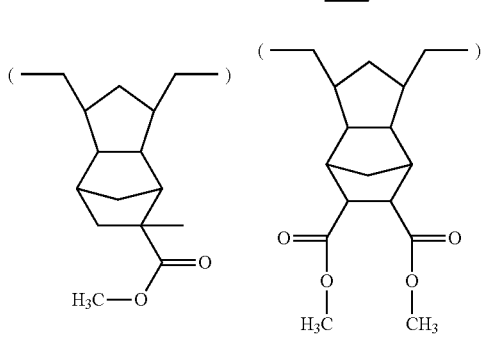
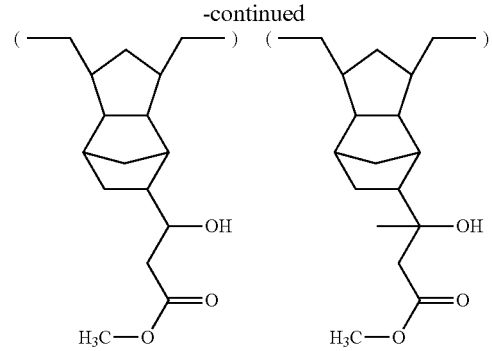
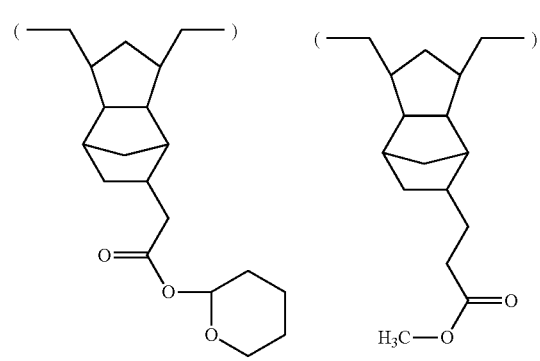
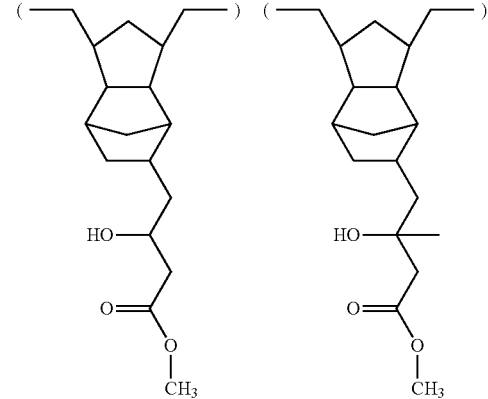
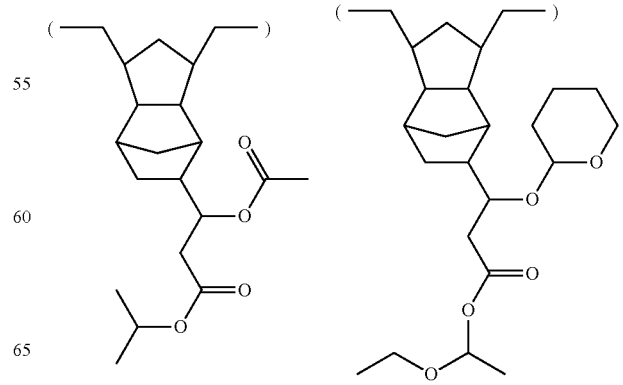

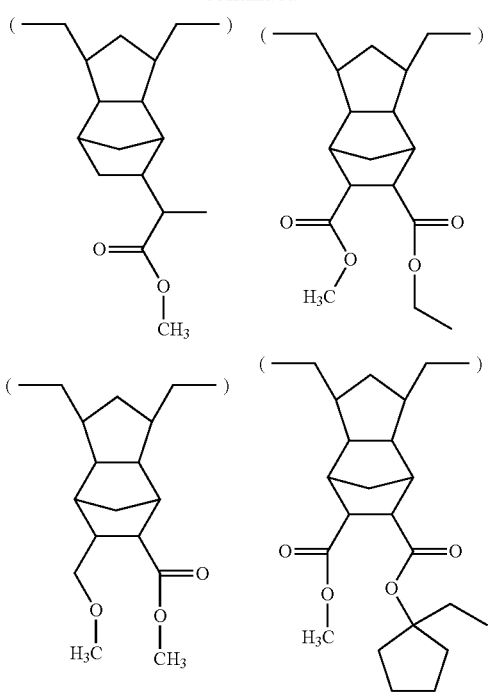

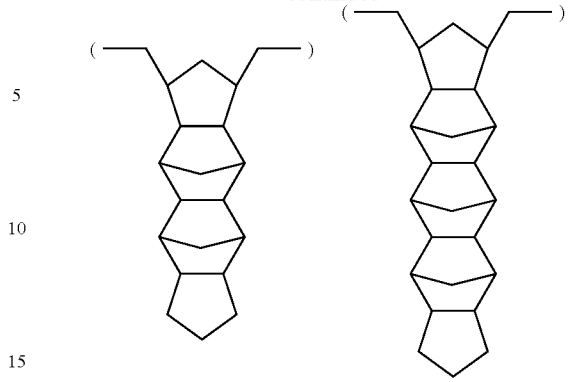

The recurring unit having formula (12) corresponds to any one of the following structures.

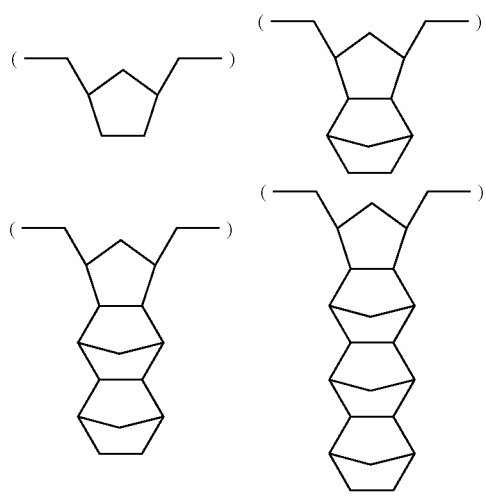

The recurring unit having formula (13) corresponds to any one of the following structures.

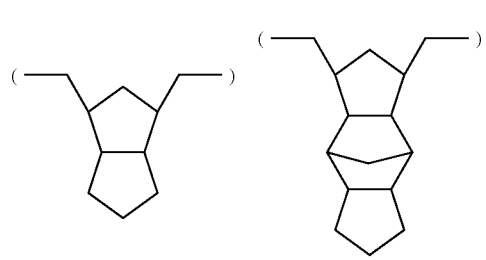

Provided that the sum of constitutional molar ratios of essential and additional recurring units in the hydrogenated ROMP polymer (A) is unity (1), a4 indicative of the sum of constitutional molar ratios of additional recurring units having formulae (8), (10), (12) and (13) preferably ranges from 0 to 0.3 ($0 \leq a4 \leq 0.3$). The additional recurring units are effective for modifying the dissolution rate in the developer and for enhancing the dissolution contrast when incorporated in an appropriate amount.

The hydrogenated ROMP polymer (A) used herein typically has a weight average molecular weight (Mw) in the range of 3,000 to 50,000, and preferably 4,000 to 20,000. Although the dispersity Mw/Mn (ratio of weight average molecular weight to number average molecular weight) of the polymer is not particularly limited, a narrow dispersity of 1.0 to 3.0 is preferred and effective for restraining acid diffusion and improving resolution. It is noted that Mw and Mn are measured by GPC versus polystyrene standards using tetrahydrofuran (THF) as solvent.

(Meth)acrylate Resin B

In addition to the hydrogenated ROMP polymer (A), the resist composition used in the pattern forming process comprises a (meth)acrylate resin (B) comprising recurring units having the general formula (3) as another base resin.

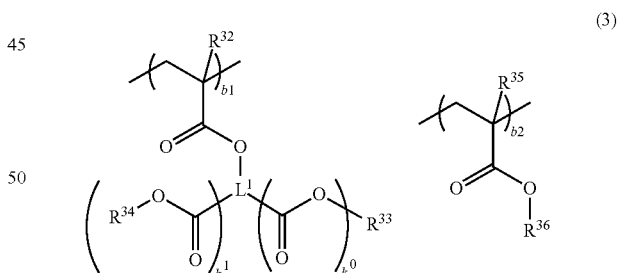

(3)

Herein $R^{32}$ and $R^{35}$ are each independently hydrogen or methyl, $R^{33}$ and $R^{34}$ each are an acid labile group, and $k^0$ is 0 or 1. In case of $k^0=0$, $k^1$ is 0 and $L^1$ is a single bond, and in case of $k^0=1$, $k^1$ is 0 or 1. In case of $k^1=0$, $L^1$ is a divalent $C_1$-$C_{12}$ straight, branched or cyclic hydrocarbon group which may contain a heteroatom. In case of $k^1=1$, $L^1$ is a trivalent $C_1$-$C_{12}$ straight, branched or cyclic hydrocarbon group which may contain a heteroatom. $R^{36}$ is a monovalent $C_4$-$C_{15}$ cyclic hydrocarbon group having at least one partial structure selected from among ether, ketone, ester, carbonate, and sulfonic acid ester. Each of the recurring units in formula (3) may be of one or more types, b1 and b2 indicative of a constitutional molar ratio of the respective recurring units to the total are in the range: 0<b1<1, 0<b2<1, and 0.5<(b1+b2)≤1, provided that the sum of constitutional molar ratios of recurring units in the (meth)acrylate resin (B) is unity (1).

In formula (3), the first recurring unit is represented by the formula (3-1).

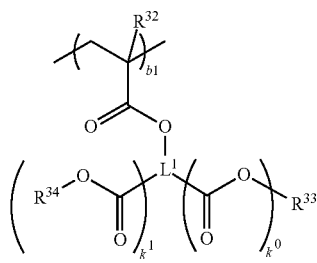
(3-1)

Herein $R^{33}$ and $R^{34}$ each are an acid labile group. Like the acid labile group $R^6$ in the hydrogenated ROMP polymer (A), the acid labile group $R^{33}$ or $R^{34}$ is not particularly limited as long as it is deprotected under the action of acid to generate a carboxylic acid. Like $R^6$, an acid labile group having the general formula (5), (6) or (7) is preferred because of adequate reactivity.

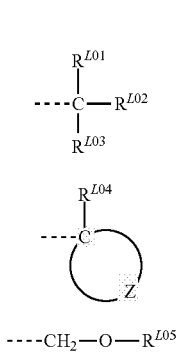

(5)

(6)

(7)

Herein the broken line denotes a valence bond, $R^{L01}$ to $R^{L03}$ are each independently $C_1$-$C_{12}$ straight, branched or cyclic alkyl, $R^{L04}$ is $C_1$-$C_{10}$ straight, branched or cyclic alkyl, Z is a divalent $C_2$-$C_{15}$ hydrocarbon group to form a monocyclic or bridged ring with the carbon atom to which it is attached, and $R^{L05}$ is $C_1$-$C_{20}$ straight, branched or cyclic alkyl.

Examples of the groups of formulae (5) (6) and (7) are as enumerated above for $R^6$.

Illustrative, non-limiting examples of the recurring unit having formula (3-1) are given below.

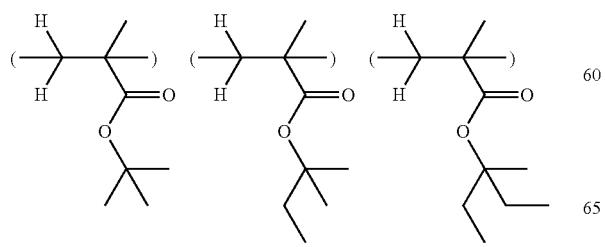

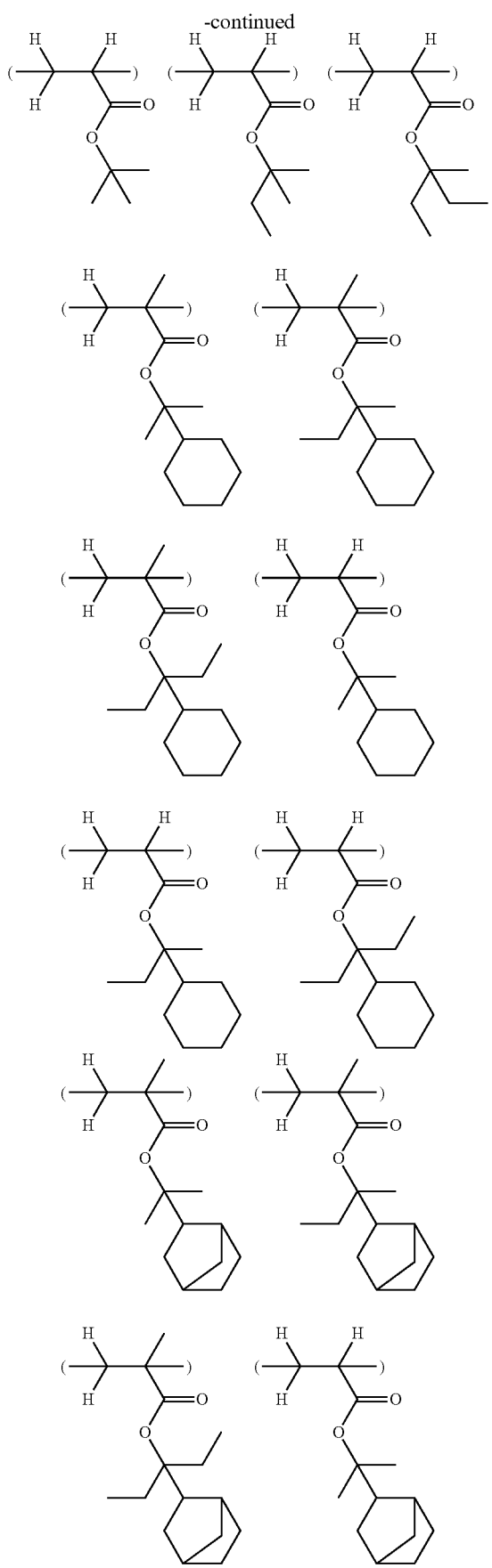

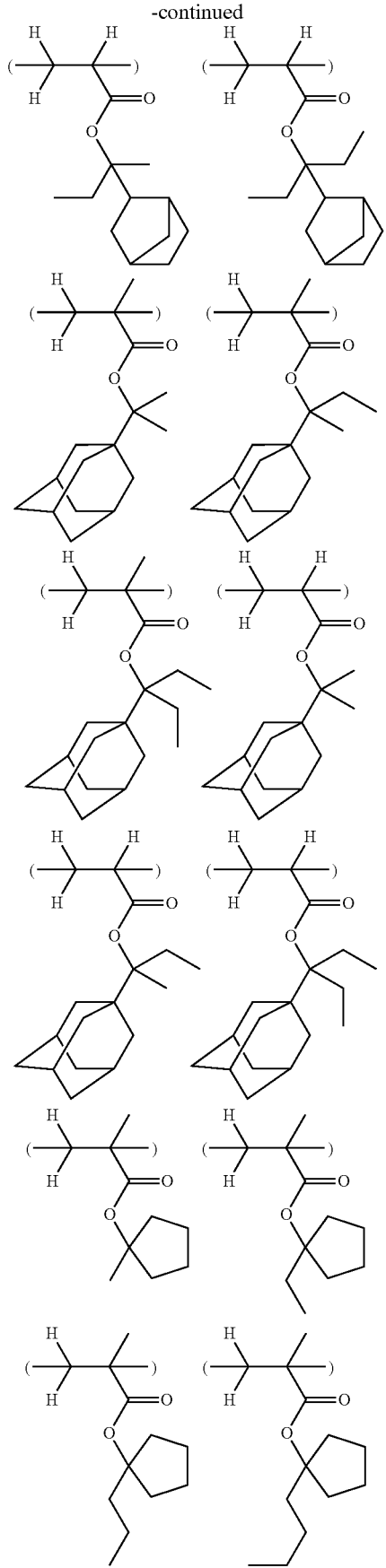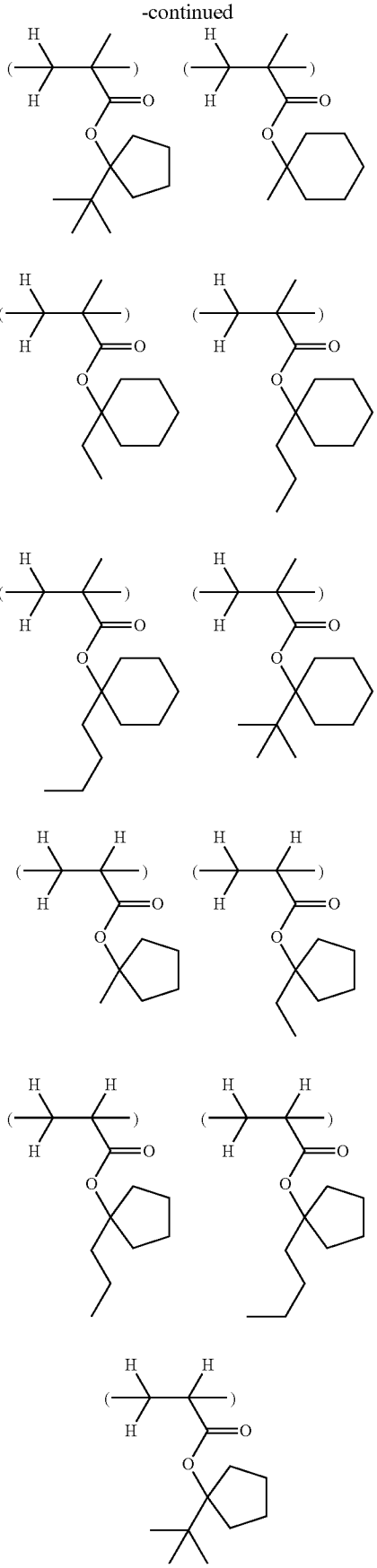

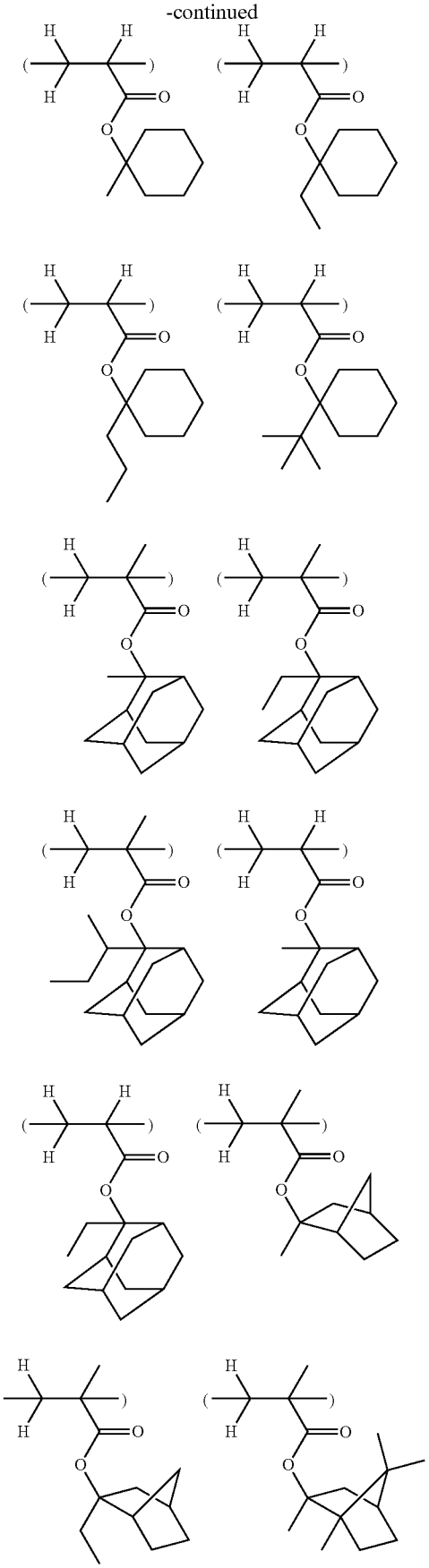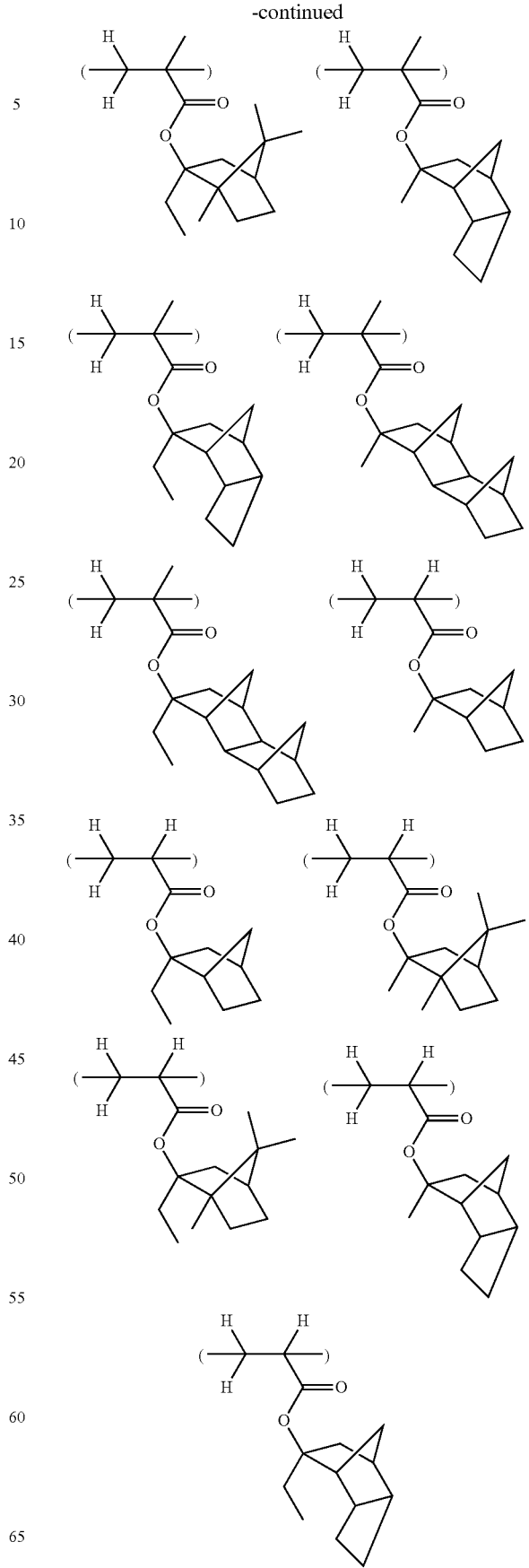

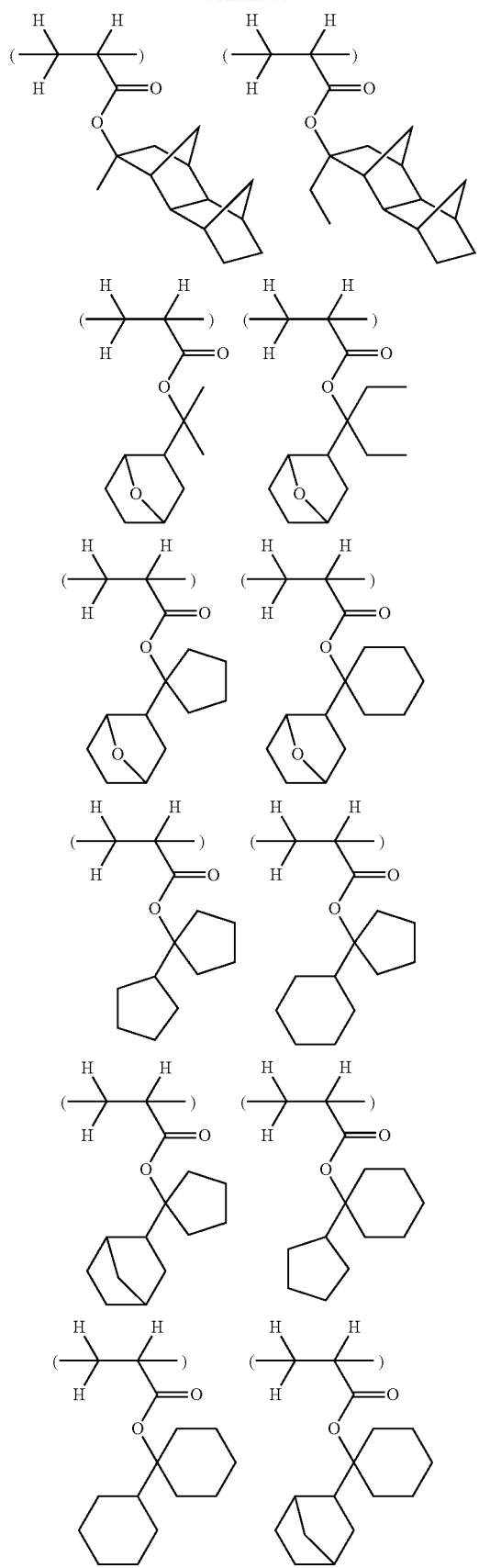
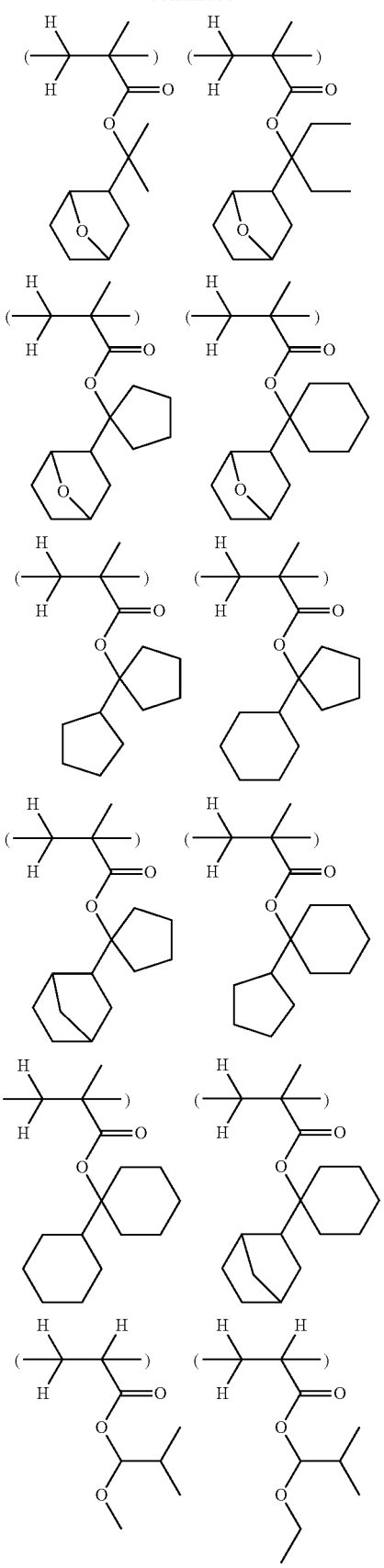

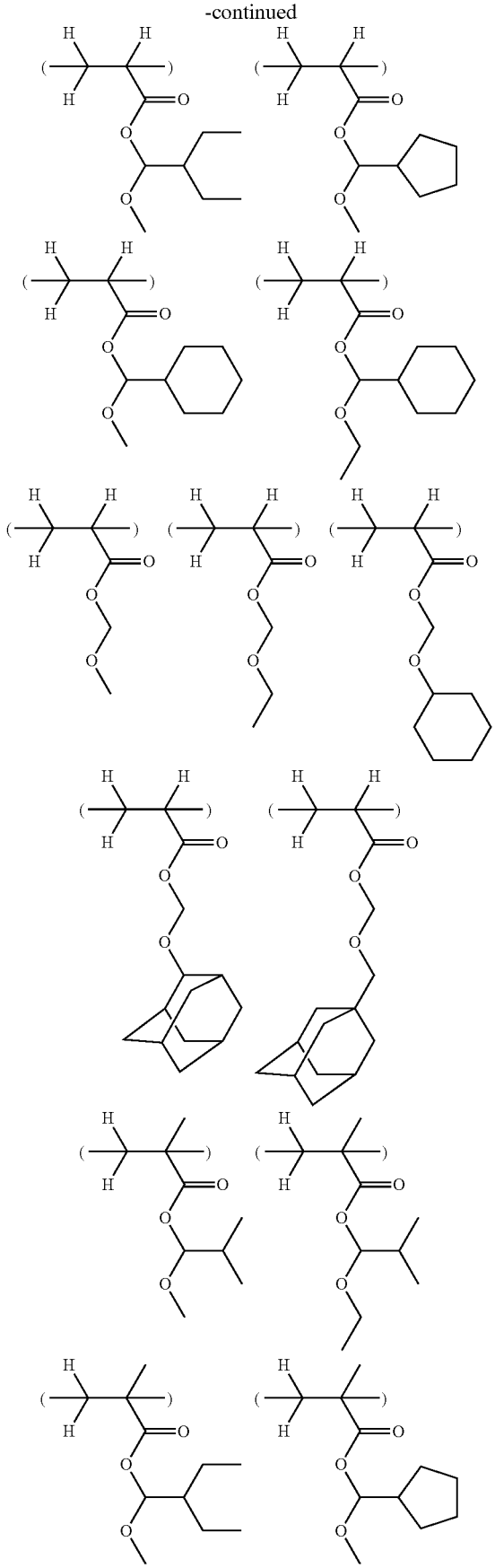
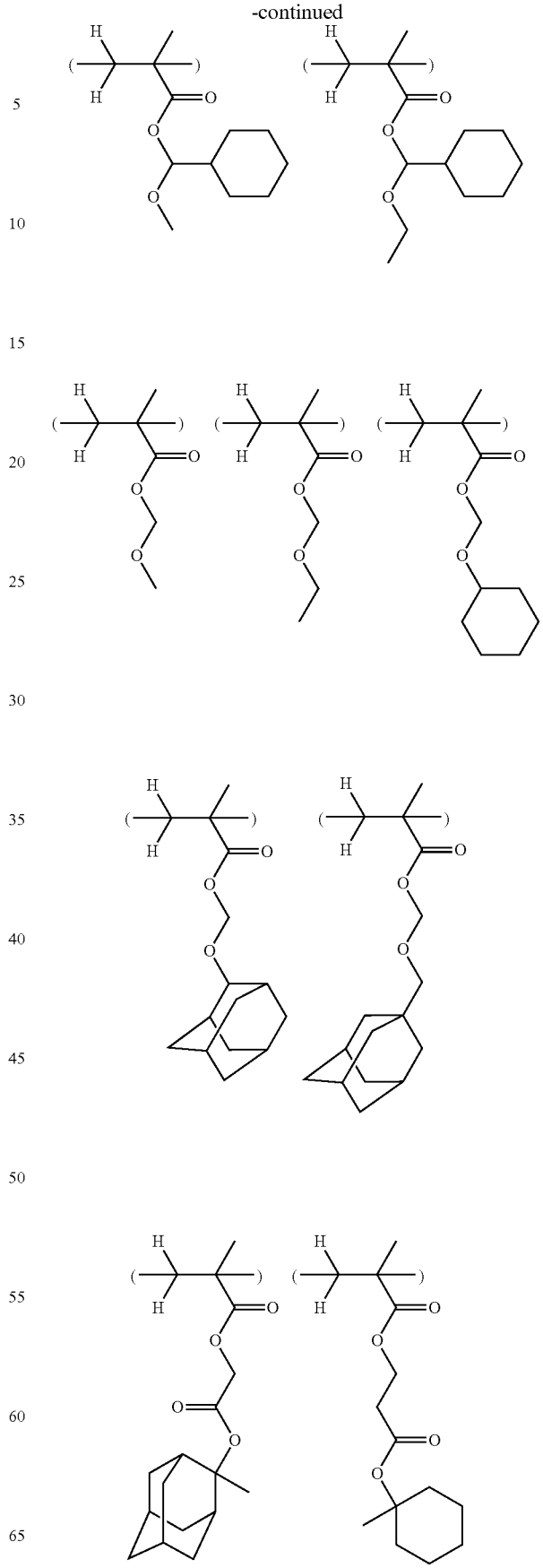

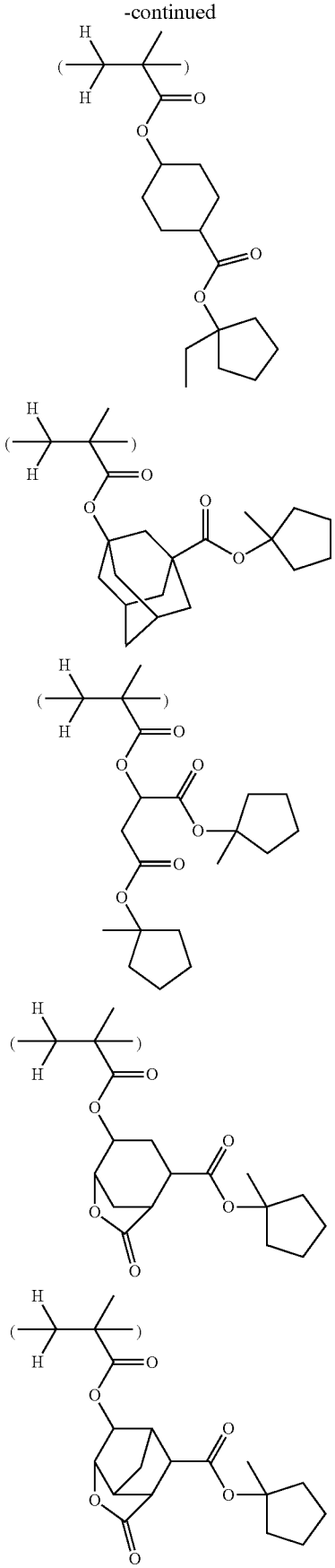
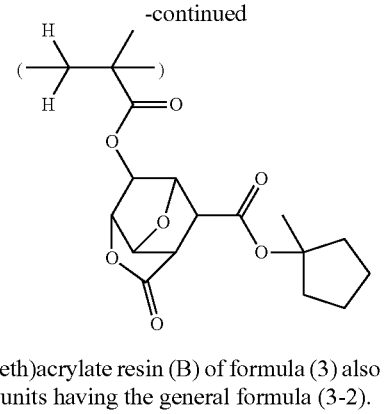

The (meth)acrylate resin (B) of formula (3) also comprises recurring units having the general formula (3-2).

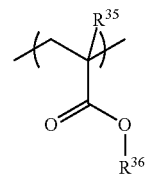

(3-2)

Herein $R^{36}$ is a monovalent $C_4$-$C_{15}$ cyclic hydrocarbon group having at least one partial structure selected from among ether, ketone, ester, carbonate, and sulfonic acid ester. A polar functional group such as ether, ketone, ester, carbonate, and sulfonic acid ester is effective for improving adhesion to the substrate and controlling acid diffusion.

Illustrative, non-limiting examples of the recurring unit having formula (3-2) are given below.

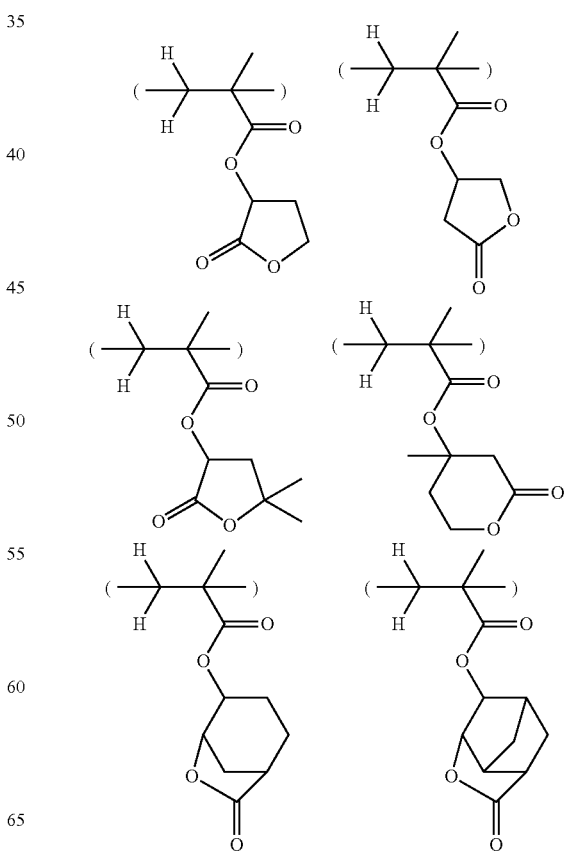

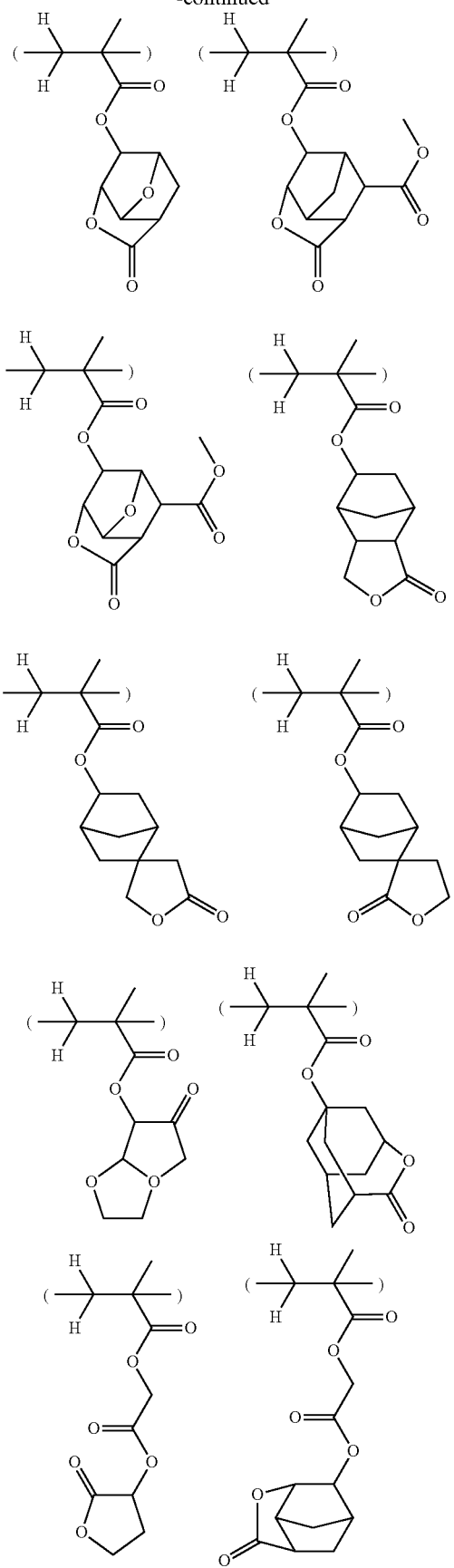
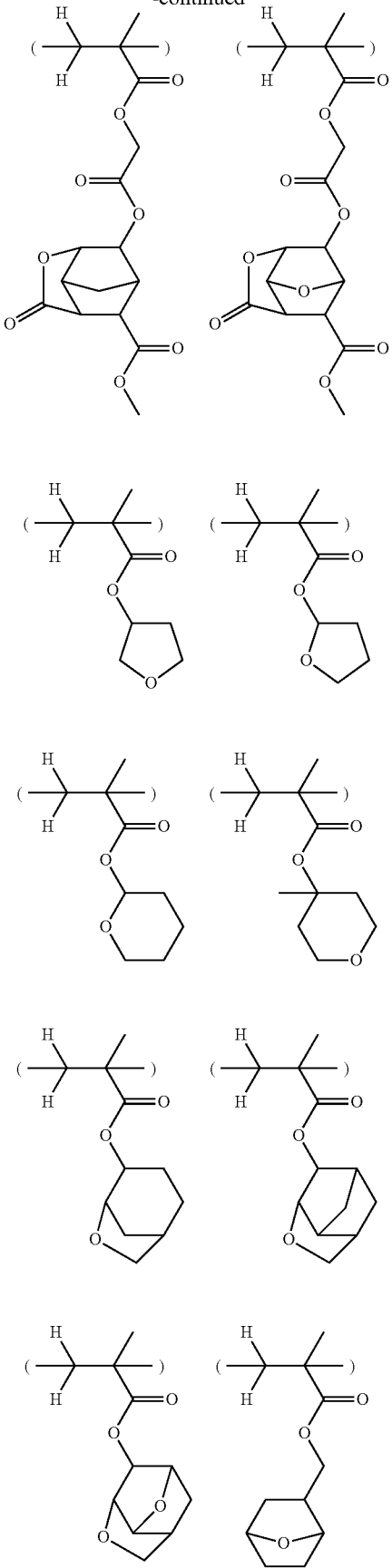

-continued
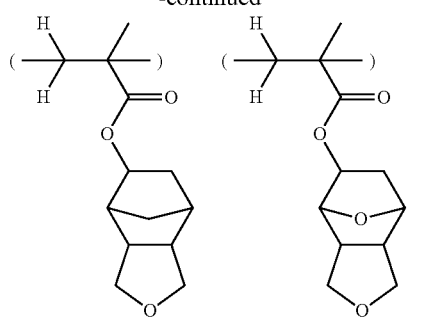
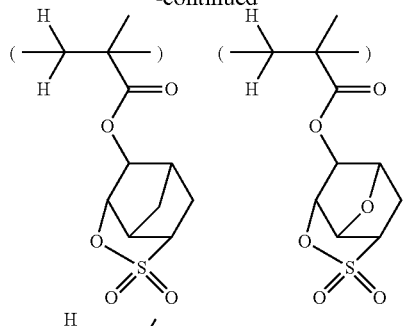
In addition to the recurring units having formula (3), the (meth)acrylate resin (B) in a preferred embodiment further comprises recurring units of at least one type having the general formula (14).

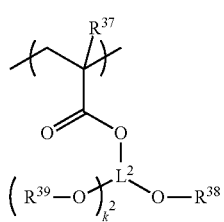

(14)

Herein $R^{37}$ is hydrogen or methyl, and $k^2$ is 0 or 1. In case of $k^2=0$, $L^2$ is a divalent $C_2$-$C_{15}$ straight, branched or cyclic hydrocarbon group which may contain a heteroatom or fluorine. In case of $k^2=1$, $L^2$ is a trivalent $C_3$-$C_{16}$ straight, branched or cyclic hydrocarbon group which may contain a heteroatom or fluorine. $R^{38}$ and $R^{39}$ are each independently hydrogen, or $C_1$-$C_{12}$ straight, branched or cyclic alkyl, alkoxyalkyl or acyl.

Illustrative, non-limiting examples of the recurring unit having formula (14) are given below.

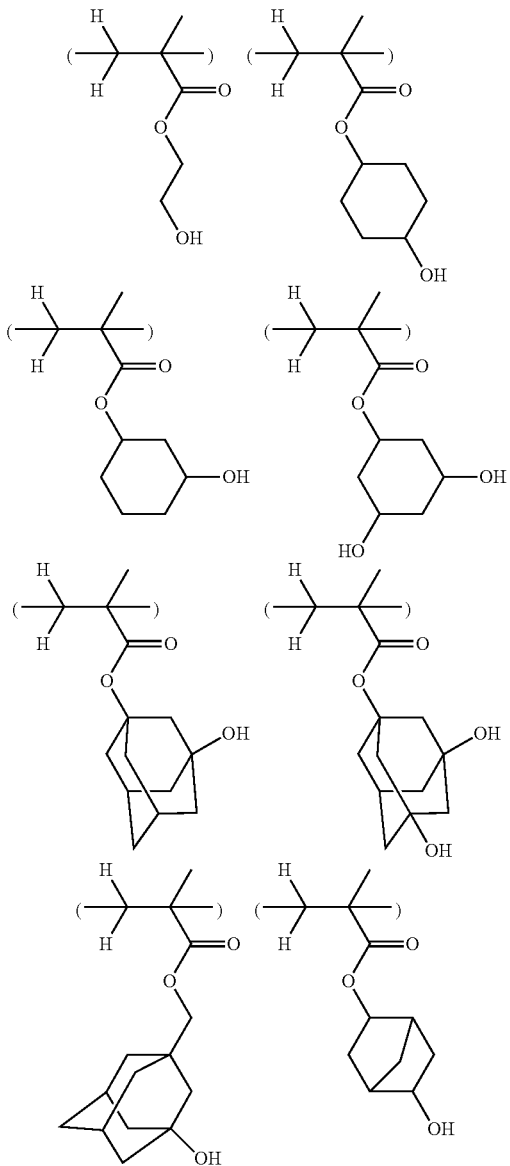

-continued

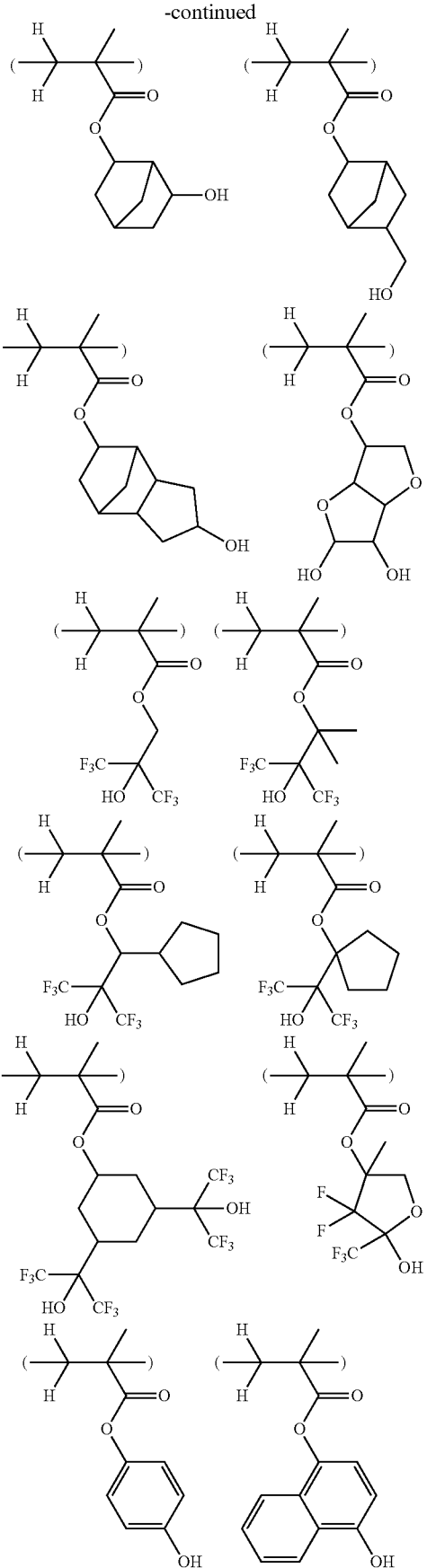

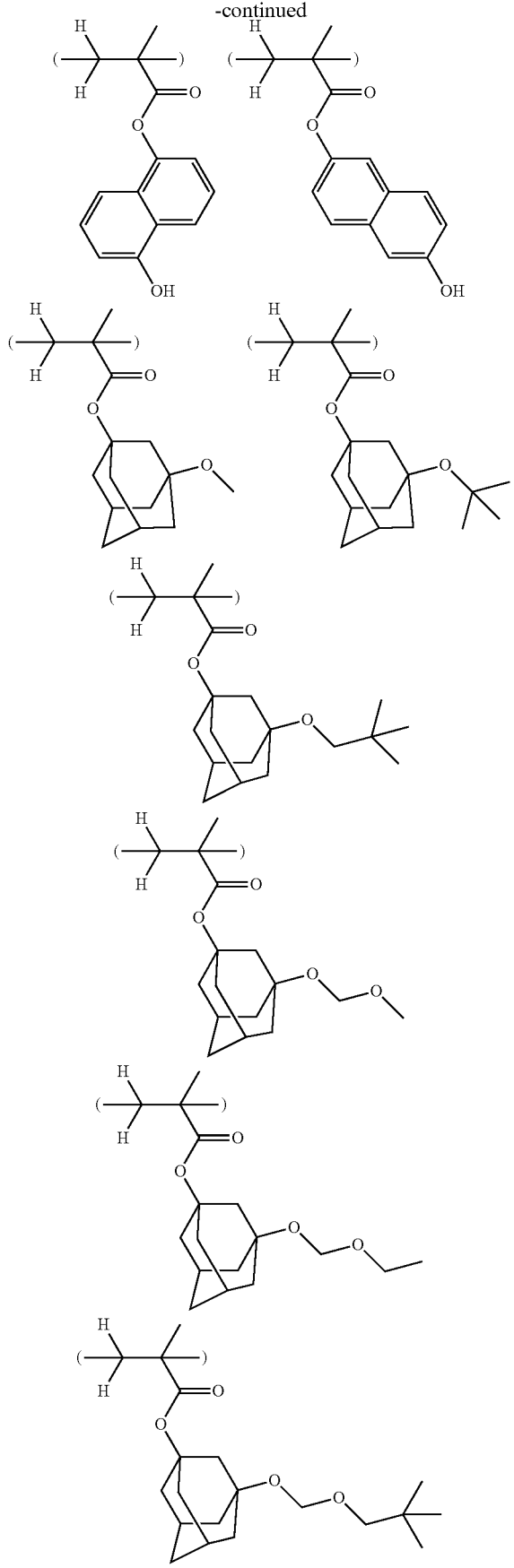
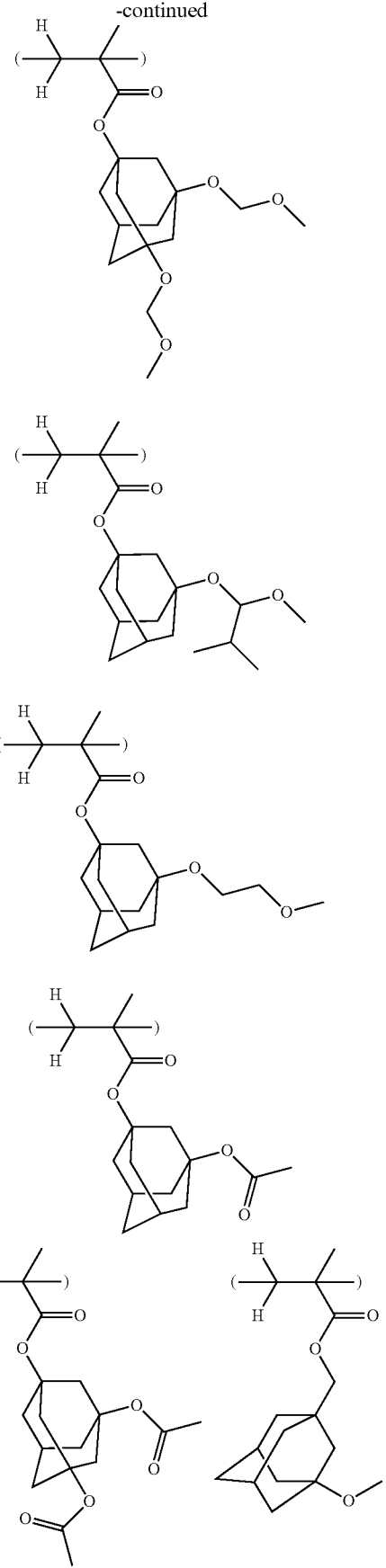

77
-continued
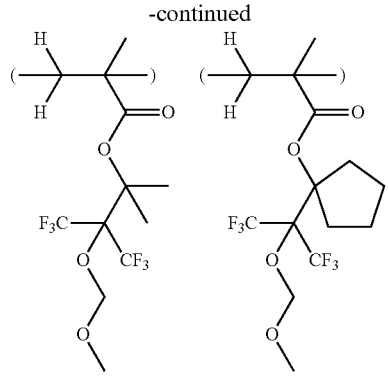
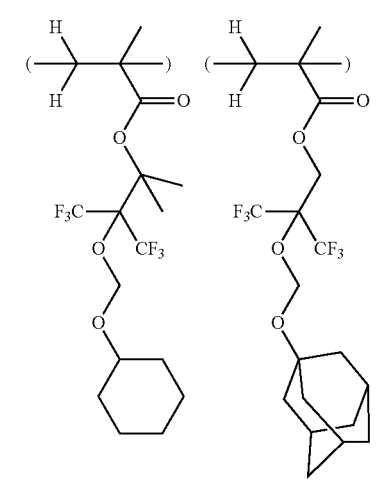
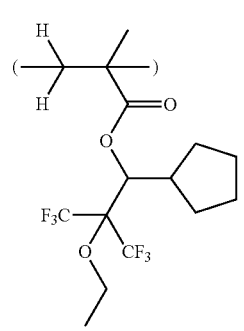
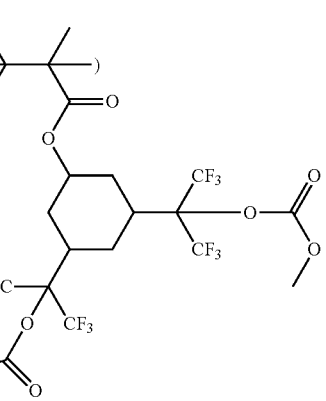
78
-continued
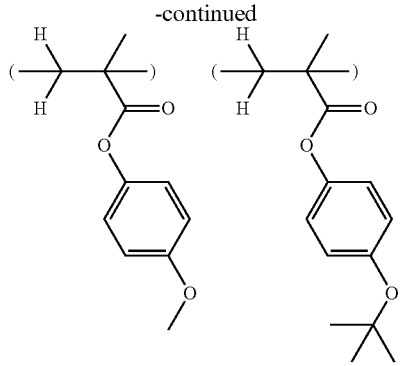
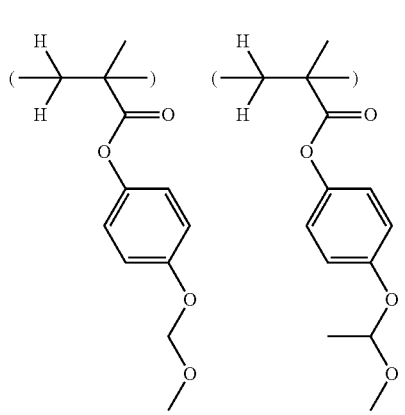
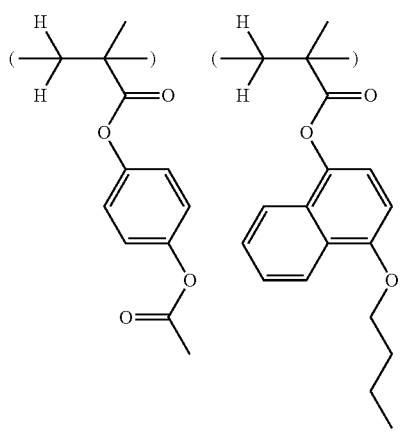
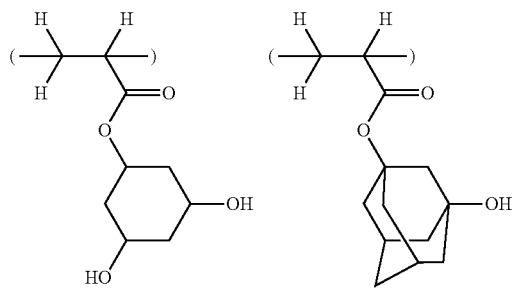

-continued

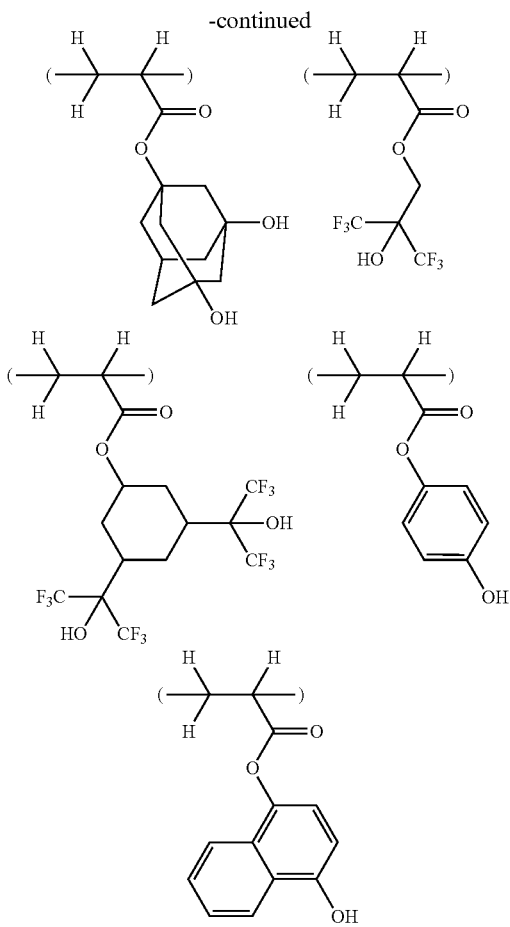

Provided that the sum of constitutional molar ratios of essential and additional recurring units in the (meth)acrylate resin (B) is unity (1), b3 indicative of a constitutional molar ratio of additional recurring units having formula (14) is preferably in the range: 0≤b3≤0.4, more preferably 0<b3≤0.4. Since these additional recurring units includes a partial structure having a hydroxyl group optionally protected with alkyl, alkoxyalkyl or acyl, they are selected, depending on the identity of developer, so as to be effective for modifying the solubility of the resin and for enhancing the dissolution contrast.

The (meth)acrylate resin (B) used herein typically has a weight average molecular weight (Mw) in the range of 2,000 to 50,000, and preferably 4,000 to 20,000. Although the dispersity (Mw/Mn) of the resin is not particularly limited, a narrow dispersity of 1.0 to 3.0 is preferred and effective for restraining acid diffusion and improving resolution. It is noted that Mw and Mn are measured by GPC versus polystyrene standards using THF solvent.

As described above, the resist composition used in the pattern forming process contains both the hydrogenated ROMP polymer (A) and the (meth)acrylate resin (B) as the base resin. A blend of these heterogeneous resins enables to form a pattern via organic solvent negative development that meets both etch resistance and CD uniformity. It is believed that etch resistance is attributable to the alicyclic structure in the backbone of the hydrogenated ROMP polymer (A) while mask size fidelity and CD uniformity in an exposure shot are attributable to the low acid diffusion of the (meth)acrylate resin (B). A blend of these two resins allows the resins to exert their own advantages without any offset, and improves edge roughness over the separate use of the individual resins as the base resin.

While the resist composition contains both the hydrogenated ROMP polymer (A) and the (meth)acrylate resin (B), each of the ROMP polymer (A) and the (meth)acrylate resin (B) may be a mixture of plural polymers or resins which differ in composition and/or molecular weight (within the scope of the invention). Provided that Aw is a total weight of hydrogenated ROMP polymers (A) and Bw is a total weight of (meth)acrylate resins (B), they are preferably blended in a weight ratio Aw/Bw=10/90 to 90/10, more preferably 30/70 to 70/30.

In addition to the base resin, the resist composition used herein comprises a compound capable of generating an acid in response to high-energy radiation, that is, photoacid generator (PAG) and an organic solvent. In a preferred embodiment, the resist composition further comprises a quencher, surfactant, and optionally, other components such as a dissolution regulator and acetylene alcohol.

An amount of the PAG used is preferably 0.5 to 30 parts, more preferably 1 to 20 parts by weight per 100 parts by weight of the base resin. The PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary PAGs are described in U.S. Pat. No. 7,537,880 (JP-A 2008-111103, paragraphs [0123] to [0138]).

An amount of the organic solvent used is preferably 100 to 10,000 parts, more preferably 300 to 8,000 parts by weight per 100 parts by weight of the base resin. Examples of the organic solvent include ketones such as cyclohexanone and methyl-2-n-amyl ketone; alcohols such as 3-methoxybutanol, 3-methyl-3-methoxybutanol, 1-methoxy-2-propanol, 1-ethoxy-2-propanol, diethylene glycol, propylene glycol, glycerol, 1,4-butanediol, and 1,3-butanediol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof, as described in JP-A 2008-111103, paragraph [0144].

The quencher is a component having a function of trapping and deactivating the acid generated by the acid generator. As is known in the art, the quencher is effective, when added in an appropriate amount, for adjusting sensitivity, improving dissolution contrast, and improving resolution by restraining acid diffusion into the unexposed region.

Typical quenchers are basic compounds. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0148] to [0163], and nitrogen-containing organic compounds having a carbamate group, as described in JP 3790649. When added, an amount of the nitrogen-containing compound used is preferably 0.01 to 10 parts, more preferably 0.1 to 5 parts by weight per 100 parts by weight of the base resin.

An onium salt compound having an anion combined with weak acid as conjugate acid may be used as the quencher. The quenching mechanism is based on the phenomenon that a strong acid generated by the acid generator is converted into an onium salt through salt exchange reaction. With an weak acid resulting from salt exchange, deprotection reaction of the acid labile group in the base resin does not take place, and so the weak acid onium salt compound in this system functions as a quencher. Onium salt quenchers include onium salts such as sulfonium salts, iodonium salts and ammonium salts of sulfonic acids which are not fluorinated at α-position as described in US 2008153030 (JP-A 2008-158339), and similar onium salts of carboxylic acid. These onium salts can function as the quencher when they are combined with acid generators capable of generating an α-position fluorinated sulfonic acid, imide acid or methide acid. When onium salt quenchers are photo-decomposable like sulfonium salts and iodonium salts, their quench capability is reduced in a high light intensity portion, whereby dissolution contrast is improved. When a negative pattern is formed by organic solvent development, the pattern is thus improved in rectangularity. When added, an amount of the onium salt compound used is preferably 0.05 to 20 parts, more preferably 0.2 to 10 parts by weight per 100 parts by weight of the base resin.

The quenchers including the nitrogen-containing organic compounds and onium salt compounds mentioned above may be used alone or in admixture of two or more.

Suitable surfactants are described in JP-A 2008-111103, paragraph [0166]. Suitable dissolution regulators are described in JP-A 2008-122932, paragraphs [0155] to [0178]. Suitable acetylene alcohols are described in JP-A 2008-122932, paragraphs [0179] to [0182]. When added, the surfactant may be used in any desired amount as long as the objects of the invention are not impaired.

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as developer. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during PEB and avoiding any hole pattern opening failure after development. When added, an appropriate amount of the water repellency improver is 0.1 to 20 parts, preferably 0.5 to 10 parts by weight per 100 parts by weight of the base resin.

Process

Now referring to the drawings, the pattern forming process of the invention is illustrated in FIG. 1. First, the resist composition is coated on a substrate to form a resist film thereon. Specifically, a resist film 40 of the resist composition is formed on a processable layer 20 disposed on a substrate 10 directly or via an intermediate intervening layer 30 as shown in FIG. 1A. The resist film preferably has a thickness of 10 to 1,000 nm and more preferably 20 to 500 nm. After coating and prior to exposure, the resist coating is heated (or post-applied bake, PAB). The preferred PAB conditions include a temperature of 60 to 180° C., especially 70 to 150° C. and a time of 10 to 300 seconds, especially 15 to 200 seconds.

The substrate 10 used herein is generally a silicon substrate. The processable layer (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Figure 1B:
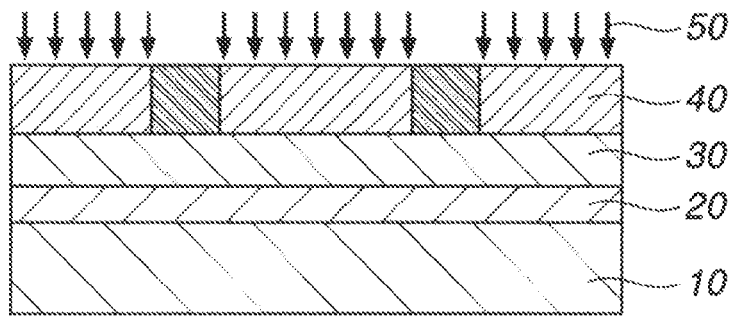
FIG. 1B shows the resist film being exposed.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the baked (PAB) resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after PAB for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. While the protective film must dissolve in an organic solvent-based developer, the polymer comprising recurring units having a 1,1,1,3,3,3-hexafluoro-2-propanol residue dissolves in the organic solvent-based developer. In particular, protective films formed from the compositions based on a polymer having 1,1,1,3,3,3-hexafluoro-2-propanol residues as described in JP-A 2007-025634 and JP-A 2008-003569 readily dissolve in the organic solvent-based developer.

In the protective film-forming composition, an amine compound or amine salt may be added, or a polymer comprising recurring units having a 1,1,1,3,3,3-hexafluoro-2-propanol residue and recurring units containing an amino group or amine salt, copolymerized together, may be used as the base resin. This component is effective for controlling diffusion of the acid generated in the exposed region of the resist film to the unexposed region for thereby preventing any hole opening failure. A useful protective film-forming composition having an amine compound added thereto is described in JP-A 2008-003569. A useful protective film-forming composition containing a polymer having an amino group or amine salt copolymerized therein is described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the resist film, deionized water rinsing (or post-soaking) may be carried out for extracting the acid generator and other components from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation.

The protective film is preferably formed from a composition comprising a polymer bearing a 1,1,1,3,3,3-hexafluoro-2-propanol residue and an amino group or amine salt-containing compound, or a composition comprising a polymer comprising recurring units having a 1,1,1,3,3,3-hexafluoro-2-propanol residue and recurring units having an amino group or amine salt copolymerized, the composition further comprising an alcohol solvent of at least 4 carbon atoms, an ether solvent of 8 to 12 carbon atoms, or a mixture thereof.

Suitable alcohols of 4 or more carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Figure 1C:
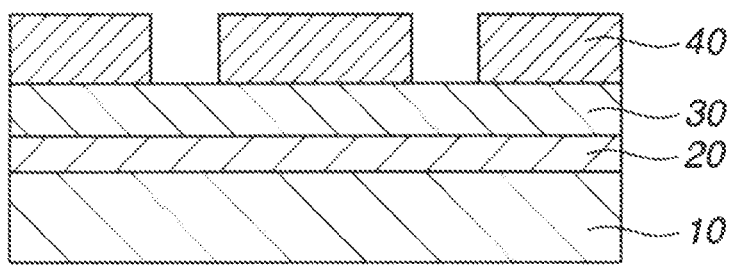
FIG. 1C shows the resist film being developed with an organic solvent.

Thereafter the exposed resist film is developed with a developer containing an organic solvent for 0.1 to 3 minutes, preferably 0.5 to 2 minutes by any conventional techniques such as dip, puddle and spray techniques. In this way, the unexposed region of resist film is dissolved away, leaving a negative resist pattern 40 on the substrate 10 as shown in FIG. 1C.

The organic solvent used as the developer is preferably selected from among ketones such as 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, and 4'-methylacetophenone; and esters such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

The total amount of the organic solvent(s) is preferably at least 60% by weight, more preferably 80 to 100% by weight based on the total amount of the developer. The developer may contain another organic solvent, examples of which include alkanes such as octane, decane, and dodecane, and alcohols such as isopropyl alcohol, 1-butanol, 1-pentanol, 1-hexanol, and 4-methyl-2-pentanol. The developer may further contain a surfactant, which is as exemplified for the surfactant which is optionally added to the resist composition.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

The method of forming a hole pattern by negative tone development is typically classified in terms of mask design into the following three methods:

(i) performing exposure through a mask having a dotted light-shielding pattern so that a pattern of holes may be formed at the dots after negative tone development, (ii) performing exposure through a mask having a lattice-like light-shielding pattern so that a pattern of holes may be formed at the intersections of gratings after negative tone development, and (iii) performing two exposures using a mask having a lined light-shielding pattern, changing the direction of lines during second exposure from the direction of lines during first exposure so that the lines of the second exposure may intersect with the lines of the first exposure, whereby a pattern of holes is formed at the intersections of lines after negative tone development.

Figure 7:
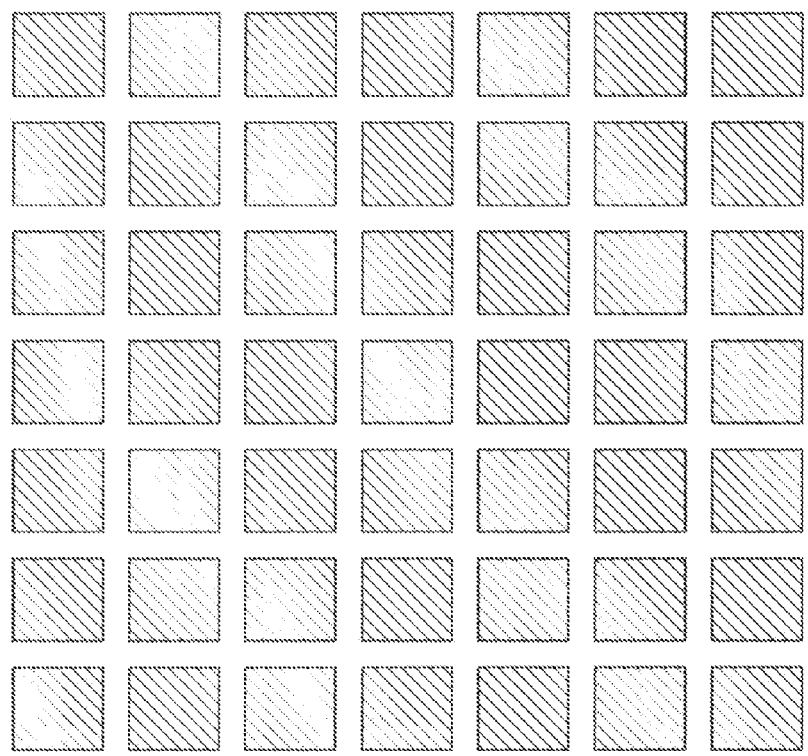
FIG. 7 illustrates a mask bearing a dot pattern of square dots having a pitch of 90 nm and a side width of 60 nm.
Figure 17:
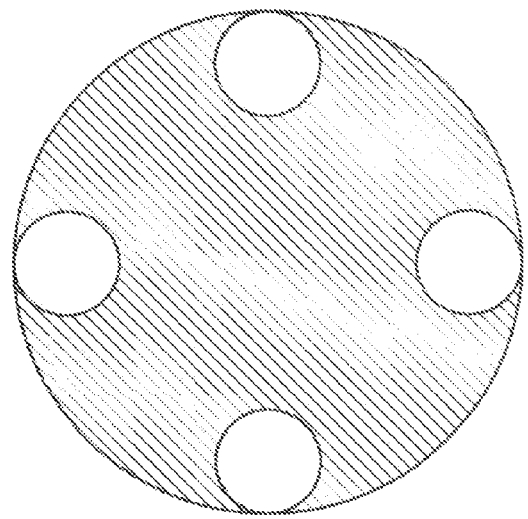
FIG. 17 illustrates an aperture configuration in an exposure tool of cross-pole illumination for enhancing the contrast of both X and Y-direction lines.

Method (i) uses a mask having a dotted light-shielding pattern as shown in FIG. 7. Although the illumination for exposure used in this method is not particularly limited, a cross-pole illumination or quadra-pole illumination with the aperture configuration shown in FIG. 17 is preferred for the purpose of reducing the pitch. The contrast may be improved by combining the cross-pole illumination with X-Y polarized illumination or azimuthally polarized illumination of circular polarization.

Figure 5:
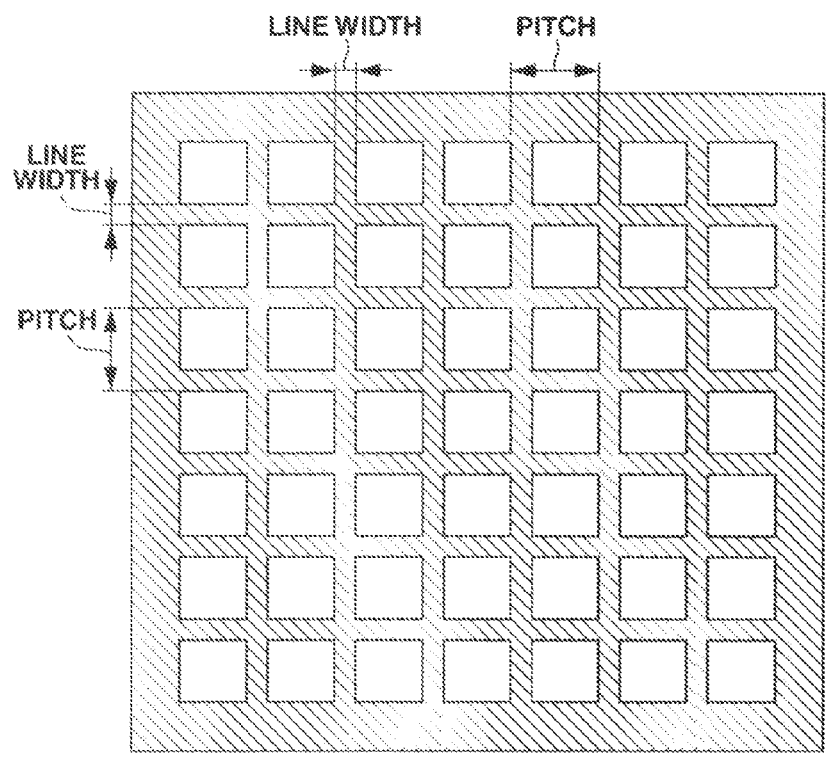
FIG. 5 illustrates a mask bearing a lattice-like pattern.

Method (ii) uses a mask having a lattice-like light-shielding pattern as shown in FIG. 5. Like Method (i), a combination of cross-pole illumination with polarized illumination is preferred for the purpose of improving resolution even at a narrow pitch.

Figure 6:
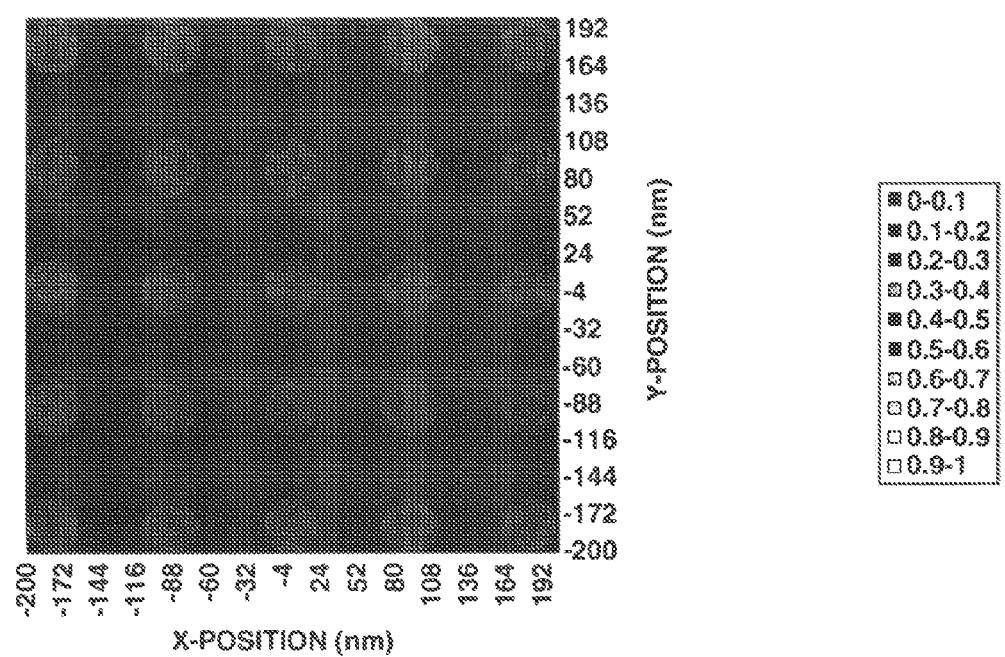
FIG. 6 is an optical image of a lattice-like pattern having a pitch of 90 nm and a line width of 30 nm printed under conditions: NA 1.3 lens, cross-pole illumination, 6% halftone phase shift mask, and azimuthally polarized illumination.
Figure 8:
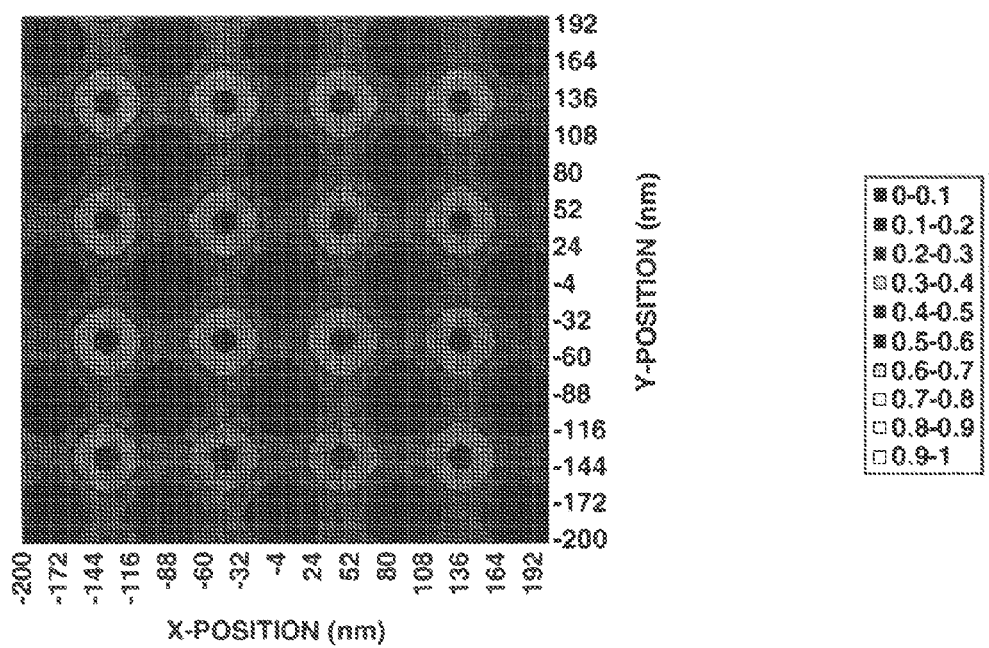
FIG. 8 is an optical image resulting from the mask of FIG. 7, printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. On use of a mask bearing a lattice-like line pattern having a pitch of 90 nm and a line width of 30 nm as shown in FIG. 5, under conditions: NA 1.3 lens, cross-pole illumination, 6% halftone phase shift mask, and azimuthally polarized illumination, an optical image is obtained as shown in FIG. 6. As compared with the use of the dot pattern, the use of the lattice-like pattern has the advantage of enhanced optical contrast despite the drawback of reduced resist sensitivity due to reduced light intensity.

In Method (ii), the procedure of using a half-tone phase shift mask having a transmittance of 3 to 15% and converting the intersections of lattice-like shifter gratings into a pattern of holes after development is preferred because the optical contrast is improved.

Figure 15:
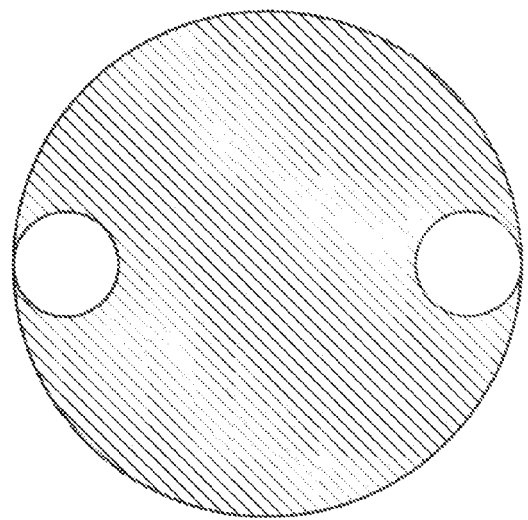
FIG. 15 illustrates an aperture configuration in an exposure tool of dipole illumination for enhancing the contrast of Y-direction lines.
Figure 16:
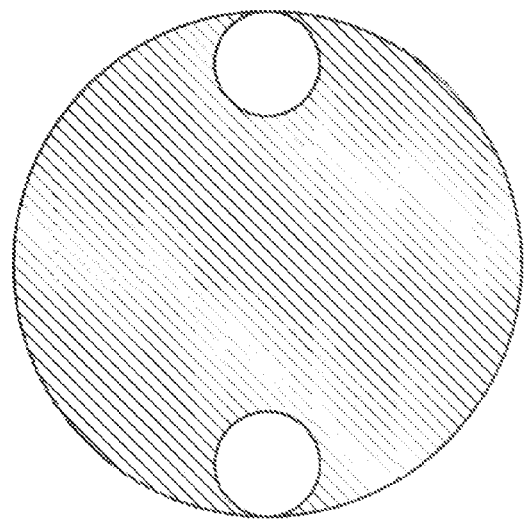
FIG. 16 illustrates an aperture configuration in an exposure tool of dipole illumination for enhancing the contrast of X-direction lines.

Method (iii) can achieve a further higher contrast than Methods (i) and (ii) by using dipole illumination with aperture configurations as shown in FIGS. 15 and 16, performing exposure to X and Y-direction line patterns in two separate steps, and overlaying the resulting optical images. The contrast may be enhanced by combining dipole illumination with s-polarized illumination.

Figure 2:
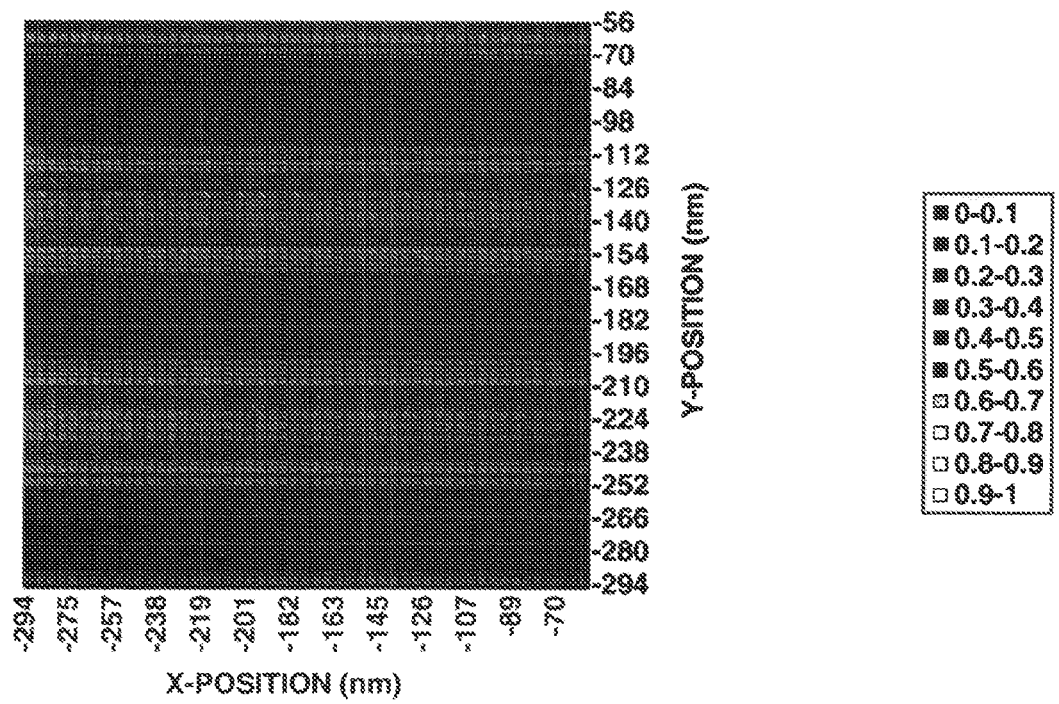
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.
Figure 3:
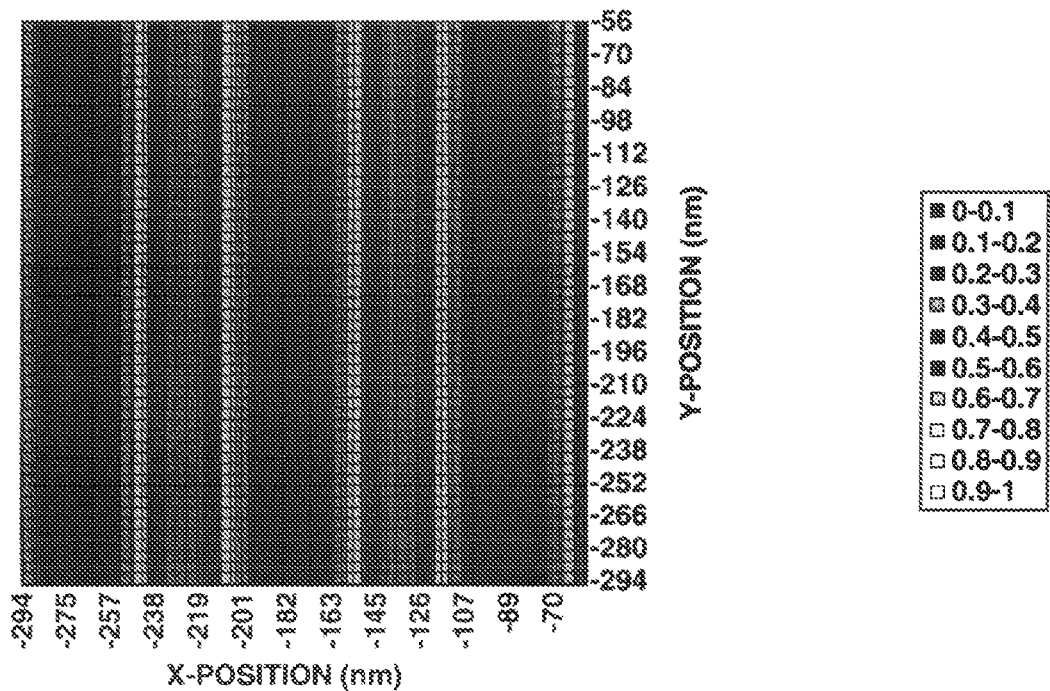
FIG. 3 is an optical image of Y-direction lines like FIG. 2.
Figure 4:
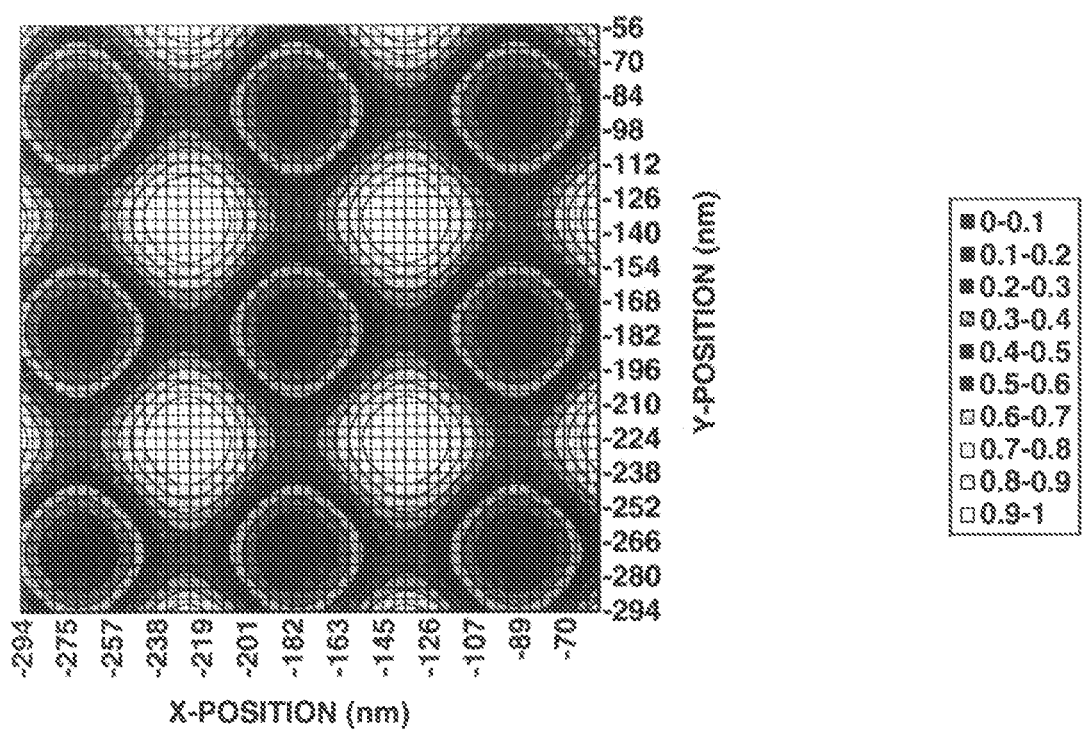
FIG. 4 shows a contrast image obtained by overlaying the optical image of X-direction lines in FIG. 2 with the optical image of Y-direction lines in FIG. 3.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area. FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Since Method (iii) involving double exposures provides a high optical contrast despite a reduced throughput as compared with Methods (i) and (ii) involving a single exposure, Method (iii) can form a fine pattern with CD uniformity and is advantageous for pitch narrowing. The angle between the first and second lines is preferably right, but may deviate from 90°, and the size and/or pitch may be the same or different between the first lines and the second lines. If a single mask bearing first lines in one area and second lines in another area is used, it is possible to carry out first and second exposures continuously. Two consecutive exposures using a single mask with the X and Y-direction contrasts emphasized can be carried out on the currently commercially available scanner.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a resist composition, specifically dissolution contrast and acid diffusion, the proximity bias of a mask varies with the type of resist composition. For a particular type of resist composition, a mask having a different proximity bias must be used. This adds to the burden of mask manufacturing.

Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by positive/negative reversal, a mask is used in which a lattice-like light-shielding pattern is arrayed over the entire surface and the width of gratings is thickened only where holes are to be formed.

Figure 9:
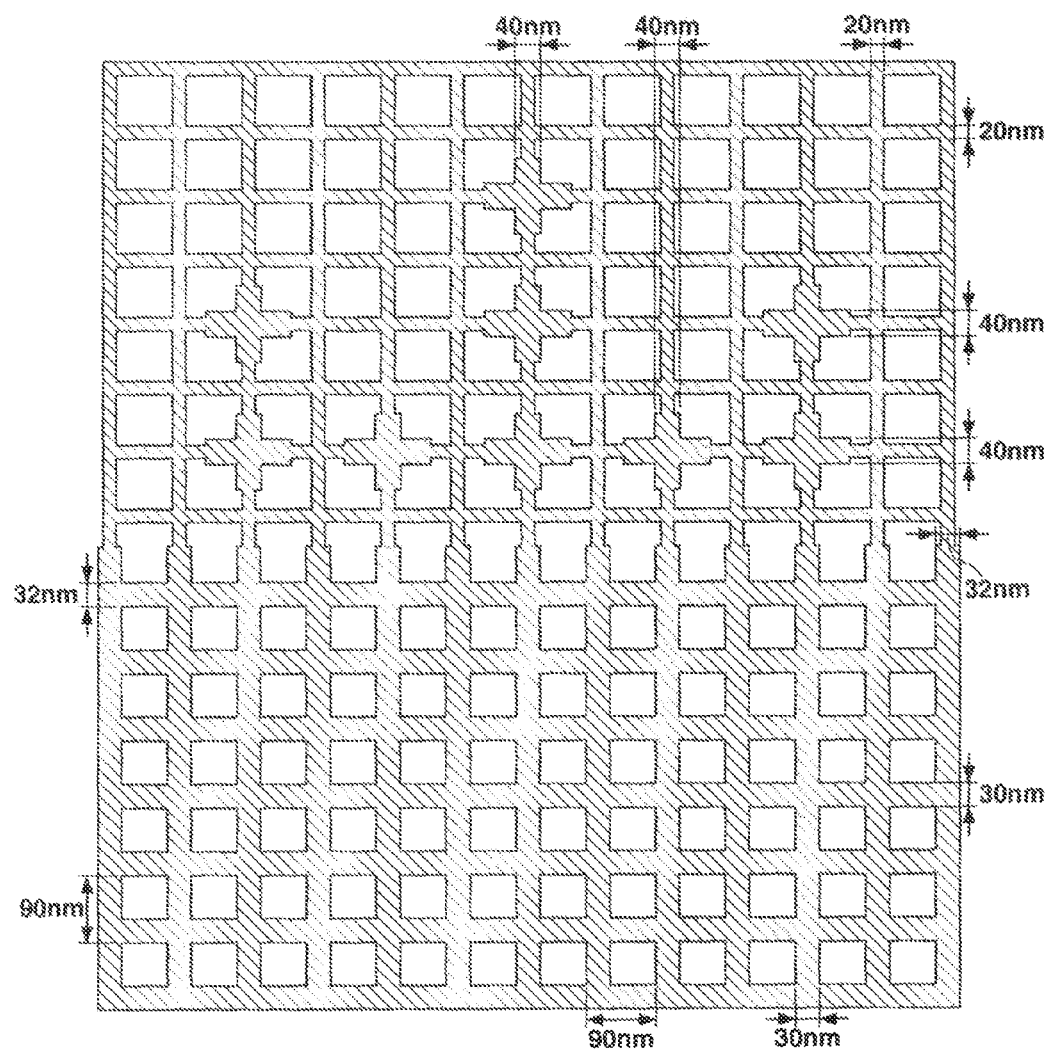
FIG. 9 illustrates a mask bearing a lattice-like pattern having a pitch of 90 nm and a line width of 20 nm on which thick crisscross or intersecting line segments are disposed where dots are to be formed.
Figure 11:
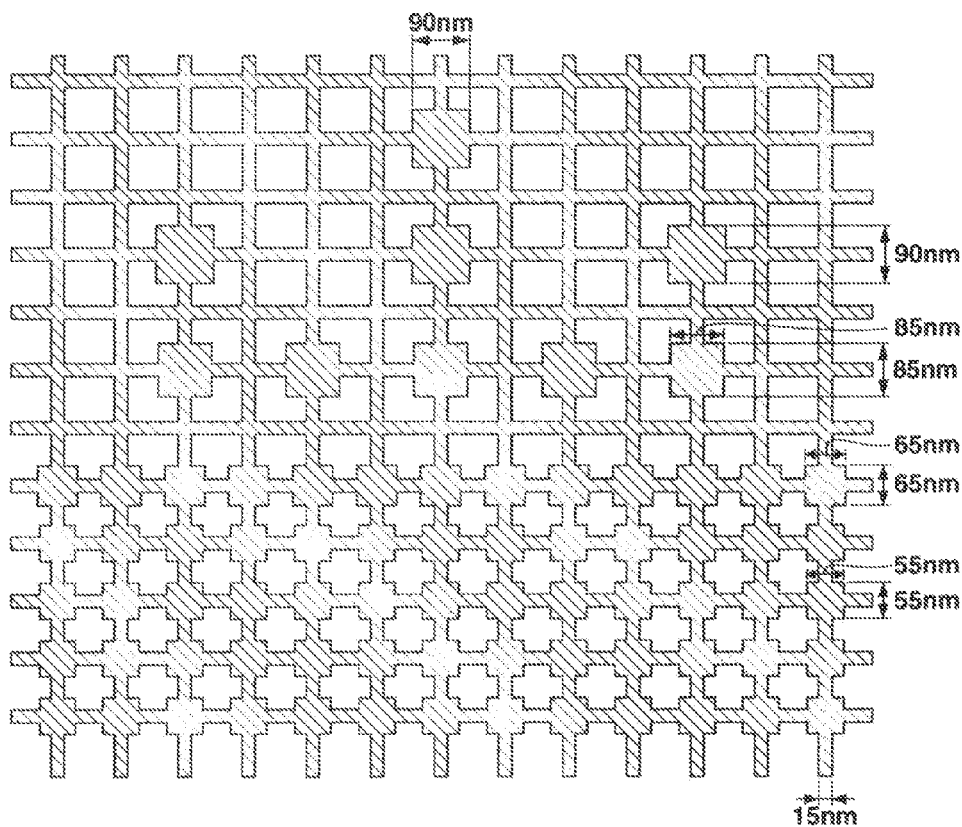
FIG. 11 illustrates a mask bearing a lattice-like pattern having a pitch of 90 nm and a line width of 15 nm on which thick dots are disposed where dots are to be formed.

In Method (ii), a pattern of holes at random pitches can be formed by using a phase shift mask including a lattice-like first shifter having a line width equal to or less than a half pitch and a second shifter arrayed on the first shifter and consisting of lines whose on-wafer size is 2 to 30 nm thicker than the line width of the first shifter as shown in FIG. 9, whereby a pattern of holes is formed only where the thick shifter is arrayed. Alternatively, a pattern of holes at random pitches can be formed by using a phase shift mask including a lattice-like first shifter having a line width equal to or less than a half pitch and a second shifter arrayed on the first shifter and consisting of dots whose on-wafer size is 2 to 100 nm thicker than the line width of the first shifter as shown in FIG. 11, whereby a pattern of holes is formed only where the thick shifter is arrayed.

As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern.

Figure 10:
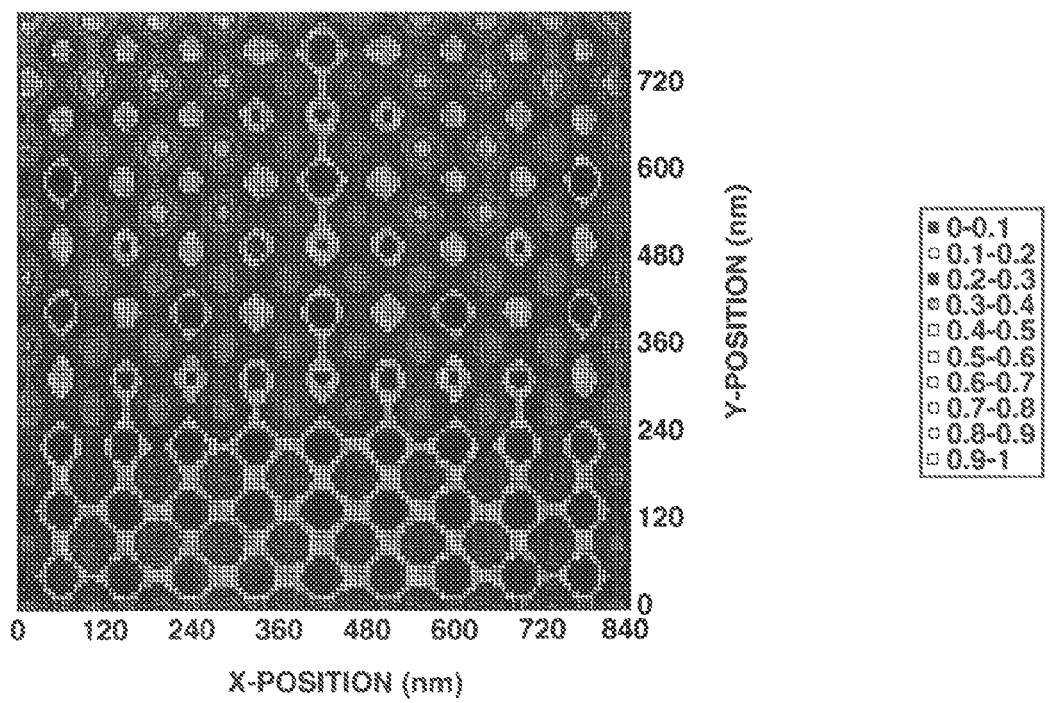
FIG. 10 is an optical image resulting from the mask of FIG. 9, printed under conditions: NA 1.3 lens, cross-pole illumination, 6% halftone phase shift mask, and azimuthally polarized illumination, showing its contrast.

FIG. 10 shows an optical image from the mask of FIG. 9, indicating the contrast thereof. Black or light-shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 12:
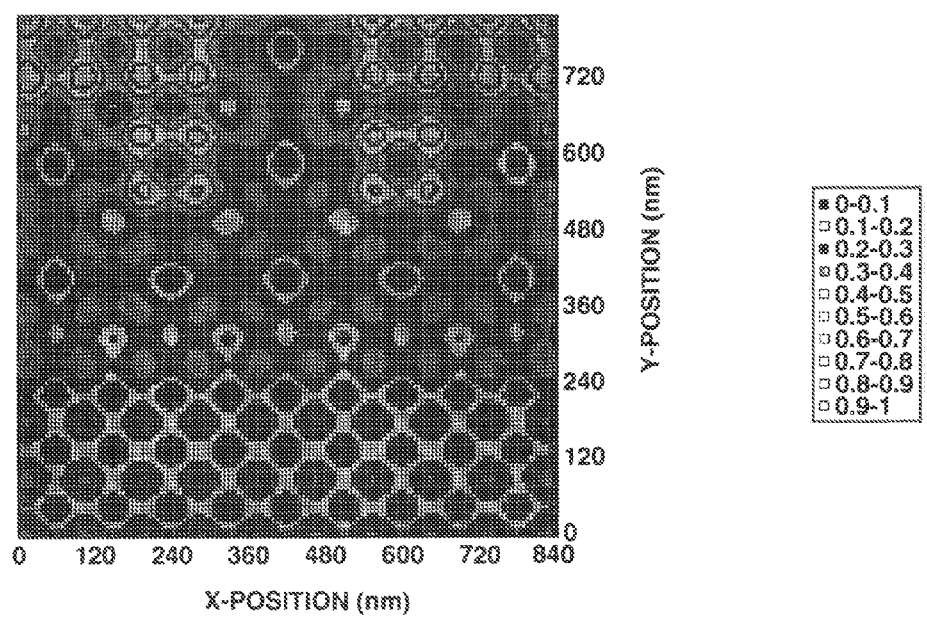
FIG. 12 is an optical image resulting from the mask of FIG. 11, printed under conditions: NA 1.3 lens, cross-pole illumination, 6% halftone phase shift mask, and azimuthally polarized illumination, showing its contrast.

Also useful is a mask in which a lattice-like light-shielding pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape. FIG. 12 shows an optical image from the mask of FIG. 11, indicating the contrast thereof. The presence of black or light-shielded spots substantially equivalent to those of FIG. 10 indicates that holes are formed via positive/negative reversal.

Figure 13:
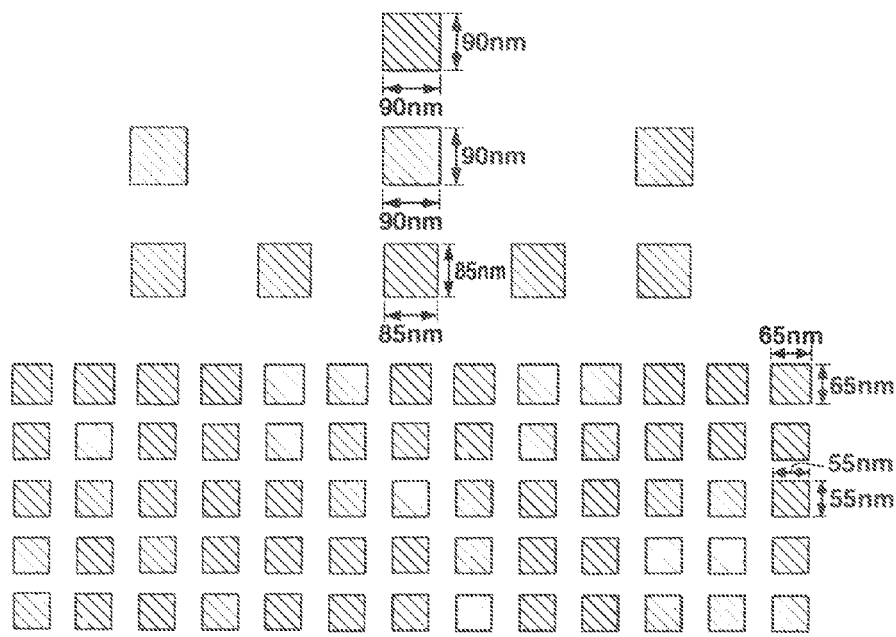
FIG. 13 illustrates a mask without a lattice-like pattern.
Figure 14:
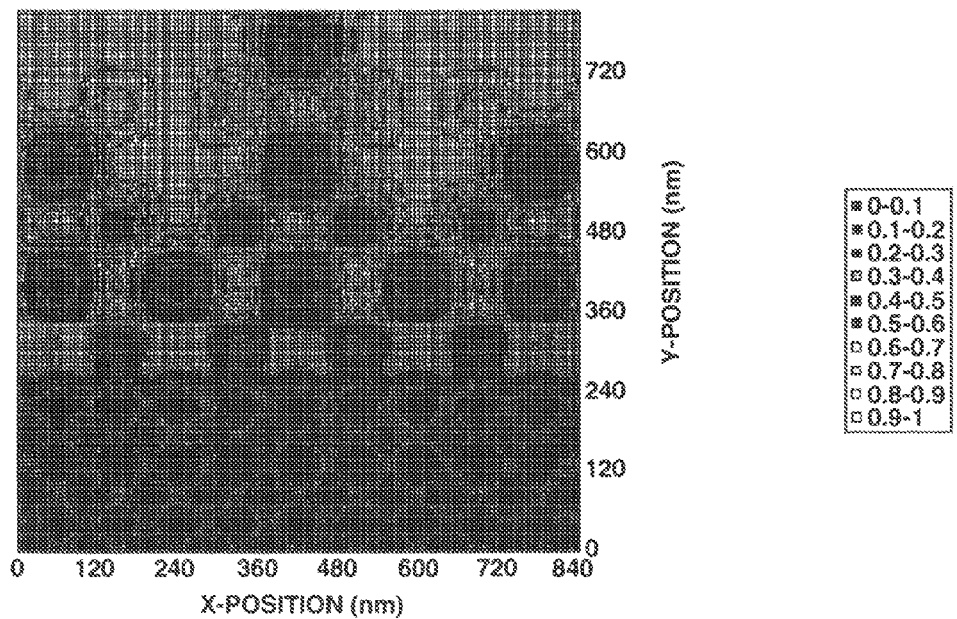
FIG. 14 is an optical image resulting from the mask of FIG. 13, printed under conditions: NA 1.3 lens, cross-pole illumination, 6% halftone phase shift mask, and azimuthally polarized illumination, showing its contrast.

On use of a mask bearing no lattice-like pattern arrayed as shown in FIG. 13, black or light-shielded spots do not appear as shown in FIG. 14. In this case, holes are difficult to form, or even if holes are formed, a variation of mask size is largely reflected by a variation of hole size because the optical image has a low contrast.

After development of a trench pattern or hole pattern as formed by the foregoing methods, thermal flow may be carried out for size shrinkage. Specifically, development is followed by heat treatment, which is referred to as "post-development bake" (PDB). With the PDB technique, once a pattern having a relatively large size enough to afford a wide lithography margin is formed, the size can be shrunk while substantially maintaining the margin. Although the PDB temperature necessary to induce thermal flow varies with a particular resist composition, a PDB temperature of 140 to 200° C. is preferred for inducing thermal flow to the resist film of the present resist composition.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Preparation of Resist Composition

A resist solution was prepared by dissolving components in a solvent in accordance with the recipe shown in Tables 1 and 2, and filtering through a Teflon® filter with a pore size of 0.2 µm. Base resins 1 and 2 in Tables 1 and 2 have a structure, molecular weight (Mw) and dispersity (Mw/Mn) as shown in Tables 3 and 4. In Tables 3 and 4, the value in parentheses indicates a constitutional ratio (mol %) of the relevant recurring unit. Note that Base resin 1 represents hydrogenated ROMP polymers including Polymers A1 to A11, and Base resin 2 represents (meth)acrylate resins including Polymers B1 to B12. The structure of photoacid generators in Tables 1 and 2 is shown in Table 5. The structure of quenchers in Tables 1 and 2 is shown in Table 6.

TABLE 1

|  | Base resin 1 (pbw) | Base resin 2 (pbw) | PAG (pbw) | Quencher (pbw) | Solvent (pbw) |
| --- | --- | --- | --- | --- | --- |
| Resist 1 | Polymer A1 (70) | Polymer B1 (30) | PAG-1 (10.2) | Q-1 (1.0) | PGMEA (2,100) CyHO (900) |
| Resist 2 | Polymer A1 (50) | Polymer B1 (50) | PAG-1 (10.2) | Q-1 (1.0) | PGMEA (2,100) CyHO (900) |
| Resist 3 | Polymer A1 (30) | Polymer B1 (70) | PAG-1 (10.2) | Q-1 (1.0) | PGMEA (2,100) CyHO (900) |
| Resist 4 | Polymer A2 (50) | Polymer B1 (50) | PAG-1 (10.2) | Q-1 (1.0) | PGMEA (2,100) CyHO (900) |
| Resist 5 | Polymer A3 (50) | Polymer B1 (50) | PAG-1 (10.2) | Q-1 (1.0) | PGMEA (2,100) CyHO (900) |
| Resist 6 | Polymer A4 (50) | Polymer B1 (50) | PAG-1 (10.2) | Q-1 (1.0) | PGMEA (2,100) CyHO (900) |
| Resist 7 | Polymer A5 (50) | Polymer B1 (50) | PAG-1 (10.2) | Q-1 (1.0) | PGMEA (2,100) CyHO (900) |
| Resist 8 | Polymer A5 (50) | Polymer B1 (50) | PAG-2 (9.3) | Q-2 (1.2) | PGMEA (2,100) CyHO (900) |
| Resist 9 | Polymer A5 (50) | Polymer B1 (50) | PAG-3 (11.0) | Q-2 (1.2) | PGMEA (2,100) CyHO (900) |
| Resist 10 | Polymer A5 (50) | Polymer B1 (50) | PAG-3 (11.0) | Q-3 (2.4) | PGMEA (2,700) GBL (300) |
| Resist 11 | Polymer A5 (50) | Polymer B1 (50) | PAG-4 (10.2) | Q-1 (1.0) | PGMEA (2,100) CyHO (900) |
| Resist 12 | Polymer A5 (50) | Polymer B1 (50) | PAG-1 (5.1) | Q-4 (5.1) | PGMEA (2,700) GBL (300) |
| Resist 13 | Polymer A6 (50) | Polymer B1 (50) | PAG-1 (10.2) | Q-1 (1.0) | PGMEA (2,100) CyHO (900) |
| Resist 14 | Polymer A7 (50) | Polymer B1 (50) | PAG-1 (10.2) | Q-1 (1.0) | PGMEA (2,100) CyHO (900) |
| Resist 15 | Polymer A8 (50) | Polymer B1 (50) | PAG-1 (10.2) | Q-1 (1.0) | PGMEA (2,100) CyHO (900) |
| Resist 16 | Polymer A9 (50) | Polymer B1 (50) | PAG-1 (10.2) | Q-1 (1.0) | PGMEA (2,100) CyHO (900) |
| Resist 17 | Polymer A10 (50) | Polymer B1 (50) | PAG-1 (10.2) | Q-1 (1.0) | PGMEA (2,100) CyHO (900) |

TABLE 1-continued

|  | Base resin 1 (pbw) | Base resin 2 (pbw) | PAG (pbw) | Quencher (pbw) | Solvent (pbw) |
|---|---|---|---|---|---|
| Resist 18 | Polymer A11 (50) | Polymer B1 (50) | PAG-1 (10.2) | Q-1 (1.0) | PGMEA (2,100) CyHO (900) |
| Resist 19 | Polymer A1 (50) | Polymer B2 (50) | PAG-1 (10.2) | Q-1 (1.0) | PGMEA (2,100) CyHO (900) |
| Resist 20 | Polymer A1 (50) | Polymer B3 (50) | PAG-1 (10.2) | Q-1 (1.0) | PGMEA (2,100) CyHO (900) |

TABLE 2

|  | Base resin 1 (pbw) | Base resin 2 (pbw) | PAG (pbw) | Quencher (pbw) | Solvent (pbw) |
|---|---|---|---|---|---|
| Resist 21 | Polymer A1 (50) | Polymer B4 (50) | PAG-1 (10.2) | Q-1 (1.0) | PGMEA (2,100) CyHO (900) |
| Resist 22 | Polymer A5 (50) | Polymer B4 (50) | PAG-1 (10.2) | Q-1 (1.0) | PGMEA (2,100) CyHO (900) |
| Resist 23 | Polymer A6 (50) | Polymer B4 (50) | PAG-1 (10.2) | Q-1 (1.0) | PGMEA (2,100) CyHO (900) |
| Resist 24 | Polymer A1 (50) | Polymer B5 (50) | PAG-1 (10.2) | Q-1 (1.0) | PGMEA (2,100) CyHO (900) |
| Resist 25 | Polymer A1 (50) | Polymer B6 (50) | PAG-1 (10.2) | Q-1 (1.0) | PGMEA (2,100) CyHO (900) |
| Resist 26 | Polymer A1 (50) | Polymer B7 (50) | PAG-1 (10.2) | Q-1 (1.0) | PGMEA (2,100) CyHO (900) |
| Resist 27 | Polymer A5 (50) | Polymer B7 (50) | PAG-1 (10.2) | Q-1 (1.0) | PGMEA (2,100) CyHO (900) |
| Resist 28 | Polymer A6 (50) | Polymer B7 (50) | PAG-1 (10.2) | Q-1 (1.0) | PGMEA (2,100) CyHO (900) |
| Resist 29 | Polymer A1 (50) | Polymer B8 (50) | PAG-1 (10.2) | Q-1 (1.0) | PGMEA (2,100) CyHO (900) |
| Resist 30 | Polymer A1 (50) | Polymer B9 (50) | PAG-1 (10.2) | Q-1 (1.0) | PGMEA (2,100) CyHO (900) |
| Resist 31 | Polymer A1 (50) | Polymer B10 (50) | PAG-1 (10.2) | Q-1 (1.0) | PGMEA (2,100) CyHO (900) |
| Resist 32 | Polymer A1 (50) | Polymer B11 (50) | PAG-1 (10.2) | Q-1 (1.0) | PGMEA (2,100) CyHO (900) |
| Resist 33 | Polymer A1 (50) | Polymer B12 (50) | PAG-1 (10.2) | Q-1 (1.0) | PGMEA (2,100) CyHO (900) |
| Resist 34 | Polymer A1 (100) |  | PAG-1 (10.2) | Q-1 (1.0) | PGMEA (2,100) CyHO (900) |
| Resist 35 | Polymer A5 (100) |  | PAG-1 (10.2) | Q-1 (1.0) | PGMEA (2,100) CyHO (900) |
| Resist 36 | Polymer A6 (100) |  | PAG-1 (10.2) | Q-1 (1.0) | PGMEA (2,100) CyHO (900) |
| Resist 37 |  | Polymer B1 (100) | PAG-1 (10.2) | Q-1 (1.0) | PGMEA (2,100) CyHO (900) |
| Resist 38 |  | Polymer B4 (100) | PAG-1 (10.2) | Q-1 (1.0) | PGMEA (2,100) CyHO (900) |
| Resist 39 |  | Polymer B7 (100) | PAG-1 (10.2) | Q-1 (1.0) | PGMEA (2,100) CyHO (900) |
| Resist 40 | Polymer A1 (50) Polymer A5 (50) |  | PAG-1 (102) | Q-1 (1.0) | PGMEA (2,100) CyHO (900) |
| Resist 41 |  | Polymer B1 (50) Polymer B4 (50) | PAG-1 (10.2) | Q-1 (1.0) | PGMEA (2,100) CyHO (900) |
| Resist 42 | Polymer A'12 (50) | Polymer B4 (50) | PAG-1 (10.2) | Q-1 (1.0) | PGMEA (2,100) CyHO (900) |
| Resist 43 | Polymer A'13 (50) | Polymer B4 (50) | PAG-1 (10.2) | Q-1 (1.0) | PGMEA (2,100) CyHO (900) |
| Resist 44 | Polymer A1 (50) | Polymer B'13 (50) | PAG-1 (10.2) | Q-1 (1.0) | PGMEA (2,100) CyHO (900) |
| Resist 45 | Polymer A1 (50) | Polymer B'14 (50) | PAG-1 (10.2) | Q-1 (1.0) | PGMEA (2,100) CyHO (900) |

TABLE 3

| Polymer | Constitutional units | | | | Mw | Mw/Mn |
| --- | --- | --- | --- | --- | --- | --- |
| | Unit 1 | Unit 2 | Unit 3 | Unit 4 | | |
| A1 | [methyladamantyl ester cyclopentane unit] (50) | [furo-furanone unit] (50) | | | 8,300 | 1.9 |
| A2 | [methyladamantyl ester cyclopentane unit] (60) | [spiro oxolane-lactone unit] (40) | | | 7,000 | 1.8 |
| A3 | [ethyladamantyl ester cyclopentane unit] (50) | [furo-furanone unit] (40) | [cyclopentane carboxylic acid unit] (10) | | 6,200 | 2.0 |
| A4 | [tert-amyl ester tetracyclic unit] (50) | [furo-furanone unit] (20) | [furo-furanone unit] (30) | | 7,300 | 1.7 |

TABLE 3-continued

| Polymer | Constitutional units | | | | Mw | Mw/Mn |
|---|---|---|---|---|---|---|
| | Unit 1 | Unit 2 | Unit 3 | Unit 4 | | |
| A5 | (37) | (50) | (13) | | 9,300 | 2.1 |
| A6 | (50) | (50) | | | 9,900 | 1.6 |
| A7 | (50) | (40) | (10) | | 7,000 | 1.8 |
| A8 | (40) | (40) | (10) | (10) | 6,700 | 2.1 |

TABLE 3-continued

| Polymer | Constitutional units | | | | Mw | Mw/Mn |
|---|---|---|---|---|---|---|
| | Unit 1 | Unit 2 | Unit 3 | Unit 4 | | |
| A9 | (40) | (40) | (20) | | 5,900 | 2.0 |
| A10 | (45) | (35) | (20) | | 6,200 | 1.8 |
| A11 | (50) | (30) | (10) | (10) | 7,700 | 1.8 |
| A'12 | (40) | (50) | (10) | | 9,200 | 2.1 |

TABLE 3-continued

| Polymer | Constitutional units | | | | Mw | Mw/Mn |
|---|---|---|---|---|---|---|
| | Unit 1 | Unit 2 | Unit 3 | Unit 4 | | |
| A'13 | [methyladamantyl ester cyclopentane unit] (50) | [cyclopenta-fused tetrahydrofuran unit] (50) | | | 8,400 | 2.2 |

TABLE 4

| Polymer | Constitutional units | | | | Mw | Mw/Mn |
|---|---|---|---|---|---|---|
| | Unit 1 | Unit 2 | Unit 3 | Unit 4 | | |
| B1 | [methacrylate methyladamantyl] (50) | [methacrylate γ-butyrolactone] (50) | | | 7,400 | 1.7 |
| B2 | [methacrylate ethyladamantyl] (60) | [methacrylate γ-butyrolactone] (40) | | | 6,900 | 1.8 |
| B3 | [methacrylate methylcyclohexyl] (50) | [methacrylate norbornane lactone] (40) | [methacrylate hydroxyadamantyl] (10) | | 7,200 | 1.8 |

TABLE 4-continued

| Polymer | Constitutional units | | | | Mw | Mw/Mn |
|---|---|---|---|---|---|---|
| | Unit 1 | Unit 2 | Unit 3 | Unit 4 | | |
| B4 | (50) | (50) | | | 5,800 | 1.6 |
| B5 | (40) | (30) | (30) | | 9,800 | 2.0 |
| B6 | (50) | (20) | (30) | | 10,500 | 1.8 |
| B7 | (20) | (30) | (20) | (30) | 6,100 | 1.6 |

TABLE 4-continued

| Polymer | Constitutional units | | | | Mw | Mw/Mn |
|---|---|---|---|---|---|---|
| | Unit 1 | Unit 2 | Unit 3 | Unit 4 | | |
| B8 | (40) | (40) | (20) | | 8,000 | 1.8 |
| B9 | (45) | (30) | (25) | | 9,600 | 2.2 |
| B10 | (50) | (30) | (20) | | 7,700 | 1.6 |
| B11 | (10) | (40) | (25) | (25) | 8,800 | 2.0 |

TABLE 4-continued
| Polymer | Constitutional units | | | | Mw | Mw/Mn |
|---|---|---|---|---|---|---|
| | Unit 1 | Unit 2 | Unit 3 | Unit 4 | | |
| B12 | (30) | (10) | (30) | (30) | 8,300 | 1.9 |
| B'13 | (100) | | | | 6,100 | 1.9 |
| B'14 | (70) | (30) | | | 7,900 | 2.1 |
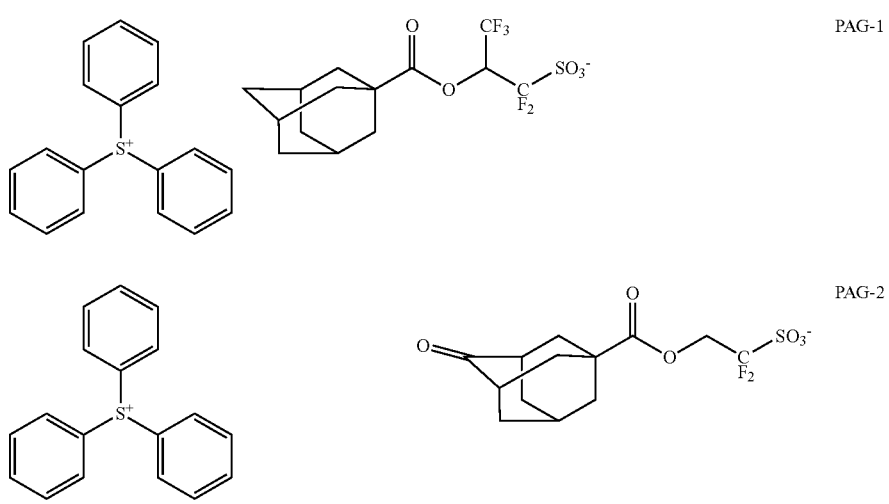
TABLE 5

TABLE 5-continued

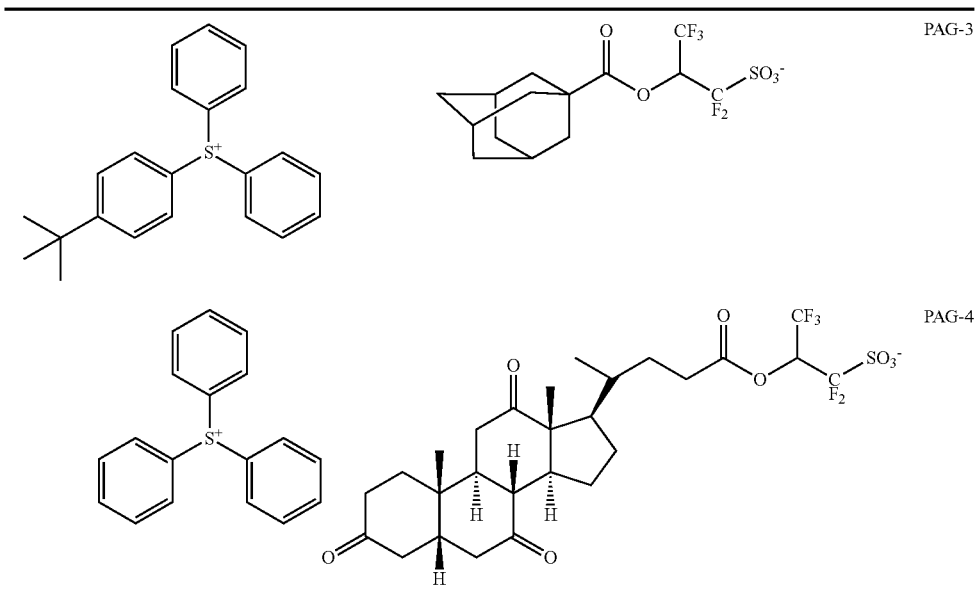

TABLE 6

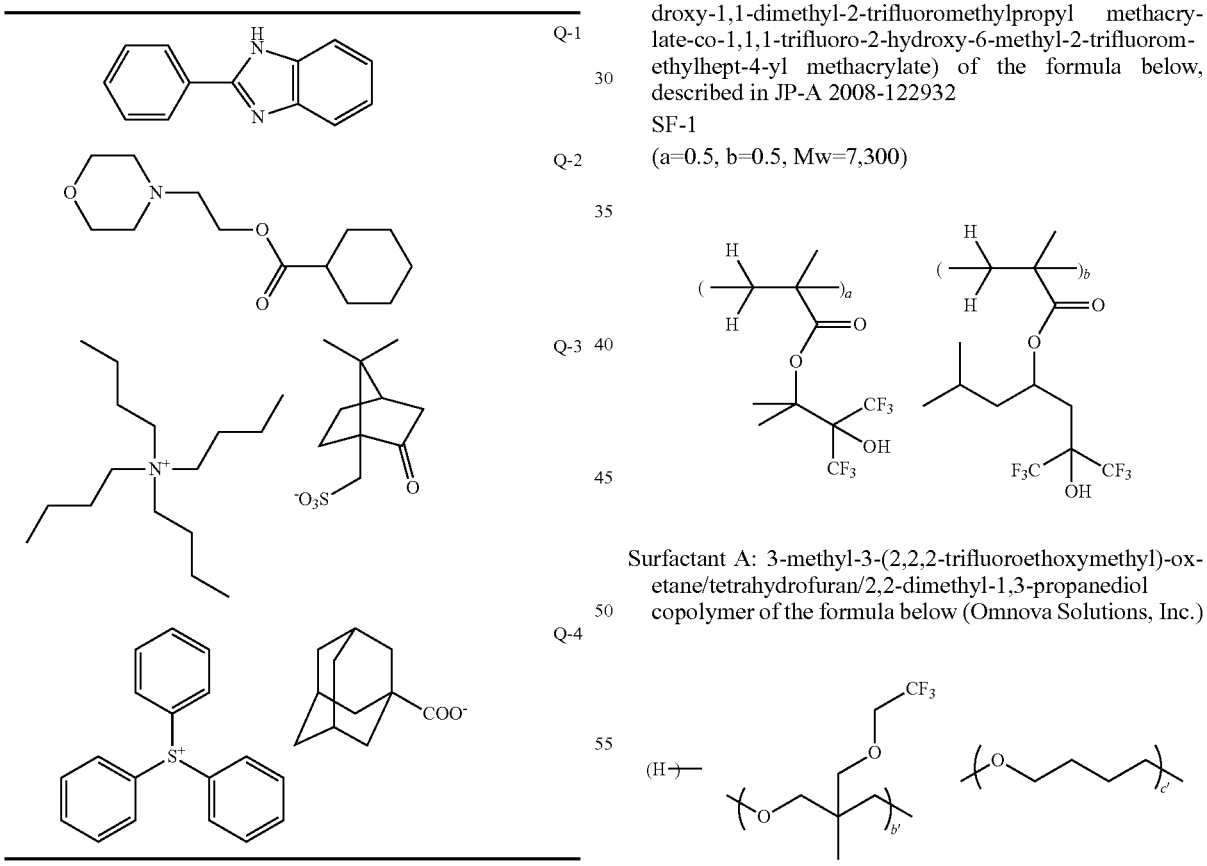

The organic solvents in Tables 1 and 2 are as follows.
PGMEA: propylene glycol monomethyl ether acetate
CyHO: cyclohexanone
GBL: γ-butyrolactone All the resist compositions in Tables 1 and 2 contained 5.0 pbw of alkali-soluble surfactant SF-1 and 0.1 pbw of surfactant A.

Alkali-soluble surfactant SF-1: poly(3,3,3-trifluoro-2-hydroxy-1,1-dimethyl-2-trifluoromethylpropyl methacrylate-co-1,1,1-trifluoro-2-hydroxy-6-methyl-2-trifluoromethylhept-4-yl methacrylate) of the formula below, described in JP-A 2008-122932

SF-1

(a=0.5, b=0.5, Mw=7,300)

Surfactant A: 3-methyl-3-(2,2,2-trifluoroethoxymethyl)-oxetane/tetrahydrofuran/2,2-dimethyl-1,3-propanediol copolymer of the formula below (Omnova Solutions, Inc.)

-continued

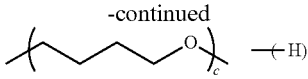

a:(b+b'):(c+c')=1:4-7:0.01-1 (molar ratio)
Mw=1,500

Preparation of Alkali-Soluble Protective Film-Forming Composition

A protective film-forming solution TC-1 was prepared by dissolving a resin (TC Polymer 1) in an organic solvent and filtering through a Teflon® filter having a pore size of 0.2 μm.

| TC-1 composition | Parts by weight |
|---|---|
| TC Polymer 1 | 100 |
| isoamyl ether | 2,600 |
| 2-methyl-1-butanol | 260 |

TC Polymer 1
(a=0.7, b=0.3, Mw=6,800)

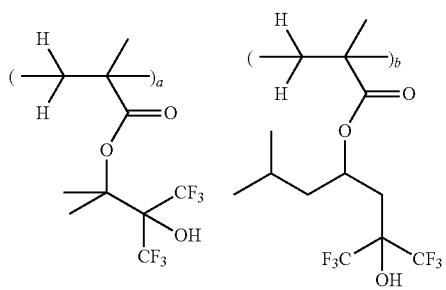

Examples 1 to 33 & Comparative Examples 1 to 17

Etch Resistance Test

Evaluation Method

On a silicon wafer which had been surface treated in hexamethyldisilazane (HMDS) gas phase at 90° C. for 60 seconds, each of the resist solutions in Tables 1 and 2 was spin-coated and baked (PAB) on a hot plate at 100° C. for 60 seconds, forming a resist film of 100 nm thick. Using an ArF excimer laser scanner (NSR-307E by Nikon Corp., NA 0.85), the entire surface of the wafer was subjected to open-frame exposure. The exposure was in a dose of 50 mJ/cm² so that the PAG might generate sufficient acid to induce deprotection reaction. This was followed by bake (PEB) at 120° C. for 60 seconds for converting the base resin in the resist film to the deprotected state. The portion where the base resin is deprotected corresponds to the insoluble region in negative tone development. In a dry etching test using a dry etcher (Tokyo Electron Ltd.), the resist film was etched with $CF_4/CHF_3$ gas. A change per minute of film thickness was measured, from which an etch rate (nm/min) was computed. A lower etch rate indicates a reduction of size change and roughness after substrate processing.

For comparison purposes, some resist compositions were evaluated by the etch resistance test without exposure and PEB. Since the dissolving group (carboxylic acid) in the base resin is kept protected in the resist film without exposure and PEB, the resist film which corresponds to the state of the insoluble region in positive tone development is evaluated.

Evaluation Results

Table 7 tabulates the identity of resist composition, whether or not exposure and PEB are carried out, and the etch rate.

TABLE 7

| | Resist composition | PEB temp. (° C.) | Exposure and PEB | Etch rate (nm/min) |
|---|---|---|---|---|
| Example 1 | Resist 1 | 100 | yes | 91 |
| Example 2 | Resist 2 | 100 | yes | 92 |
| Example 3 | Resist 3 | 100 | yes | 96 |
| Example 4 | Resist 4 | 100 | yes | 90 |
| Example 5 | Resist 5 | 100 | yes | 93 |
| Example 6 | Resist 6 | 105 | yes | 91 |
| Example 7 | Resist 7 | 105 | yes | 91 |
| Example 8 | Resist 8 | 105 | yes | 91 |
| Example 9 | Resist 9 | 105 | yes | 90 |
| Example 10 | Resist 10 | 105 | yes | 91 |
| Example 11 | Resist 11 | 110 | yes | 89 |
| Example 12 | Resist 12 | 105 | yes | 91 |
| Example 13 | Resist 13 | 105 | yes | 89 |
| Example 14 | Resist 14 | 105 | yes | 90 |
| Example 15 | Resist 15 | 100 | yes | 93 |
| Example 16 | Resist 16 | 95 | yes | 92 |
| Example 17 | Resist 17 | 95 | yes | 94 |
| Example 18 | Resist 18 | 95 | yes | 88 |
| Example 19 | Resist 19 | 100 | yes | 90 |
| Example 20 | Resist 20 | 105 | yes | 92 |
| Example 21 | Resist 21 | 100 | yes | 94 |
| Example 22 | Resist 22 | 105 | yes | 91 |
| Example 23 | Resist 23 | 105 | yes | 88 |
| Example 24 | Resist 24 | 105 | yes | 91 |
| Example 25 | Resist 25 | 105 | yes | 92 |
| Example 26 | Resist 26 | 100 | yes | 92 |
| Example 27 | Resist 27 | 105 | yes | 92 |
| Example 28 | Resist 28 | 100 | yes | 91 |
| Example 29 | Resist 29 | 105 | yes | 94 |
| Example 30 | Resist 30 | 105 | yes | 93 |
| Example 31 | Resist 31 | 100 | yes | 96 |
| Example 32 | Resist 32 | 100 | yes | 92 |
| Example 33 | Resist 33 | 105 | yes | 94 |
| Comparative Example 1 | Resist 34 | 105 | yes | 91 |
| Comparative Example 2 | Resist 35 | 105 | yes | 90 |
| Comparative Example 3 | Resist 36 | 105 | yes | 89 |
| Comparative Example 4 | Resist 37 | 100 | yes | 140 |
| Comparative Example 5 | Resist 38 | 100 | yes | 131 |
| Comparative Example 6 | Resist 39 | 100 | yes | 135 |
| Comparative Example 7 | Resist 40 | 105 | yes | 91 |
| Comparative Example 8 | Resist 41 | 100 | yes | 135 |
| Comparative Example 9 | Resist 42 | 100 | yes | 95 |
| Comparative Example 10 | Resist 43 | 100 | yes | 96 |
| Comparative Example 11 | Resist 44 | 100 | yes | 96 |
| Comparative Example 12 | Resist 45 | 100 | yes | 98 |
| Comparative Example 13 | Resist 1 | 100 | no | 91 |
| Comparative Example 14 | Resist 2 | 100 | no | 93 |
| Comparative Example 15 | Resist 3 | 100 | no | 94 |
| Comparative Example 16 | Resist 34 | 105 | no | 90 |
| Comparative Example 17 | Resist 37 | 100 | no | 122 |

As seen from the results of Table 7, the inventive resist compositions comprising both hydrogenated ROMP polymer (A) and (meth)acrylate resin (B) show fully low etch rates even in the deprotected state (exposed and PEB films) like the resist compositions comprising only hydrogenated ROMP polymer (A). On the other hand, the resist compositions comprising only (meth)acrylate resin (B) show high etch rates in the protected state (exposure and PEB omitted) and higher etch rates in the deprotected state.

Examples 34 to 68 & Comparative Examples 18 to 33

Patterning Test 1

Formation of Trench Pattern

Evaluation Method

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A941 by Shin-Etsu Chemical Co., Ltd., silicon content 43 wt %) of 35 nm thick thereon. The resist solution (Resists 1 to 45 in Tables 1 and 2) was spin coated on the trilayer process substrate, then baked (PAB) on a hot plate at 100° C. for 60 seconds to form a resist film of 100 nm thick. On the resist films of Example 42, Comparative Examples 18, 20 and 30 in Table 8, the protective coating solution TC-1 was spin coated and baked at 90° C. for 60 seconds to form a protective film of 50 nm thick.

Using an ArF excimer laser immersion lithography scanner (NSR-610C by Nikon Corp., NA 1.30, σ 0.97/0.73, cross-pole opening 60 deg., azimuthally polarized illumination, 6% halftone phase shift mask), exposure was carried out with a varying exposure dose and focus offset value. After exposure, the resist film was baked (PEB) at an arbitrary temperature for 60 seconds and then developed. With respect to the mask design (actual on-mask size is 4 times because of ¼ image reduction projection exposure) and development conditions, four sets of conditions, Processes 1 to 4 were used.

Process 1
  Design on mask: 60 nm line/160 nm pitch (lines being light-shielding)
  Development conditions: developed in butyl acetate as developer for 30 seconds and rinsed with diisoamyl ether Process 2
  Design on mask: 60 nm line/160 nm pitch (lines being light-shielding)
  Development conditions: developed in 2-heptanone as developer for 30 seconds and rinsed with diisoamyl ether Process 3
  Design on mask: 60 nm line/160 nm pitch (lines being light-shielding)
  Development conditions: developed in a 1:1 (weight ratio) solvent mixture of butyl acetate and methyl benzoate as developer for 30 seconds and rinsed with diisoamyl ether Process 4
  Design on mask: 60 nm trench/160 nm pitch (trenches being light transmissive)
  Development conditions: developed in 2.38 wt % tetramethylammonium hydroxide aqueous solution as developer for 30 seconds and rinsed with deionized water Processes 1 to 3 correspond to the trench forming process involving organic solvent negative development for line pattern reversal according to the invention whereas Process 4 corresponds to the trench forming process using alkaline developer for comparison sake.

The resist pattern thus formed was observed under an electron microscope. The optimum dose (Eop) was the dose (mJ/cm$^2$) that gave a trench width of 50 nm. Patterns were printed at the optimum dose while the trench size of the mask design was changed from 58 nm to 62 nm in an increment of 1 nm with the pitch of 160 nm fixed. Changes of resist pattern size were measured, and a mask size fidelity, known as mask error factor (MEF), was determined from a gradient of their linear approximation. A variation of edge size of the pattern formed at the optimum dose was measured in intervals of 2 nm. A 3σ value thereof is reported as edge roughness (nm).

Evaluation Results

Table 8 tabulates the conditions under which each resist composition is evaluated and the results of evaluation.

TABLE 8

| | | Resist composition | PEB temp. (° C.) | Mask design/ development conditions | Eop (mJ/cm$^2$) | MEF | Edge roughness (nm) |
|---|---|---|---|---|---|---|---|
| Example | 34 | Resist 1 | 100 | Process 1 | 31 | 4.5 | 5.1 |
| | 35 | Resist 2 | 100 | Process 1 | 30 | 4.2 | 4.8 |
| | 36 | Resist 2 | 100 | Process 2 | 28 | 4.1 | 5.0 |
| | 37 | Resist 2 | 100 | Process 3 | 28 | 4.2 | 5.2 |
| | 38 | Resist 3 | 100 | Process 1 | 29 | 4.0 | 4.9 |
| | 39 | Resist 4 | 100 | Process 1 | 29 | 3.9 | 5.2 |
| | 40 | Resist 5 | 100 | Process 1 | 32 | 4.2 | 5.1 |
| | 41 | Resist 6 | 105 | Process 1 | 33 | 4.5 | 4.8 |
| | 42 | Resist 7 | 105 | Process 1 | 31 | 4.4 | 5.0 |
| | 43 | Resist 8 | 105 | Process 1 | 34 | 4.4 | 4.9 |
| | 44 | Resist 9 | 105 | Process 1 | 36 | 4.2 | 5.1 |
| | 45 | Resist 10 | 105 | Process 1 | 34 | 4.4 | 5.2 |
| | 46 | Resist 11 | 110 | Process 1 | 38 | 4.6 | 5.2 |
| | 47 | Resist 12 | 105 | Process 1 | 26 | 4.1 | 5.1 |
| | 48 | Resist 13 | 105 | Process 1 | 29 | 4.5 | 4.9 |
| | 49 | Resist 14 | 105 | Process 1 | 33 | 4.0 | 5.1 |
| | 50 | Resist 15 | 100 | Process 1 | 29 | 4.1 | 5.3 |
| | 51 | Resist 16 | 95 | Process 1 | 29 | 4.5 | 5.0 |
| | 52 | Resist 17 | 95 | Process 1 | 30 | 4.5 | 5.0 |
| | 53 | Resist 18 | 95 | Process 1 | 28 | 4.4 | 5.4 |
| | 54 | Resist 19 | 100 | Process 1 | 29 | 4.5 | 4.9 |
| | 55 | Resist 20 | 105 | Process 1 | 33 | 4.4 | 5.1 |
| | 56 | Resist 21 | 100 | Process 1 | 31 | 4.1 | 5.2 |
| | 57 | Resist 22 | 105 | Process 1 | 30 | 3.8 | 5.4 |
| | 58 | Resist 23 | 105 | Process 1 | 30 | 3.8 | 5.4 |
| | 59 | Resist 24 | 105 | Process 1 | 31 | 4.5 | 5.3 |
| | 60 | Resist 25 | 105 | Process 1 | 29 | 4.3 | 5.1 |
| | 61 | Resist 26 | 100 | Process 1 | 27 | 4.2 | 5.3 |
| | 62 | Resist 27 | 105 | Process 1 | 30 | 3.9 | 5.0 |
| | 63 | Resist 28 | 100 | Process 1 | 32 | 3.8 | 5.4 |
| | 64 | Resist 29 | 105 | Process 1 | 29 | 4.3 | 5.1 |
| | 65 | Resist 30 | 105 | Process 1 | 31 | 4.5 | 5.2 |
| | 66 | Resist 31 | 100 | Process 1 | 28 | 4.4 | 5.3 |
| | 67 | Resist 32 | 100 | Process 1 | 29 | 4.3 | 5.2 |
| | 68 | Resist 33 | 105 | Process 1 | 30 | 4.2 | 5.1 |
| Comparative Example | 18 | Resist 34 | 105 | Process 1 | 32 | 5.8 | 6.2 |
| | 19 | Resist 35 | 105 | Process 1 | 31 | 5.4 | 6.4 |
| | 20 | Resist 36 | 105 | Process 1 | 33 | 5.3 | 6.0 |
| | 21 | Resist 37 | 100 | Process 1 | 30 | 4.5 | 5.9 |
| | 22 | Resist 38 | 100 | Process 1 | 33 | 3.9 | 6.1 |
| | 23 | Resist 39 | 100 | Process 1 | 28 | 4.1 | 6.3 |
| | 24 | Resist 40 | 105 | Process 1 | 31 | 5.6 | 6.3 |
| | 25 | Resist 41 | 100 | Process 1 | 32 | 4.2 | 6.0 |
| | 26 | Resist 42 | 100 | Process 1 | 34 | 6.2 | 6.3 |
| | 27 | Resist 43 | 100 | Process 1 | 33 | 5.9 | 6.2 |
| | 28 | Resist 44 | 100 | Process 1 | 32 | 6.3 | 6.2 |
| | 29 | Resist 45 | 100 | Process 1 | 35 | 5.9 | 6.5 |
| | 30 | Resist 2 | 100 | Process 4 | 33 | 6.2 | 7.7 |
| | 31 | Resist 7 | 105 | Process 4 | 34 | 6.3 | 8.6 |
| | 32 | Resist 21 | 100 | Process 4 | 33 | 6.3 | 8.2 |
| | 33 | Resist 28 | 100 | Process 4 | 35 | 6.0 | 7.4 |

As is evident from the results of Table 8, the trench patterns formed via organic solvent negative development corresponding to Processes 1 to 3 are superior in MEF and edge roughness to the trench patterns formed via alkaline aqueous solution positive development corresponding to Process 4.

The inventive resist compositions comprising both hydrogenated ROMP polymer (A) and (meth)acrylate resin (B) as base resin showed better MEF values than the resist compositions of Comparative Examples 18 to 20 and 24 comprising only hydrogenated ROMP polymer (A) and equivalent MEF values to the resist compositions of Comparative Examples 21 to 23 and 25 comprising only (meth)acrylate resin (B). As for edge roughness, the inventive resist compositions comprising both hydrogenated ROMP polymer (A) and (meth)acrylate resin (B) showed better results than when the resins were used alone.

Comparative Examples 26 to 29 reveal that when a hydrogenated ROMP polymer or (meth)acrylate resin having different structure than the scope of the invention was used, both MEF and roughness were inferior.

It is seen from the results of Table 8 that the pattern forming process of forming a trench pattern from a resist composition comprising two specific base resins via organic solvent negative development satisfies all etch resistance, mask size fidelity and roughness.

Examples 69 to 103 & Comparative Examples 34 to 49

Patterning Test 2

Formation of Hole Pattern

Evaluation Method

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A941 by Shin-Etsu Chemical Co., Ltd., silicon content 43 wt %) of 35 nm thick thereon. The resist solution (Resists 1 to 45 in Tables 1 and 2) was spin coated on the trilayer process substrate, then baked (PAB) on a hot plate at 100° C. for 60 seconds to form a resist film of 100 nm thick. On the resist films of Example 77, Comparative Examples 34, 36 and 46 in Table 9, the protective coating solution TC-1 was spin coated and baked at 90° C. for 60 seconds to form a protective film of 50 nm thick.

Using an ArF excimer laser immersion lithography scanner (NSR-610C by Nikon Corp.), a single exposure or two consecutive exposures were carried out under arbitrary illumination conditions. After exposure, the resist film was baked (PEB) at an arbitrary temperature for 60 seconds and then developed. With respect to the illumination conditions for exposure, the design on a 6% halftone phase shift mask (actual on-mask size is 4 times because of ¼ image reduction projection exposure) and development conditions, four sets of conditions, Processes 5 to 8 were used.

Process 5
  Illumination conditions for exposure:
    NA 1.30, σ 0.98/0.78,
    cross-pole opening 20 deg.,
    azimuthally polarized illumination
  Design on mask: 60 nm dot/90 nm pitch and 55 nm dot/80 nm pitch
    (dots being light-shielding)
  Development conditions: developed in butyl acetate as developer for 30 seconds and rinsed with diisoamyl ether to form a pattern of holes at the dots Process 6
  Illumination conditions for exposure:
    NA 1.30, σ 0.98/0.78,
    cross-pole opening 20 deg.,
    azimuthally polarized illumination
  Design on mask: lattice-like mask of 20 nm line/90 nm pitch and 15 nm line/80 nm pitch (lattice-forming lines being light-shielding)
  Development conditions: developed in butyl acetate as developer for 30 seconds and rinsed with diisoamyl ether to form a pattern of holes at the intersections Process 7
  Illumination conditions for exposure:
    NA 1.30, σ 0.98/0.78,
    azimuthally polarized illumination, two consecutive exposures,
    with the first exposure at X dipole opening 20 deg. and the second exposure at Y dipole opening 20 deg., X and Y directions being at an angle of 90°
  Design on mask: X-direction repeat lines for the first exposure and Y-direction repeat lines for the second exposure, consisting of 45 nm line/90 nm pitch and 40 nm line/80 nm pitch, respectively; first and second exposures being such that patterns of the same line/pitch size intersect with each other
  Development conditions: developed in butyl acetate as developer for 30 seconds and rinsed with 4-methyl-2-pentanol to form a pattern of holes at the intersections of lines of two exposures Process 8
  Illumination conditions for exposure:
    NA 1.30, σ 0.98/0.78,
    cross-pole opening 20 deg.,
    azimuthally polarized illumination,
  Design on mask: 60 nm hole/90 nm pitch and 55 nm hole/80 nm pitch (square holes being light transmissive)
  Development conditions: developed in 2.38 wt % tetramethylammonium hydroxide aqueous solution as developer for 30 seconds and rinsed with deionized water to form a pattern of holes at the holes Processes 5 to 7 correspond to the hole pattern forming process involving organic solvent negative development according to the invention, Process 5 being a process by reversal of dot pattern, Process 6 being a process by reversal of lattice pattern, and Process 7 being a process involving two exposures of intersecting lines. Process 8 corresponds to the hole pattern forming process using alkaline developer for comparison sake.

The resist pattern thus formed was observed under an electron microscope. The optimum dose (Eop) was the dose (mJ/cm$^2$) that gave a hole diameter of 45 nm at 90 nm pitch. On the hole pattern printed at the optimum dose, the diameter of holes was measured at 50 different points within a common exposure shot. A 3σ value of size variation is reported as critical dimension uniformity (CDU in nm). A smaller CDU value indicating better size control is preferable.

Evaluation Results

Table 9 tabulates the conditions under which each resist composition is evaluated and the results of evaluation.

TABLE 9

|  |  | Resist composition | PEB temp. (° C.) | Mask design/ development conditions | Eop (mJ/cm$^2$) | CDU (nm) |
|---|---|---|---|---|---|---|
| Example | 69 | Resist 1 | 100 | Process 5 | 48 | 4.4 |
|  | 70 | Resist 2 | 100 | Process 5 | 49 | 4.5 |
|  | 71 | Resist 2 | 100 | Process 6 | 59 | 3.9 |
|  | 72 | Resist 2 | 100 | Process 7 | 32 | 3.2 |
|  | 73 | Resist 3 | 100 | Process 5 | 45 | 4.5 |
|  | 74 | Resist 4 | 100 | Process 5 | 44 | 4.6 |
|  | 75 | Resist 5 | 100 | Process 5 | 49 | 4.3 |
|  | 76 | Resist 6 | 105 | Process 5 | 51 | 4.3 |
|  | 77 | Resist 7 | 105 | Process 5 | 48 | 4.5 |
|  | 78 | Resist 8 | 105 | Process 5 | 53 | 4.4 |

TABLE 9-continued

|  | | Resist composition | PEB temp. (° C.) | Mask design/ development conditions | Eop (mJ/cm²) | CDU (nm) |
|---|---|---|---|---|---|---|
|  | 79 | Resist 9 | 105 | Process 5 | 55 | 4.6 |
|  | 80 | Resist 10 | 105 | Process 5 | 52 | 4.6 |
|  | 81 | Resist 11 | 110 | Process 5 | 60 | 4.4 |
|  | 82 | Resist 12 | 105 | Process 5 | 41 | 4.6 |
|  | 83 | Resist 13 | 105 | Process 5 | 44 | 4.3 |
|  | 84 | Resist 14 | 105 | Process 5 | 51 | 4.6 |
|  | 85 | Resist 15 | 100 | Process 5 | 45 | 4.7 |
|  | 86 | Resist 16 | 95 | Process 5 | 45 | 4.8 |
|  | 87 | Resist 17 | 95 | Process 5 | 44 | 4.4 |
|  | 88 | Resist 18 | 95 | Process 5 | 44 | 4.5 |
|  | 89 | Resist 19 | 100 | Process 5 | 45 | 4.7 |
|  | 90 | Resist 20 | 105 | Process 5 | 50 | 4.4 |
|  | 91 | Resist 21 | 100 | Process 5 | 47 | 4.4 |
|  | 92 | Resist 22 | 105 | Process 5 | 46 | 4.4 |
|  | 93 | Resist 23 | 105 | Process 5 | 45 | 4.7 |
|  | 94 | Resist 24 | 105 | Process 5 | 47 | 4.3 |
|  | 95 | Resist 25 | 105 | Process 5 | 46 | 4.3 |
|  | 96 | Resist 26 | 100 | Process 5 | 42 | 4.5 |
|  | 97 | Resist 27 | 105 | Process 5 | 45 | 4.7 |
|  | 98 | Resist 28 | 100 | Process 5 | 50 | 4.4 |
|  | 99 | Resist 29 | 105 | Process 5 | 46 | 4.3 |
|  | 100 | Resist 30 | 105 | Process 5 | 47 | 4.5 |
|  | 101 | Resist 31 | 100 | Process 5 | 44 | 4.7 |
|  | 102 | Resist 32 | 100 | Process 5 | 45 | 4.7 |
|  | 103 | Resist 33 | 105 | Process 5 | 45 | 4.6 |
| Comparative Example | 34 | Resist 34 | 105 | Process 5 | 50 | 5.8 |
|  | 35 | Resist 35 | 105 | Process 5 | 47 | 5.7 |
|  | 36 | Resist 36 | 105 | Process 5 | 50 | 5.7 |
|  | 37 | Resist 37 | 100 | Process 5 | 45 | 4.5 |
|  | 38 | Resist 38 | 100 | Process 5 | 50 | 4.3 |
|  | 39 | Resist 39 | 100 | Process 5 | 43 | 4.6 |
|  | 40 | Resist 40 | 105 | Process 5 | 49 | 5.7 |
|  | 41 | Resist 41 | 100 | Process 5 | 47 | 4.5 |
|  | 42 | Resist 42 | 100 | Process 5 | 50 | 5.8 |
|  | 43 | Resist 43 | 100 | Process 5 | 48 | 5.9 |
|  | 44 | Resist 44 | 100 | Process 5 | 44 | 5.7 |
|  | 45 | Resist 45 | 100 | Process 5 | 52 | 5.9 |
|  | 46 | Resist 2 | 100 | Process 8 | 52 | 6.5 |
|  | 47 | Resist 7 | 105 | Process 8 | 51 | 6.4 |
|  | 48 | Resist 21 | 100 | Process 8 | 50 | 6.2 |
|  | 49 | Resist 28 | 100 | Process 8 | 48 | 6.5 |

As is evident from the results of Table 9, the hole patterns formed via organic solvent negative development corresponding to Processes 5 to 7 are superior in CD uniformity to the hole patterns formed via alkaline aqueous solution positive development corresponding to Process 8. In particular, the pattern formed by Process 7 shows the best CD uniformity.

The resist compositions of Examples comprising both the hydrogenated ROMP polymer (A) and the (meth)acrylate resin (B) as base resin are improved in CD uniformity over the resist compositions of Comparative Examples 34 to 36 and 40 comprising only the hydrogenated ROMP polymer (A), and display equivalent CDU values to the resist compositions of Comparative Examples 37 to 39 and 41 comprising only the (meth)acrylate resin (B). The results of Comparative Examples 42 to 45 reveal that the resist compositions comprising a hydrogenated ROMP polymer or a (meth)acrylate resin of different structure than the invention are insufficient in CD uniformity even when combined with organic solvent negative development.

It is seen from the results that the pattern forming process of forming a pattern of holes from a resist composition comprising specific base resins via organic solvent negative development satisfies both etch resistance and in-shot CD uniformity.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-101101 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition onto a substrate, post-applied baking the composition to form a resist film, exposing the resist film to high-energy radiation, post-exposure baking the resist film, and developing the exposed resist film in an organic solvent-based developer to selectively dissolve the unexposed region of the resist film to form a negative pattern, the resist composition comprising a base resin, an acid generator, and an organic solvent, the base resin comprising (A) a hydrogenated product of a ring-opening metathesis polymerization polymer having the general formula (1) and (B) a (meth)acrylate resin having the general formula (3),

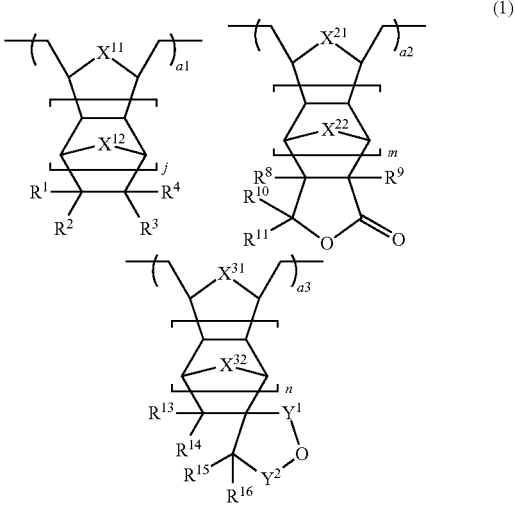

wherein at least one of $R^1$ to $R^4$ is a functional group having the general formula (2):

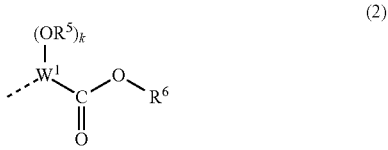

wherein the broken line denotes a valence bond, $R^5$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $R^6$ is an acid labile group, $W^1$ is a single bond or a (k+2)-valent $C_1$-$C_{10}$ hydrocarbon group, and k is 0 or 1, the remains of $R^1$ to $R^4$ are each independently hydrogen, $C_1$-$C_{20}$ straight, branched or cyclic alkyl, halogen, $C_1$-$C_{20}$ straight, branched or cyclic haloalkyl, $C_1$-$C_{20}$ straight, branched or cyclic alkoxy, $C_2$-$C_{20}$ straight, branched or cyclic alkoxyalkyl, or $C_2$-$C_{20}$ straight, branched or cyclic alkylcarbonyloxy, $C_6$-$C_{20}$ arylcarbonyloxy, $C_1$-$C_{20}$ straight, branched or cyclic alkylsulfonyloxy, $C_6$-$C_{20}$ arylsulfonyloxy, $C_2$-$C_{20}$ straight, branched or cyclic alkoxycarbonyl, or $C_3$-$C_{20}$ straight, branched or cyclic alkoxycarbonylalkyl, $X^{11}$ and $X^{12}$ are each independently —O— or —$CR^7{}_2$—, $R^7$ is hydrogen or $C_1$-$C_{10}$ straight or branched alkyl, and j is 0 or an integer of 1 to 3, $R^8$ to $R^{11}$ are each independently hydrogen or $C_1$-$C_{10}$ straight, branched or cyclic alkyl, $X^{21}$ and $X^{22}$ are each independently —O— or —$CR^{12}{}_2$—, $R^{12}$ is hydrogen or $C_1$-$C_{10}$ straight or branched alkyl, m is 0 or an integer of 1 to 3, $R^{13}$ to $R^{16}$ are each independently hydrogen or $C_1$-$C_{10}$ straight, branched or cyclic alkyl, $X^{31}$ and $X^{32}$ are each independently —O— or —$CR^{17}{}_2$—, $R^{17}$ is hydrogen or $C_1$-$C_{10}$ straight or branched alkyl, one of $Y^1$ and $Y^2$ is —(C=O)— and the other is —$CR^{18}{}_2$—, $R^{18}$ is hydrogen or $C_1$-$C_{10}$ straight or branched alkyl, and n is 0 or an integer of 1 to 3, each of the recurring units in formula (1) may be of one or more types, a1, a2, and a3 indicative of a constitutional molar ratio of the respective recurring units to the total are in the range: $0<a1<1$, $0\le a2 \le 0.8$, $0\le a3 \le 0.8$, $0<(a2+a3)$ $0.8$, and $0.5<(a1+a2+a3)\le 1$, provided that the sum of constitutional molar ratios of recurring units in the hydrogenated ROMP polymer (A) is unity, in case of a3=0, at least one of $X^{11}$, $X^{12}$, $X^{21}$, and $X^{22}$ is —O—, in case of a2=0, at least one of $X^{11}$, $X^{12}$, $X^{31}$, and $X^{32}$ is —O—, and in case of a2>0 and a3>0, at least one of $X^{11}$, $X^{12}$, $X^{21}$, $X^{22}$, $X^{31}$, and $X^{32}$ is —O—,

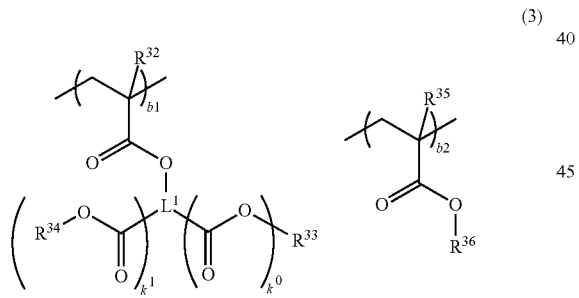

(3)

wherein $R^{32}$ and $R^{35}$ are each independently hydrogen or methyl, $R^{33}$ and $R^{34}$ each are an acid labile group, $k^0$ is 0 or 1, in case of $k^0$=0, $k^1$ is 0 and $L^1$ is a single bond, and in case of $k^0$=1, $k^1$ is 0 or 1, wherein in case of $k^1$=0, $L^1$ is a divalent $C_1$-$C_{12}$ straight, branched or cyclic hydrocarbon group which may contain a heteroatom, and in case of $k^1$=1, $L^1$ is a trivalent $C_1$-$C_{12}$ straight, branched or cyclic hydrocarbon group which may contain a heteroatom, $R^{36}$ is a monovalent $C_4$-$C_{15}$ cyclic hydrocarbon group having at least one partial structure selected from the group consisting of ether, ketone, ester, carbonate, and sulfonic acid ester, each of the recurring units in formula (3) may be of one or more types, b1 and b2 indicative of a constitutional molar ratio of the respective recurring units to the total are in the range: $0<b1<1$, $0<b2<1$, and $0.5<(b1+b2)\le 1$, provided that the sum of constitutional molar ratios of recurring units in the (meth)acrylate resin (B) is unity.

2. The pattern forming process of claim 1 wherein the acid labile group $R^6$ in formula (2) and the acid labile groups $R^{33}$ and $R^{34}$ in formula (3) are each independently at least one group selected from groups having the general formulae (5) to (7):

(5)

(6)

(7)

wherein the broken line denotes a valence bond, $R^{L01}$ to $R^{L03}$ are each independently $C_1$-$C_{12}$ straight, branched or cyclic alkyl, $R^{L04}$ is $C_1$-$C_{10}$ straight, branched or cyclic alkyl, Z is a divalent $C_2$-$C_{15}$ hydrocarbon group to form a monocyclic or bridged ring with the carbon atom to which it is attached, and $R^{L05}$ is $C_1$-$C_{20}$ straight, branched or cyclic alkyl.

3. The pattern forming process of claim 1 wherein the acid labile group $R^6$ in formula (2) and the acid labile groups $R^{33}$ and $R^{34}$ in formula (3) are each independently at least one group selected from the group consisting of tert-butyl, tert-amyl, 2-ethyl-2-butyl, 1-methylcyclopentyl, 1-ethylcyclopentyl, 1-n-propylcyclopentyl, 1-isopropylcyclopentyl, 1-tert-butylcyclopentyl, 1-cyclopentylcyclopentyl, 1-cyclohexylcyclopentyl, 1-norbornylcyclopentyl, 2-methyl-2-norbornyl, 2-ethyl-2-norbornyl, 2-methyl-2-adamantyl, 2-ethyl-2-adamantyl, 2-n-propyl-2-adamantyl, 2-isopropyl-2-adamantyl, methoxymethyl, and 2-adamantyloxymethyl.

4. The pattern forming process of claim 1 wherein the hydrogenated ROMP polymer (A) comprises, in addition to the recurring units having formula (1), recurring units of at least one type selected from units having the general formulae (8), (10), (12) and (13):

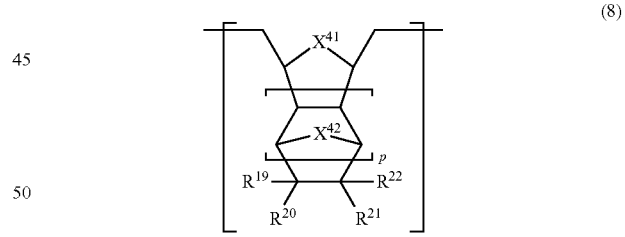

(8)

wherein at least one of $R^{19}$ to $R^{22}$ is a carboxyl-containing functional group having the general formula (9):

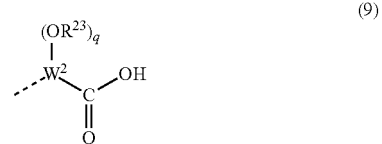

(9)

wherein the broken line denotes a valence bond, $R^{23}$ is hydrogen, $C_1$-$C_{10}$ straight, branched or cyclic alkyl, $C_2$-$C_{10}$ straight, branched or cyclic alkoxyalkyl, or $C_1$-$C_{10}$ straight, branched or cyclic acyl, $W^2$ is a single bond or a (q+2)-valent $C_1-C_{10}$ hydrocarbon group, and q is 0 or 1, the remains of $R^{19}$ to $R^{22}$ are each independently hydrogen, $C_1-C_{20}$ straight, branched or cyclic alkyl, halogen, $C_1-C_{20}$ straight, branched or cyclic haloalkyl, $C_1-C_{20}$ straight, branched or cyclic alkoxy, $C_2-C_{20}$ straight, branched or cyclic alkoxyalkyl, or $C_2-C_{20}$ straight, branched or cyclic alkylcarbonyloxy, $C_6-C_{20}$ arylcarbonyloxy, $C_1-C_{20}$ straight, branched or cyclic alkylsulfonyloxy, $C_6-C_{20}$ arylsulfonyloxy, $C_2-C_{20}$ straight, branched or cyclic alkoxycarbonyl, or $C_3-C_{20}$ straight, branched or cyclic alkoxycarbonylalkyl, $X^{41}$ and $X^{42}$ are each independently —O— or —$CR^{24}{}_2$—, $R^{24}$ is hydrogen or $C_1-C_{10}$ straight or branched alkyl, and p is 0 or an integer of 1 to 3,

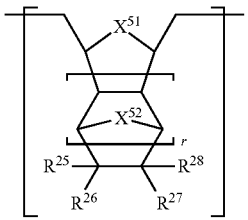

(10)

wherein at least one of $R^{25}$ to $R^{28}$ is a carboxylate-containing functional group having the general formula (11):

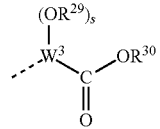

(11)

wherein the broken line denotes a valence bond, $R^{29}$ is hydrogen, $C_1-C_{10}$ straight, branched or cyclic alkyl, $C_2-C_{10}$ straight, branched or cyclic alkoxyalkyl, or $C_1-C_{10}$ straight, branched or cyclic acyl, $R^{30}$ is $C_1-C_{10}$ straight or branched alkyl, $C_2-C_{10}$ straight, branched or cyclic alkoxyalkyl, or $C_1-C_{20}$ straight, branched or cyclic haloalkyl, $W^3$ is a single bond or a (s+2)-valent $C_1-C_{10}$ hydrocarbon group, and s is 0 or 1, the remains of $R^{25}$ to $R^{28}$ are each independently hydrogen, $C_1-C_{20}$ straight, branched or cyclic alkyl, halogen, $C_1-C_{20}$ straight, branched or cyclic haloalkyl, $C_1-C_{20}$ straight, branched or cyclic alkoxy, $C_2-C_{20}$ straight, branched or cyclic alkoxyalkyl, or $C_2-C_{20}$ straight, branched or cyclic alkylcarbonyloxy, $C_6-C_{20}$ arylcarbonyloxy, $C_1-C_{20}$ straight, branched or cyclic alkylsulfonyloxy, $C_6-C_{20}$ arylsulfonyloxy, $C_2-C_{20}$ straight, branched or cyclic alkoxycarbonyl, or $C_3-C_{20}$ straight, branched or cyclic alkoxycarbonylalkyl, $X^{51}$ and $X^{52}$ are each independently —O— or —$CR^{31}{}_2$—, $R^{31}$ is hydrogen or $C_1-C_{10}$ straight or branched alkyl, and r is 0 or an integer of 1 to 3,

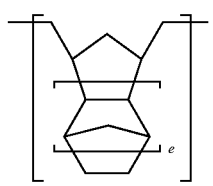

(12)

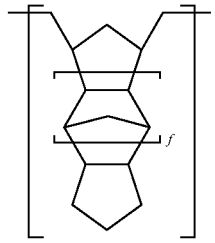

(13)

wherein e is 0 or an integer of 1 to 3, and f is 0 or an integer of 1 to 3.

5. The pattern forming process of claim 1 wherein the (meth)acrylate resin (B) comprises, in addition to the recurring units having formula (3), recurring units of at least one type having the general formula (14):

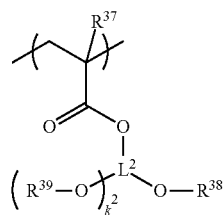

(14)

wherein $R^{37}$ is hydrogen or methyl, $k^2$ is 0 or 1, in case of $k^2=0$, $L^2$ is a divalent $C_2-C_{15}$ straight, branched or cyclic hydrocarbon group which may contain a heteroatom or fluorine, and in case of $k^2=1$, $L^2$ is a trivalent $C_3-C_{16}$ straight, branched or cyclic hydrocarbon group which may contain a heteroatom or fluorine, $R^{38}$ and $R^{39}$ are each independently hydrogen, or $C_1-C_{12}$ straight, branched or cyclic alkyl, alkoxyalkyl or acyl.

6. The pattern forming process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, 2-methylcyclohexanone, 3-methylcyclohexanone, 4-methylcyclohexanone, acetophenone, 2'-methylacetophenone, 4'-methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, in an amount of at least 60% by weight based on the total weight of the developer.

7. The pattern forming process of claim 1 wherein the step of exposing the resist film to high-energy radiation includes ArF excimer laser immersion lithography of 193 nm wavelength or EUV lithography of 13.5 nm wavelength.

8. The pattern forming process of claim 7 wherein the pattern formed by development is a trench pattern.

9. The pattern forming process of claim 7 wherein a mask bearing a dotted light-shielding pattern is used, whereby a pattern of holes is formed at the dots after development.

10. The pattern forming process of claim 9 wherein the mask is a halftone phase shift mask having a transmittance of 3 to 15%.

11. The pattern forming process of claim 7 wherein a mask bearing a lattice-like light-shielding pattern is used, whereby a pattern of holes is formed at the intersections between gratings of the mask pattern after development.

12. The pattern forming process of claim 7 wherein the exposure step includes first and second exposures through first and second masks each having a lined light-shielding pattern, the direction of lines on the second mask for the second exposure is changed from the direction of lines on the first mask for the first exposure so that the lines on the first mask intersect with the lines on the second mask, whereby a pattern of holes is formed at the intersections between the lines after development.

13. The pattern forming process of claim 1, comprising the steps of applying the resist composition onto a substrate, post-applied baking the composition to form a resist film, forming a protective film on the resist film, exposing the resist film to high-energy radiation, post-exposure baking, and applying an organic solvent-based developer to dissolve away the protective film and the unexposed region of the resist film.

\* \* \* \* \*